US008188763B2

(12) United States Patent  (10) Patent No.: US 8,188,763 B2
Bertin et al.  (45) Date of Patent: May 29, 2012

(54) NONVOLATILE NANOTUBE PROGRAMMABLE LOGIC DEVICES AND A NONVOLATILE NANOTUBE FIELD PROGRAMMABLE GATE ARRAY USING SAME

(75) Inventors: Claude L. Bertin, Venice, FL (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 12/536,752

(22) Filed: Aug. 6, 2009

(65) Prior Publication Data
US 2010/0079165 A1  Apr. 1, 2010

Related U.S. Application Data

(60) Provisional application No. 61/088,828, filed on Aug. 14, 2008.

(51) Int. Cl.
*H03K 19/173* (2006.01)
*H01L 23/52* (2006.01)
(52) U.S. Cl. ............................ 326/38; 977/940; 257/209
(58) Field of Classification Search ............... 326/37–41, 326/47
See application file for complete search history.

(56) References Cited

U.S. PATENT DOCUMENTS

| 4,670,749 A | 6/1987 | Freeman |
| 5,978,256 A | 11/1999 | Sohn et al. |
| 6,128,214 A | 10/2000 | Kuekes et al. |
| 6,256,767 B1 | 7/2001 | Kuekes et al. |
| 6,308,311 B1 | 10/2001 | Carmichael et al. |
| 6,314,019 B1 | 11/2001 | Kuekes et al. |
| 6,422,450 B1 | 7/2002 | Zhou et al. |
| 6,423,583 B1 | 7/2002 | Avouris et al. |
| 6,445,006 B1 | 9/2002 | Brandes et al. |
| 6,528,020 B1 | 3/2003 | Dai et al. |
| 6,548,841 B2 | 4/2003 | Frazier et al. |
| 6,706,402 B2 | 3/2004 | Rueckes et al. |
| 6,707,098 B2 | 3/2004 | Hofmann et al. |
| 6,759,693 B2 | 7/2004 | Vogeli et al. |
| 6,803,840 B2 | 10/2004 | Hunt et al. |
| 6,808,746 B1 | 10/2004 | Dai et al. |
| 6,809,465 B2 | 10/2004 | Jin |
| 6,835,591 B2 | 12/2004 | Rueckes et al. |
| 6,888,773 B2 | 5/2005 | Morimoto |
| 6,890,780 B2 | 5/2005 | Lee |
| 6,894,359 B2 | 5/2005 | Bradley et al. |
| 6,899,945 B2 | 5/2005 | Smalley et al. |

(Continued)

FOREIGN PATENT DOCUMENTS

GB  2364933  2/2002
(Continued)

OTHER PUBLICATIONS

Avouris, "Carbon nanotube electronics", *Chemical Physics*, vol. 281, pp. 429-445, 2002.

(Continued)

*Primary Examiner* — Shawki S Ismail
*Assistant Examiner* — Dylan White
(74) *Attorney, Agent, or Firm* — Nantero

(57) ABSTRACT

Field programmable device (FPD) chips with large logic capacity and field programmability that are in-circuit programmable are described. FPDs use small versatile nonvolatile nanotube switches that enable efficient architectures for dense low power and high performance chip implementations and are compatible with low cost CMOS technologies and simple to integrate.

5 Claims, 36 Drawing Sheets

U.S. PATENT DOCUMENTS

| | | | |
|---|---|---|---|
| 6,905,892 B2 | 6/2005 | Esmark et al. | |
| 6,918,284 B2 | 7/2005 | Snow et al. | |
| 6,919,592 B2 | 7/2005 | Segal et al. | |
| 6,919,740 B2 | 7/2005 | Snider | |
| 6,921,575 B2 | 7/2005 | Horiuchi et al. | |
| 6,942,921 B2 | 9/2005 | Segal et al. | |
| 6,982,903 B2 | 1/2006 | Bertin et al. | |
| 6,990,009 B2* | 1/2006 | Bertin et al. | 365/151 |
| 7,015,500 B2 | 3/2006 | Choi et al. | |
| 7,071,023 B2 | 7/2006 | Bertin et al. | |
| 7,112,493 B2 | 9/2006 | Bertin et al. | |
| 7,115,901 B2 | 10/2006 | Bertin et al. | |
| 7,115,960 B2 | 10/2006 | Bertin et al. | |
| 7,161,403 B2 | 1/2007 | Bertin | |
| 7,164,744 B2 | 1/2007 | Bertin | |
| 7,167,026 B2 | 1/2007 | Bertin | |
| 7,211,854 B2 | 5/2007 | Bertin et | |
| 7,245,520 B2 | 7/2007 | Bertin et al. | |
| 7,264,990 B2 | 9/2007 | Rueckes et al. | |
| 7,265,575 B2 | 9/2007 | Bertin | |
| 7,268,044 B2 | 9/2007 | Bertin et al. | |
| 7,280,394 B2 | 10/2007 | Bertin et al. | |
| 7,288,961 B2 | 10/2007 | Bertin | |
| 7,301,802 B2 | 11/2007 | Bertin et al. | |
| 7,329,931 B2 | 2/2008 | Bertin | |
| 7,330,709 B2 | 2/2008 | Bertin | |
| 7,335,528 B2 | 2/2008 | Rueckes et al. | |
| 7,339,401 B2 | 3/2008 | Bertin et al. | |
| 7,405,605 B2 | 7/2008 | Bertin | |
| 7,542,334 B2 | 6/2009 | Bertin et al. | |
| 7,564,269 B2 | 7/2009 | Bertin | |
| 7,569,880 B2 | 8/2009 | Bertin et al. | |
| 7,710,157 B2 | 5/2010 | Bertin et al. | |
| 7,720,514 B2 | 5/2010 | Bertin | |
| 7,737,471 B2 | 6/2010 | Bertin | |
| 7,745,810 B2 | 6/2010 | Rueckes et al. | |
| 7,759,996 B2 | 7/2010 | Bertin | |
| 7,768,304 B2 | 8/2010 | Bertin | |
| 7,782,650 B2 | 8/2010 | Bertin et al. | |
| 7,906,991 B2 | 3/2011 | Bertin | |
| 2001/0023986 A1 | 9/2001 | Mancevski | |
| 2002/0175390 A1 | 11/2002 | Goldstein et al. | |
| 2003/0200521 A1 | 10/2003 | DeHon et al. | |
| 2004/0031975 A1 | 2/2004 | Kern et al. | |
| 2004/0132070 A1 | 7/2004 | Star et al. | |
| 2004/0266106 A1 | 12/2004 | Lee | |
| 2005/0056877 A1 | 3/2005 | Rueckes et al. | |
| 2005/0191495 A1 | 9/2005 | Rueckes et al. | |
| 2005/0212014 A1 | 9/2005 | Horibe et al. | |
| 2006/0237537 A1 | 10/2006 | Empedocles et al. | |
| 2006/0250843 A1* | 11/2006 | Bertin et al. | 365/185.08 |
| 2006/0250856 A1 | 11/2006 | Bertin et al. | |
| 2006/0258122 A1 | 11/2006 | Whitefield et al. | |
| 2006/0264053 A1 | 11/2006 | Yates | |
| 2006/0281256 A1 | 12/2006 | Carter et al. | |
| 2006/0281287 A1 | 12/2006 | Yates et al. | |
| 2006/0292716 A1 | 12/2006 | Gu et al. | |
| 2007/0020859 A1 | 1/2007 | Bertin et al. | |
| 2007/0064484 A1* | 3/2007 | McCollum et al. | 365/185.08 |
| 2007/0115713 A1 | 5/2007 | Trossen et al. | |
| 2007/0146012 A1* | 6/2007 | Murphy et al. | 326/99 |
| 2007/0210845 A1* | 9/2007 | Bertin | 327/202 |
| 2008/0012047 A1 | 1/2008 | Bertin et al. | |
| 2008/0017888 A1 | 1/2008 | Bertin et al. | |
| 2008/0079027 A1 | 4/2008 | Bertin et al. | |
| 2008/0142850 A1 | 6/2008 | Bertin et al. | |
| 2008/0157126 A1 | 7/2008 | Bertin et al. | |
| 2008/0157127 A1 | 7/2008 | Bertin et al. | |
| 2008/0158936 A1 | 7/2008 | Bertin et al. | |
| 2008/0159042 A1* | 7/2008 | Bertin et al. | 365/225.7 |
| 2008/0160734 A1 | 7/2008 | Bertin et al. | |
| 2008/0170429 A1 | 7/2008 | Bertin et al. | |
| 2009/0052246 A1 | 2/2009 | Bertin et al. | |
| 2009/0194839 A1 | 8/2009 | Bertin et al. | |
| 2010/0001267 A1 | 1/2010 | Manning et al. | |
| 2010/0038625 A1 | 2/2010 | Bertin | |
| 2010/0078723 A1 | 4/2010 | Bertin et al. | |
| 2010/0079165 A1 | 4/2010 | Bertin et al. | |
| 2010/0140066 A1 | 6/2010 | Feng et al. | |

FOREIGN PATENT DOCUMENTS

| | | |
|---|---|---|
| WO | WO-00/48195 | 8/2000 |
| WO | WO-01/03208 A1 | 1/2001 |
| WO | WO-2005/001899 A2 | 1/2005 |
| WO | WO-2010/019441 | 2/2010 |

OTHER PUBLICATIONS

Bachtold, A., et al, "Logic Circuits Based on Carbon Nanotubes," Physica (2003) pp. 42-46.

Chen, J., et al, "Self-aligned Carbon Nanotube Transistors with Charge Transfer Doping," Applied Physics Letters (2005) 86:123108-1-3, Mar. 16, 2005.

Chen, J., et al, "Self-aligned Carbon Nanotube Transistors with Novel Chemicsl Doping," IEDM (2004) 04:695-698.

Collins, et al., Engineering Carbon Nanotubes and Nanotube Circuits Using Electrical Breakdown, Science, vol. 292, pp. 706-709, Apr. 2001.

Derycke, V., "Controlling Doping and Carrier Injection in Carbon NanotubeTransistors", Applied Physics Letters, 2002. 80 (15) 2773-2775, Apr. 15, 2002.

Derycke, V., et al., "Carbon Nanotube Inter- and Intramolecular Logic Gates," *Nano Letters*, Sep. 2001, vol. 1, No. 9, pp. 453-456.

Dong, C. et al., "3-D nFPGA: A Reconfigurable Architecture for 3-D CMOS/Nanomaterial Hybrid Digital Circuits," IEEE Transactions on Circuits and Systems—I: Regular papers, vol. 54, No. 11, Nov. 2007, pp. 2489-2501.

Duan, X. et al., "Nonvolatile Memory and Programmable Logic from Molecule-Gated Nanowires", *Nano Letters*, vol. 0, No. 0, pp. A-D, 2002.

Heinze, S. et al., "Carbon Nanotubes as Schottky Barrier Transistors", *Physical Review Letters*, vol. 89, No. 10, pp. 16801-1-106801-4, Aug. 15, 2002.

Hone, J., "Phonons and Thermal Properties of Carbon Nanotubes", *Carbon Nanotubes, Topics Appl. Phys.*, vol. 80, pp. 273-286, 2001.

Huang, Y., et al, "Logic Gates and Computation from Assembled Nanowire Building Blocks," Science (2001) 294(9):1313-1317.

Javey, A., et al, "Carbon Nanotube Field-Effect Transistors with Integrated Ohmic Contacts and High-κ Gate Dielectrics," Nano Letters (2004) 4(3): 447-450.

Javey, A., et al, "High-κ Dielectrics for Advanced Carbon-Nanotube Transistors and Logic Gates," Nature Materials (2002) 1:241-246, Nov. 17, 2002.

Javey, A., et al., "Carbon Nanotube Transistor Arrays for Multistage Complementary Logic and Ring Oscillators," *Nano Letters*, 2002, vol. 2, No. 9, pp. 929-932.

Johnson, R. Colin, "IBM fellow unrolls blueprint for nano", *EETimes*, Mar. 6, 2006, 3 pages, http://www.eetimes.com/showArticle.jhtml?articleID=181500304.

Kong, J. et al., "Quantum Interference and Ballistic Transmission in Nanotube Electron Waveguides", *The American Physical Society*, vol. 87, No. 10, pp. 106801-1-106801-4, Sep. 3, 2001.

Langer, L. et al., "Electrical Resistance of a Carbon Nanotube Bundle," J. Mater. Res. vol. 9, No. 4, Apr. 1994, 6 pages.

Lin, Y., et al, "Novel Carbon Nanotube FET Design with Tunable Polarity," IEDM (2004) 4:687-690.

Martel, R., et al, "Carbon Nanotube Field-Effect Transistors and Logic Circuits," DAC 2002, Jun. 10-12, 2002, vol. 7.4, pp. 94-98.

Onoa, G.B. et al., "Bulk production of singly dispersed carbon nanotubes with prescribed lengths," Nanotechnology, vol. 16, pp. 2799-2803, Oct. 11, 2005.

Radosavljevic, M. et al., "Nonvolatile Molecular Memory Elements Based on Ambipolar Nanotube Field Effect Transistors", *Nano Letters*, vol. 2, No. 7, pp. 761-764, May 17, 2002.

Rueckes, et al., "Carbon nanotube-based nonvolatile random access memory for molecular computing", *Science*, vol. 289, pp. 94-97, Jul. 7, 2000.

Wind, S. J. et al., "Fabrication and Electrical Characterization of Top Gate Single-Wall Carbon Nanotube Field-Effect Transistors", 14 pages.

Wind, S., et al, "Vertical Scaling of Carbon Nanotube Field-Effect Transistors Using Top Gate Electrodes," Applied Physics Letters (2002), 80(20):3817-3819, May 20, 2002.

Cui, J.B. et al., "Carbon nanotube memory devices of high charge storage stability," Applied Physics Letters, vol. 81, No. 17, Oct. 21, 2002, pp. 3260-3262.

Fuhrer, M.S. et al., "High-Mobility Nanotube Transistor Memory," Nano Letters, 2002, vol. 2, No. 7, pp. 755-759.

Novak, J.P. et al., "Nerve agent detection using networks of single-walled carbon nanotubes," Applied Physics Letters, vol. 83, No. 19, Nov. 10, 2003, pp. 4026-4028.

Snow, E.S. et al., "Random networks of carbon nanotubes as an electronic material," Applied Physics Letters, vol. 82, No. 13, Mar. 31, 2003, pp. 2145-2147.

Star, A. et al., "Nanoelectronic Carbon Dioxide Sensors," Adv. Mater. 2004, 16, No. 22, Nov. 18, pp. 2049-2052.

Star, A. et al., "Nanotube Optoelectronic Memory Devices," Nano Letters, 2004, vol. 4, No. 9, pp. 1587-1591.

Zhou, Y. et al., "p-Channel, n-Channel Thin Film Transistors and p-n Diodes Based on Single Wall Carbon Nanotube Networks," Nano Letters, 2004, vol. 4, No. 10, pp. 2031-2035.

Awano, Y., "Graphene for VLSI: FET and Interconnect Applications" IEDM 2009 Technical Digest, pp. 10.1.1-10.1.4.

Brown, K.M. "System in package "The Rebirth of SIP"," 2004 IEEE Custom Integrated Circuits Conference, May 2004.

Crowley, M. et al., "512 Mb PROM with 8 layers of antifuse/Diode cells," IEEE International Solid-State Circuits Conference, vol. XLVI, pp. 284-285, Feb. 2003.

Huai, Y. "Spin-Transfet Torque MRAM (STT-MTAM): Challenges and Prospects". AAPS Bulletin Dec. 2008, vol. 18, No. 6, pp. 33-40.

Jiang, Y. et al., "Performance Breakthrough in 8nm Gate-All-Around Length Gate-All-Around Nanowire Transistors using Metallic Nanowire Contacts" 2008 Symposium on VLSI Technology Digest of Technical Papers, pp. 34-35.

Kianian, S. et al., "A 3D Stackable Carbon Nanotube-based Nonvolatile Memory (NRAM)," ESSDERC, Jun. 14, 2010, Nantero, Inc.

Servalli, G. "A 45nm Generation Phase Change Memory Technology," IEDM 2009 Technical Digest, pp. 5.7.1-5.7.4.

International Search Report and Written Opinion from the International Searching Authority, the United States Patent and Trademark Office, for International Application No. PCT/US2009/052977, dated Oct. 2, 2009, 6 pages.

International Search Report and Written Opinion from the International Searching Authority, the United States Patent and Trademark Office, for International Application No. PCT/US2009/052975, dated Sep. 15, 2009, 6 pages.

Baker, R. Jacob, "CMOS Circuit Design, Layout, and Simulation," IEEE Press Series on Microelectronic Systems, 1998, pp. 579-592, 16 pages.

Yen, G.C., "Autonomous Neural Control in Flexible pace Structures," The Industrial Electronics Handbook, Chapter 93, pp. 1199-1202, edited by J. David Irwin, CRC Press, LLC, 1997, 6 pages.

Mead, et al., "Introduction to VLSI Systems," Addison-Wesley Publishing Company, Oct. 1980, pp. 78-82, 14 pages.

* cited by examiner

* Trademark of AMD

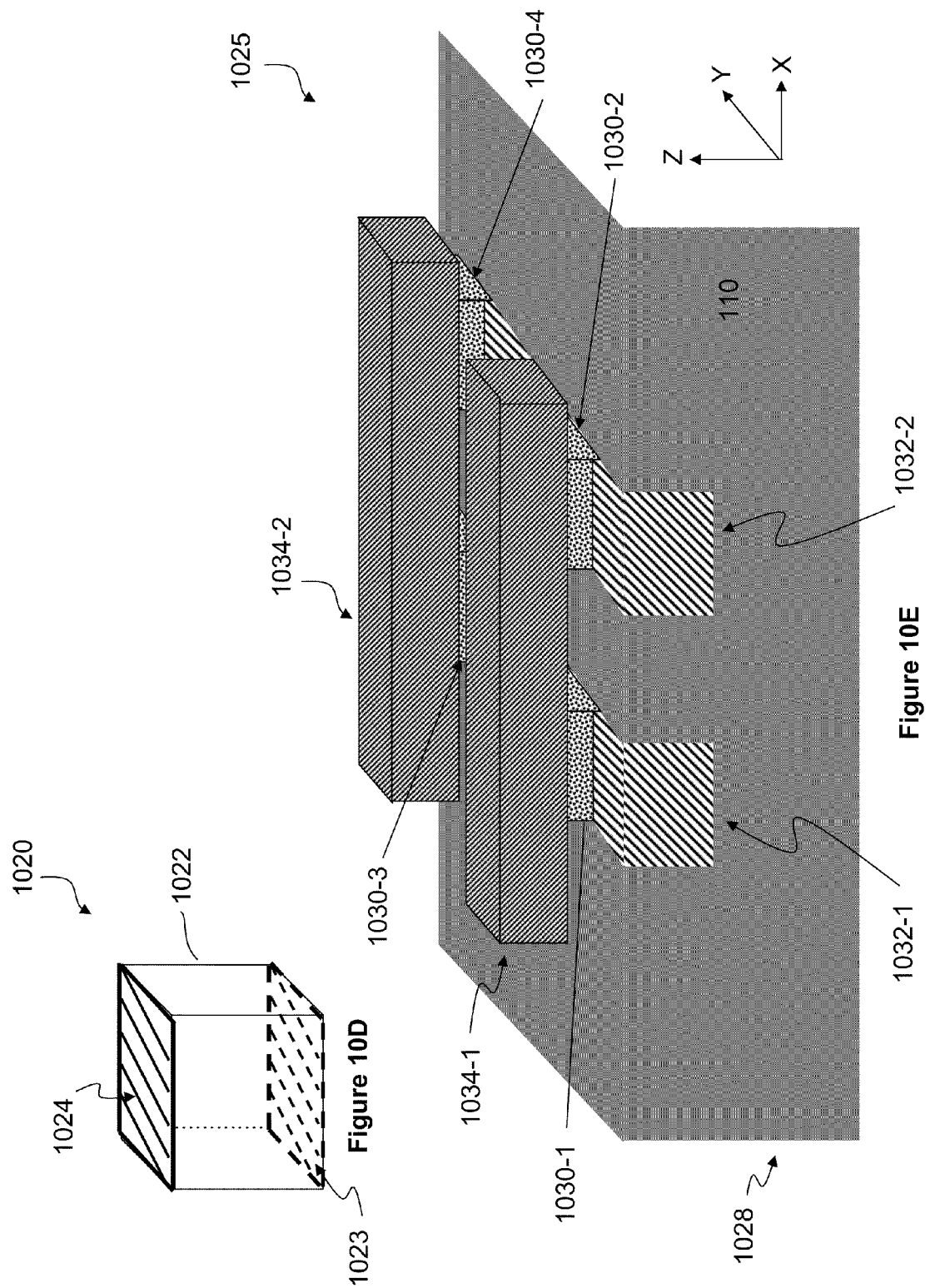

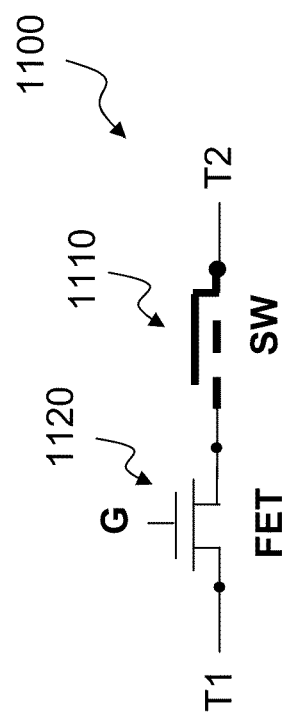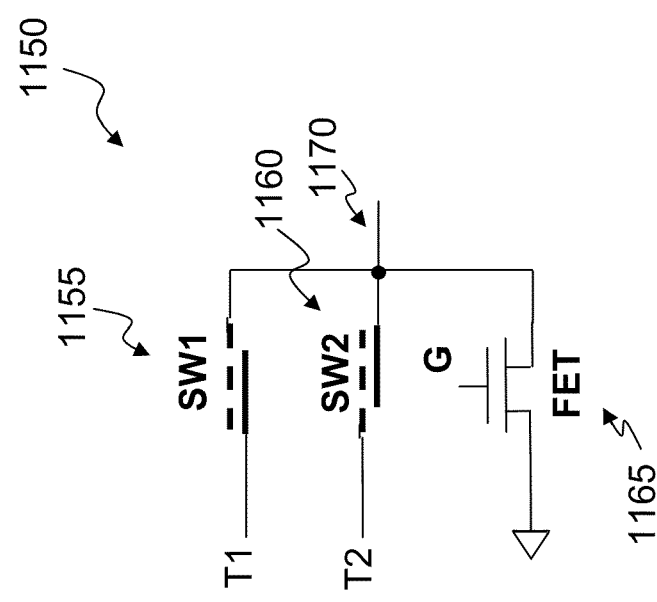
Figure 11A
Figure 11B

| CKT CONFIG. # | Nonvolatile Configuration Control Bits | | | | | | | | | | Output F C6: 1 C6':0 | Output F C6: 0 C6': 1 |
|---|---|---|---|---|---|---|---|---|---|---|---|---|
| | C0 | C0' | C1 | C1' | C2 | C2' | C3 | C3' | C4 | C5 | | |
| 1 | 1 | 0 | X | X | 1 | 0 | X | X | 1 | 0 | A + B | Z |
| 2 | 1 | 0 | X | X | 0 | 1 | X | X | 1 | 0 | A + B' | Z |
| 3 | 0 | 1 | X | X | 1 | 0 | X | X | 1 | 0 | A' + B | Z |
| 4 | 0 | 1 | X | X | 0 | 1 | X | X | 1 | 0 | A' + B' | Z |
| 5 | X | X | 1 | 0 | X | X | 1 | 0 | 0 | 1 | (AB)' | Z |
| 6 | X | X | 1 | 0 | X | X | 0 | 1 | 0 | 1 | (AB')' | Z |
| 7 | X | X | 0 | 1 | X | X | 1 | 0 | 0 | 1 | (A'B)' | Z |
| 8 | X | X | 0 | 1 | X | X | 0 | 1 | 0 | 1 | (A'B')' | Z |

Various logic circuit configurations formed by the nonvolatile nanotube configuration logic block of figure 14A based on the state of nonvolatile nanotube control bits A: Logic Input     C0 – C3': Lower Order Control Bits to Configurable Logic Circuits
B: Logic Input     C4 & C5: Higher Order Control Bits to Configurable Logic Circuits
F: Logic Output     C6 & C6': Logic Output (F) Control Bits to Tristate Logic Circuit 0 – logic low
1 – logic high
X – "don't care" state
Z – high impedance output

Figure 14B

NONVOLATILE NANOTUBE PROGRAMMABLE LOGIC DEVICES AND A NONVOLATILE NANOTUBE FIELD PROGRAMMABLE GATE ARRAY USING SAME

CROSS REFERENCES TO RELATED APPLICATIONS

This application claims priority under 25 U.S.C. §119(e) to U.S. Provisional Patent Application No. 61/088,828, filed Aug. 14, 2008, entitled "Nonvolatile Nanotube Programmable Logic Devices and a Nonvolatile Nanotube Field Programmable Gate Array Using Same."

This application is related to the following applications, the entire contents of which are incorporated herein by reference in their entirety:

U.S. patent application Ser. No. 12/536,736, filed concurrently herewith, entitled NONVOLATILE NANOTUBE PROGRAMMABLE LOGIC DEVICES AND A NONVOLATILE NANOTUBE FIELD PROGRAMMABLE GATE ARRAY USING SAME;

U.S. patent application Ser. No. 12/536,795, filed concurrently herewith, entitled NONVOLATILE NANOTUBE PROGRAMMABLE LOGIC DEVICES AND A NONVOLATILE NANOTUBE FIELD PROGRAMMABLE GATE ARRAY USING SAME;

U.S. patent application Ser. No. 12/536,803, filed concurrently herewith, entitled NONVOLATILE NANOTUBE PROGRAMMABLE LOGIC DEVICES AND A NONVOLATILE NANOTUBE FIELD PROGRAMMABLE GATE ARRAY USING SAME;

U.S. patent application Ser. No. 12/536,815, filed concurrently herewith, entitled NONVOLATILE NANOTUBE PROGRAMMABLE LOGIC DEVICES AND A NONVOLATILE NANOTUBE FIELD PROGRAMMABLE GATE ARRAY USING SAME;

U.S. patent application Ser. No. 12/536,817, filed concurrently herewith, entitled NONVOLATILE NANOTUBE PROGRAMMABLE LOGIC DEVICES AND A NONVOLATILE NANOTUBE FIELD PROGRAMMABLE GATE ARRAY USING SAME;

U.S. patent application Ser. No. 11/280,786, filed on Nov. 15, 2005, entitled TWO-TERMINAL NANOTUBE DEVICES AND SYSTEMS AND METHODS OF MAKING SAME;

U.S. patent application Ser. No. 11/835,583, filed on Aug. 8, 2007, entitled LATCH CIRCUITS AND OPERATION CIRCUITS HAVING SCALABLE NONVOLATILE NANOTUBE SWITCHES AS ELECTRONIC FUSE REPLACEMENT ELEMENTS;

U.S. patent application Ser. No. 11/835,651, filed on Aug. 8, 2007, entitled NONVOLATILE NANOTUBE DIODES AND NONVOLATILE NANOTUBE BLOCKS AND SYSTEMS USING SAME AND METHODS OF MAKING SAME.

U.S. patent application Ser. No. 12/486,602, filed on Jun. 17, 2009, entitled NRAM ARRAYS WITH NANOTUBE BLOCKS, NANOTUBE TRACES, AND NANOTUBE PLANES AND METHODS OF MAKING SAME.

TECHNICAL FIELD

The present application is generally related to the field of field programmable devices (FPDs), also referred to as programmable logic devices (PLDs), and, more specifically, to logic circuits formed from nanotube devices.

BACKGROUND

Discussion of Related Art

Field programmable devices (FPDs) have grown rapidly because integrated circuits for a wide variety of product applications in a competitive environment require fast time-to-market for new designs and low (or zero) non-recurring engineering cost (NRE) and low fabrication cost. Low power is a requirement for most applications as is portability so conservation of battery power is a requirement and nonvolatile operation is advantageous. Also, integration levels (more function) are increasing rapidly as is the requirement for high performance chips with large logic capacity and field programmability that are in-circuit programmable (in-place in the package without requiring sockets). Field programmable devices (FPDs) are also sometimes referred to as programmable logic devices (PLDs) and the terms FPD and PLD are used interchangeably throughout the application.

What is needed in logic design is fast time to market. Lower costs are also important hence more function in smaller chips. Higher performance and lower power are especially important in battery powered applications. Field programmable logic chips are required for fast time to market. What is needed are configurable (programmable) logic functions and efficient programmable wiring that can be configured (programmed) multiple times in chips mounted on a board. Programmable switches must be small in size and nonvolatile to enable efficient wiring architectures for implementing configurable (programmable) logic functions and be compatible with and easily integrated in CMOS technologies. Programmable switches must be easy to use and compatible with high performance applications. Programmable switches must enable fine-tuning of logic timing for optimum performance.

Overview of Field Programmable Devices

Block diagram 100 illustrated in FIG. 1 shows simple programmable logic devices (SPLDs) with a smaller number of equivalent logic gates with thousands or tens of thousands of equivalent logic gates; complex programmable logic devices (CPLDs) that combine multiple SPLDs with programmable wiring (routing) for a higher number of equivalent logic gates such as tens to hundreds of thousands of equivalent logic gates; and field programmable gate arrays (FPGAs) with a large number of equivalent logic gates in the range of millions to tens of million of equivalent logic gates for example and into the hundreds of millions of equivalent logic gates for denser scaled future FPGA chips. A brief discussion of field programmable devices is provided in the sections that follow.

Simple Programmable Logic Devices (SPLDs)

Programmable read-only memories (PROMs) were the first chips to enable user-programmability of the bits in an array. Such chips were used to store code for system startup (BIOS), algorithms, and other functions for example. Simple logic functions can also be performed using PROMs in which address lines can be used as logic circuit inputs and data lines as outputs. However, logic functions typically do not require many product terms but a PROM contains a full decoder for its address inputs. Thus, PROMs are an inefficient architecture for programmable logic function and are rarely used for this purpose and are therefore not included in block diagram 100.

The first SPLD device developed for implementing a field-programmable logic array (FPLA) or PLA for short consisted of two arrays for storing two levels of equivalent logic gates. A first AND array (or AND-plane) is structured such that any of the AND array inputs or complements of the inputs can be AND'ed together and each AND-array output corresponds to any product term of inputs to the AND array. These product term outputs of the AND array become inputs to a second OR array. OR array outputs can be configured to produce any logical sum of any of the product terms (AND-array outputs) and implements logic functions in sum-of-products form. The PLA architecture is far better for generating logic functions than a PROM because both the AND and OR array terms can have many inputs.

FIG. 2 illustrates a schematic of PLA 200 including programmable AND array 210 and programmable OR array 220. Inputs 225 to input drivers 230 result in logic functions A, B·C, . . . , $D_C$ logic inputs to programmable AND array 210. Programmable AND array 210 forms product terms based on the inputs and on the state of nonvolatile bits at the intersection of input lines A, B·C, . . . , $D_C$ and provides product terms $PT_1, PT_2, \ldots, PT_M$ as inputs to Programmable OR array 220. Programmable OR array 220 forms sum-of-products (or product terms) outputs $O_1, O_2, \ldots, O_N$ based on product terms inputs and the state of nonvolatile bits at the intersection of product terms $PT_1, PT_2, \ldots, PT_M$ and OR array output lines $O_1, O_2, \ldots, O_N$, which are sent to output drivers 240. Output drivers 240 may be conventional drivers, or may include additional logic function such as XOR and may also include flip flops such as D-flip flops for example. Output drivers 240 drive outputs 245 which is the logic response to inputs 225 based on the ON or OFF bit states of individual nonvolatile bits in the AND and OR arrays. Also, output driver 240 drives feedback loop 250 which supplies output logic response to input drivers 230. Note that some of the output lines 245 may be included in feedback loop 250.

In operation, inputs 225 of PLA 200 result in logic outputs 245 based on the ON and OFF states of devices, such as EPROMs for example, located at the intersection of input lines such as A, B·C, . . . , $D_C$ and product term lines $PT_1, PT_2, \ldots, PT_M$ in electrically programmable AND array 210 and the intersection of $PT_1, PT_2, \ldots, PT_M$ and outputs $O_1, O_2, \ldots, O_N$ in programmable OR array 220. Details of PLA operation are well known in the literature, for example, C. Mead and Lynn Conway, "Introduction to VLSI Systems," Addison-Wesley Publishing Company, 1980, pages 79-82.

PLAs such as PLA 200 described further above are the earliest examples of simple SPLDs introduced in the early 1970's. PLAs using mask programmable AND arrays, OR arrays, and feedback loops in a fabricator were successfully used by IBM in many applications for over a decade. However, for field programmable PLAs with two memory arrays (memory planes) requiring electrically programmable AND and OR arrays, field programmable PLAs were difficult to manufacture and introduced significant propagation delays. To address these problems, simpler programmable array logic (PAL) devices were developed which use a programmable AND array to realize product terms and then provide said product terms to fixed (non-programmable) OR-gates. To compensate for the loss of OR array flexibility, product variations were introduced with different number of inputs and outputs and various sizes of OR-gates. Field programmable PALs were widely used in digital hardware immediately after their introduction and form the basis for more recent and more sophisticated architectures. All small programmable logic devices (PLDs) such PLAs and PALs are grouped together and referred to as simple field programmable devices (SP-DLs) and are typically low cost with high pin-to-pin speed performance as illustrated by block diagram 100 in FIG. 1.

FIG. 3 illustrates PAL 300 schematic implementation with an electrically programmable AND array 310 that includes nonvolatile nodes 320 and 325 programmed to an ON state, wherein essentially orthogonal programmable AND array lines are electrically coupled, or fused, together (said electrical coupling indicated by an open circle). Intersections of essentially orthogonal programmable AND array lines without circles are in a nonvolatile OFF state, wherein said lines are electrically isolated. Programmable AND array 310 may be formed using one-time-programmable EPROM devices for example. Programmable AND array 310 may be programmed once in the field. If the logic function needs to be changed, a new PAL chip is programmed in the field.

PAL 300 inputs A and B form column logic inputs A, $A_C$, B, and $B_C$ to programmable AND array 310, where $A_C$ indicates the complement of logic variable A and $B_C$ indicates the complement of logic variable B. In this specification, the complement of a logic variable such as logic variable A may be indicated symbolically by $A_C$ or A'. Both symbolical representations for the complement of a logic variable are used interchangeably throughout the specification. Feedback loop 330 provides inputs C and D which form programmable AND array column logic inputs C, $C_C$, D, and $D_C$. Product terms 335-1 and 335-2 form two outputs of programmable AND array 310 and provide inputs to OR logic gate 340. The OR logic gates are not programmable. Product terms 335-3 and 335-4 form another two outputs of programmable AND array 310 and provide inputs to OR logic gate 345. OR-gate 340 provides a sum-of-products (or sum-of-product-terms) output to the input of D-flip flop 350 and OR-gate 345 provides a sum-of-products output to the input of D-flip flop 355. D-flip flop 350 provides output $O_1$ which is connected to input C by feedback loop 330 and D-flip flop 355 provides output $O_2$ which is connected to input D by feedback loop 330.

In operation, inputs A and B to PAL 300 result in logic outputs $O_1$ and $O_2$ based on the ON and OFF states of devices, such as EPROMs for example, located at the intersection of input lines and product term lines in electrically programmable AND array 310. Details of PAL operation are well known in the literature and are available in product specifications.

Complex Programmable Logic Devices (CPLDs)

CPLDs consist of multiple SPLD-like blocks interconnected on a single chip, typically by a programmable global interconnect matrix resulting in a field programmable logic function that is substantially more powerful than is possible with even large individual SPLD functions and represents a category of programmable logic devices (PLDs) as shown in FIG. 1. The difficulty of increasing capacity of a single SPLD architecture is that the array size of the programmable logic-arrays are driven to large dimensions as the number of inputs increase. Therefore as technologies are scaled to smaller dimensions and the number of transistors available on chips increases, it becomes more efficient to limit the size of SPLDs and to interconnect multiple SPLDs with a programmable global interconnect matrix.

FIG. 4 illustrates a schematic of CPLD 400 architecture formed using four SPLD functions, SPLD 410, SPLD 420, SPLD 430, and SPLD 440. In one implementation, for example, electronically programmable SPLD functions may be formed using electronically programmable PALs similar to PAL 300 illustrated in FIG. 3. While four interconnected electronically programmable SPLD functions are illustrated in FIG. 4, dozens of interconnected SPLDs may be used to form a large flexible in-circuit programmable logic function.

All connections between SPLDs, in this example PALs similar to PAL 300 described further above with respect to FIG. 3, are routed (wired) through global interconnect matrix 450.

In operation, all communication between SPLD 410 and all other SPLDs used to form CPLD 400 are routed to global interconnect matrix 450 using wire(s) 410-1 and received from global interconnect matrix 450 using wire(s) 410-2. All communication between SPLD 420 and all other SPLDs used to form CPLD 400 flow are routed to global interconnect matrix 450 using wire(s) 420-1 and received from global interconnect matrix 450 using wire(s) 420-2. All communication between SPLD 430 and all other SPLDs used to form CPLD 400 flow are routed to global interconnect matrix 450 using wire(s) 430-1 and received from global interconnect matrix 450 using wire(s) 430-2. And all communication between SPLD 440 and all other SPLDs used to form CPLD 400 flow are routed to global interconnect matrix 450 using wire(s) 440-1 and received from global interconnect matrix 450 using wire(s) 440-2. Multiple inputs and outputs (I/Os) communicate between CPLD 400 and other circuit functions. Since all connections are routed through similar paths, time delays can be predicted which simplifies CPLD design. Buffer circuits (not shown) may be used as well.

Applications that can exploit wide AND/OR gates and do not require a large number of flip flops are good candidates for mapping into CPLDs. Control functions such as graphics controllers and some communication circuit functions map well into CPLD architectures. In-system re-programmability and reasonably predictable speed performance are significant advantages offered by CPLDs.

Field Programmable Gate Array (FPGA) Logic

FPGAs were invented by Ross Freeman, cofounder of the Xilinx Corporation, in 1984 to overcome the limitations of CPLDs. The primary differences between CPLDs and FPGAs are due to differences in chip architecture. As described further above, CPLD architecture consists primarily of programmable sum-of-products logic arrays with a relatively small number of clocked registers (D-flip flops for example) interconnected by a global interconnect matrix as illustrated further above by CPLD 400 shown in FIG. 4. CPLDs typically have relatively high logic-to-interconnect ratios. The result is less architectural flexibility and smaller logic functions (typically limited to tens to hundreds of thousands of equivalent logic gates) but more predictable timing delays and greater ease of programming.

FPGA architectures are dominated by interconnects. FPGAs are therefore much more flexible in terms of the range of designs that can be implemented and logic functions in the millions and tens of millions and eventually in the hundreds of millions of equivalent logic gates may be realized. In addition, the added flexibility enables inclusion of higher-level embedded functions such adders, multipliers, CPUs, and memory. The added interconnect (routing) flexibility of FPGAs also enables partial reconfiguration such that one portion of an FPGA chip may be reprogrammed while other portions are running FPGAs that can be reprogrammed while running may enable reconfigurable computing (reconfigurable systems) that reconfigure chip architecture to better implement logic tasks. The FPGA's flexibility, ability to support a large number of equivalent logic gates, and ability to accommodate embedded memory and logic functions are displacing ASICs in many applications because of lower non-recurring engineering (NRE) design costs and faster time-to-market. FPGA architecture is shown in FIG. 1 alongside SPLD and CPLD as a stand-alone category of programmable logic device architecture.

FPGA architecture and circuit implementations are described in U.S. Pat. Re. 34,363 to Freeman, filed on Jun. 24, 1991, and SRAM memory controlled routing switch circuit implementations are described in U.S. Pat. No. 4,670,749 to Freeman, filed on Apr. 13, 1984, the contents of which are incorporated herein by reference in their entirety. FPGA 500 (as shown in FIG. 5) schematically illustrates basic concepts taught by Freeman in the above referenced patents by Freeman.

Referring now to FIG. 5, FPGA 500 includes an array of configurable (programmable) logic blocks (CLBs) such as CLB 510 and programmable switch matrices (PSMs) such as PSM 520. Interconnections between CLBs and PSMs may be relatively short to provide local wiring (such as interconnect 530) or relatively long to provide global wiring (not shown). A programmable switch (routing) matrix PSM1 interconnecting four CLB blocks CLB1, CLB2, CLB3, and CLB4 is illustrated in FIG. 5. In this example, switch 540, one of the switches in PSM1, may be used to interconnect CLB1, CLB2, CLB3, and CLB4 in any combination.

CLBs are typically formed by combining look up tables (LUTs) with flip flops and multiplexers as illustrated schematically by CLB 600 in FIG. 6. Alternatively, CLBs may be formed by combining combinatorial logic with flip flops and multiplexers as illustrated by CLB 700 in FIG. 7.

Referring now to FIG. 6, CLB 600 comprises LUT 610 with inputs $I_1, \ldots, I_2, \ldots, I_N$. LUT 610 may be a random access memory (RAM) such as an SRAM, an EPROM, an EEPROM, or a flash memory. A typical LUT configuration may be a RAM organized in a 4×4×1 configuration with four inputs and one output. In this example, the LUT 610 output drives the input of clocked D-flip flop 620 which in turn drives an input of multiplexer (MUX) 630. The LUT 610 output may also drive an input of MUX 630 directly. MUX 630 drives (provides) CLB 600 output to terminal O.

Referring now to FIG. 7, CLB 700 includes configurable combinatorial logic function 710 with inputs $I_1, I_2, \ldots, I_N$. Configurable combinatorial logic function 710 may be formed using cascaded transfer devices or random logic blocks such as NAND and NOR functions for example. Configurable combinatorial logic function 710 formed using NanoLogic™ functions may also be used as described further below in FIGS. 12 and 14. Typical configurable combinatorial logic function 710 may be formed using cascaded transfer devices and configuration control bits or random logic blocks and configuration control bits. In this example, the configurable combinatorial logic function 710 output drives the input of clocked D-flip flop 720 which in turn drives an input of MUX 730. The configurable combinatorial logic function 710 output may also drive an input of MUX 730 directly. MUX 730 drives (provides) CLB 700 output to terminal O.

The routing flexibility of FPGAs enables a wide variety of functions to be realized. FIG. 8 illustrates FPGA 800 and shows an example of a static ram (SRAM) controlled routing of signals between various CLBs enabling an in-circuit programmable logic function. CLB 810 includes an AND gate with inputs $I_1$ and $I_2$ and an output $O_1$ which is provided to PSM 812 which includes FET 815 whose ON or OFF states are controlled by SRAM 820. FET 815 terminal 1 is connected to output $O_1$, gate terminal 2 is connected to SRAM 820, and terminal 3 is connected to wire 825. Wire 825 is in turn connected to PSM 828 which includes FET 830 whose ON and OFF states are controlled by SRAM 820. FET 830 terminal 4 is connected to wire 825, gate terminal 5 is connected to SRAM 820, and terminal 6 is connected to wiring 835. Wiring 835 is also connected to an input of MUX 840 which is controlled by SRAM 820. Output $O_2$ of MUX 840 is connected to wire 850 which is connected to an input of an AND gate in CLB 855 providing an output $O_3$. A global wire 860 is shown which is not part of local wiring.

In operation, output $O_1$ is applied to terminal 1 of FET 815 with the logic state (high or low voltage) of gate terminal 2 controlled by SRAM 820. If FET 815 is OFF, low gate voltage in this example, then $O_1$ does not propagate along wire 825. If however, FET 815 is ON, high gate voltage (typically 2.5 volts) in this example, then $O_1$ propagates through the channel region of FET 815 to terminal 3, and then along wire 825 to terminal 4 of FET 830 which is also controlled by SRAM 820. If FET 830 is in an OFF state, then $O_1$ does not propagate to terminal 5. However, if FET 830 is in an ON state, then $O_1$ propagates along wire 835 to an input terminal of MUX 840. If MUX 840 is enabled by SRAM 820, then MUX output $O_2$ is applied to an input terminal of the AND gate in CLB 855 by wire 850. The AND gate output $O_3$ is also the output of CLB 855.

The use of SRAMs to control wiring in FPGAs as illustrated above with respect to FIG. 8 and described in U.S. Pat. No. 4,670,749 has the advantage of compatibility with leading edge CMOS logic processes, is reprogrammable, and supports in-circuit programmability. However, it is the largest area element having 5 to 6 transistors per cell, requires external loading of bits to define the logic function. Further, in such SRAM based designs the FPGA is nonfunctional until loading is complete, is volatile, and has relatively low radiation tolerance. In addition, the large SRAM cell size also requires a large number of wiring layers and impacts architecture because the size of the switch is a key factor in determining FPGA architecture.

A very small switch such as a cross point antifuse may also be used for wiring. Such a small switch results in a different architecture and can reduce chip size by approximately 10× relative to an SRAM-based FPGA implementation. A cross point antifuse is nonvolatile, has very low capacitance (1 fF per node for example), is radiation hard, and does not require external loading of bits to operate. However, programming such antifuse based FPGA devices (such as is depicted in FIG. 9) requires relatively high voltages such as 5 to 10 volts to ensure breakdown and currents in the 5 to 10 mA range. Further such devices are one-time-programmable (OTP) and are difficult to in-circuit program.

FIG. 9 illustrates a schematic of FPGA 900 which includes logic cells such as logic cell 910, vertical wiring 920, horizontal wiring 930, and antifuses such as antifuse 940 at each intersection of vertical and horizontal wires. Such antifuses are typically formed using ONO dielectric-based antifuses or metal-to-metal antifuses. While wiring is showed in channel regions between logic cells, wiring over logic cells (not shown) may be used to further increase density. I/O circuits such as I/O 950 interface internal to FPGA 900 circuits and with output connections on the chip. FPGA 900 with dense wiring is somewhat similar to ASIC-type layouts although antifuse ON resistance may be in range of 25 ohms to several hundred ohms depending on antifuses used. Also, high voltage circuits (not shown) are included to switch selected cross point antifuse switches from an OFF to an ON state.

In operation, high voltages typically in the 5-10 volt range with high currents in the milliampere range are used to program (change) the cross point antifuses from an OFF-to-ON state. Then the logic function can be tested. A new chip is required for each logic function and OTP in-circuit programming is difficult. A socket approach can facilitate programming of FPGA 900.

SUMMARY

A nonvolatile nanotube programmable devices and the nonvolatile nanotube field programmable gate array (NFPGA) is provided.

Under certain embodiments, one or more nonvolatile nanotube (NV NT) select circuits are used to store (in a first operation) and later provide (in a second operation) one or more control bits to a conventional configurable logic block (CLB) circuit. Said NV NT select circuits comprise a pair of nanotube switches and a field effect transistor (FET). One terminal of each nanotube switch and one terminal of the FET are joined together to form a common node, providing a four terminal device. During a store operation, the resistance of each nanotube switch can be set to provide means for nonvolatile storage of a single control bit. During NFPGA operation, the control bits stored as corresponding nonvolatile high or low resistance states within each NV NT select circuit can be readily accessed and used to configure the CLB circuit. This nonvolatile nanotube based CLB system is referred to as an NCLB.

Under certain embodiments, one or more NV NT select circuits are used to store (in a first operation) and later provide (in a second operation) one or more control bits to a conventional programmable switch matrix (PSM) circuit. During NFPGA operation, the control bits stored as corresponding nonvolatile high or low resistance states within each NV NT select circuit can be readily accessed and used to configure the PSM circuit. This nonvolatile nanotube based PSM system is referred to as an NPSM.

Under certain embodiments, a NV NT select circuit is used to store (in a first operation) and later provide (in a second operation) a control bit to a conventional programmable bidirectional buffer circuit. During NFPGA operation, the control bit stored as corresponding nonvolatile high or low resistance states within the NV NT select circuit can be readily accessed and used to configure the direction of the buffer circuit. Additional NV NT select circuits can also be used to either enable or disable bypass paths around inverter stages within said conventional programmable bidirectional buffer circuit, providing means for signal inversion through the buffer circuit. Further, additional NV NT select circuits (the nanotube switches of which are configured with nonvolatile resistance values such as to provide a specific resistor divider ratio) can be used to provide programmable supply voltages within the buffer circuit, providing means for voltage level translation through the buffer circuit. This nonvolatile nanotube based programmable bidirectional buffer system is referred to as an NT BiDi buffer circuit.

Under certain embodiments, a plurality of nonvolatile NRAM™ cells are combined to form an NRAM™ array, providing means for nonvolatile storage of a plurality of data bits, each data bit corresponding to a unique combination of inputs (address) to the array. This NRAM™ array is then used in place of a conventional (volatile) SRAM array to form a conventional look up table (LUT) circuit. Said NRAM™ cells are comprised of a single nanotube switch wired in series with a FET, providing a three terminal device which can be used to store (in a first operation) and later recall (in a second operation) a single bit of data. During NFPGA operation, the data bits stored within the NRAM array can be readily accessed and provided to an output stage.

Under certain embodiments, a plurality of nonvolatile NRAM™ cells are combined to form an NRAM™ array, providing means for nonvolatile storage of a plurality of control bits. This NRAM™ array is then used to store (in a first operation) and later provide (in a second operation) a plurality of control bits to a conventional CLB circuit. During NFPGA operation, the control bits stored within said NRAM™ array can be readily accessed and used to configure the CLB circuit. This nonvolatile nanotube based CLB system is referred to as an NCLB.

Under certain embodiments, a plurality of nonvolatile NRAM™ cells are combined to form an NRAM™ array, providing means for nonvolatile storage of a plurality of control bits. This NRAM™ array is then used to store (in a first operation) and later provide (in a second operation) a plurality of control bits to a conventional PSM circuit. During NFPGA operation, the control bits stored within said NRAM™ array can be readily accessed and used to configure the PSM circuit. This nonvolatile nanotube based PSM system is referred to as an NPSM.

Under certain embodiments, a pair of nonvolatile NRAM™ cells is used to provide nonvolatile backup storage means within a conventional (volatile) SRAM cell. Prior to power loss in such a system, a store operation is performed which encodes the bit value stored in the volatile SRAM cell within each of the NRAM™ cells (a first NRAM™ cell encodes the true bit value, while a second NRAM™ cell encodes the compliment value). Similarly, a recall operation (typically performed after power up) is used to load the SRAM cell with the bit value stored within the nonvolatile NRAM™ cells.

Under certain embodiments, a plurality of these nanotube supported (or "shadowed") memory devices—termed nonvolatile nanotube shift registers (NS/Rs), having one nonvolatile nanotube shadow device per shift register stage—can be combined to form a nonvolatile nanotube configuration control register (NCCR). Such a device can be used to store (in a first operation) and later provide (in a second operation) a plurality of control bits to either a conventional CLB or a conventional PSM circuit, forming a NCLB or a NPSM, respectively.

Under certain embodiments, a plurality of control bits within a nonvolatile nanotube based programmable logic element (said control bits supplied by an NV NT select circuit, NRAM™, NS/R, or some combination or subcombination of the three) are altered in response to a security event. In this way, the configuration of said programmable logic elements is protected from unauthorized access in, for example, an attempt at reverse engineering a device employing nonvolatile nanotube based programmable logic elements.

Under certain embodiments, programmable supply voltages (programmed using NV NT select circuits as described further above) are set to provide precise signal delay values through one or more nonvolatile nanotube based programmable logic elements. As signal rise time through a CMOS circuit, for example, is directly proportional to supply (or "rail") voltage, precisely selecting a supply voltage for each circuit element provides means for precisely selecting a delay value through said element. Within this aspect, additional inverter stages may be used to restore signal levels to predetermined high and low voltages.

Under certain embodiments, programmable supply voltages (programmed using NV NT select circuits as described further above) provide means to regulate power consumption within a large system of nonvolatile nanotube programmable logic elements, such as, but not limited to, an FPGA.

The nonvolatile nanotube based programmable logic elements can be used together to realize a nonvolatile, rapidly reconfigurable nanotube based FPGA (NFPGA). Said NFPGA is advantageous because a device can be realized in significantly smaller physical dimensions compared to conventional SRAM based FPGAs of comparable logic density. Said NFPGA is further advantageous because it can be readily programmed and reprogrammed in-circuit, in contrast to one-time-programmable (OTP) antifuse or EPROM based FPGAs. Said NFPGA is also advantageous because such a device can be rapidly reconfigured, in whole or in part, during operation (in some cases within a single clock cycle).

Accordingly, a nonvolatile nanotube based configurable logic block (NCLB) is disclosed below. It comprises one or more nonvolatile nanotube (NV NT) select circuits and a conventional CLB circuit, wherein said NV NT select circuits are used to store and provide one or more configuration control bits to said conventional CLB circuit.

A nonvolatile nanotube based configurable logic block (NCLB) comprising an NRAM array is also provided. The array comprises a plurality of NRAM cells, and a conventional CLB circuit, wherein said NRAM array is used to store and provide one or more configuration control bits to said conventional CLB circuit.

A nonvolatile nanotube based programmable switch matrix (NPSM) is provided. It comprises one or more NV NT select circuits and a conventional PSM circuit, wherein said NV NT Select Circuits are used to store and provide one or more configuration control bits to said conventional PSM circuit.

A nonvolatile nanotube based programmable switch matrix (NPSM) is provided. It comprises an NRAM array, said array comprising a plurality of NRAM cells, and a conventional PSM circuit, wherein said NRAM array is used to store and provide one or more configuration control bits to said conventional PSM circuit.

A nonvolatile nanotube based programmable bidirectional (NT BiDi) buffer circuit is provided. It comprises a NV NT switch circuit and a conventional bidirectional buffer circuit, wherein said NV NT switch is used to store and provide a control bit to said conventional bidirectional buffer circuit.

A means within said NT BiDi buffer circuit (through the use of one or more additional NV NT switch circuits) is provided to invert a data signal passing through said buffer circuit.

A means within said NT BiDi buffer circuit (through the use of one or more additional NV NT switch circuits) is provided to level translation of a data signal passing through said buffer circuit.

It is also an object of the present disclosure to provide a nonvolatile nanotube based programmable look up table (LUT) comprising an NRAM array, said array comprising a plurality of NRAM cells, and an output stage, wherein said NRAM array, responsive to a plurality of input signals, provides a previously stored value for each unique combination of input values (address) to said output stage.

It is further an object of the present disclosure to provide a nanotube configuration control register (NCCR), said NCCR comprising a plurality of nonvolatile nanotube shift registers (NS/Rs), which can be used to store and provide a plurality of control bits within an NCLB or NPSM circuit.

It is also an object of the present invention to provide means for responding to a security event (an unauthorized attempt to reverse engineer a device, for example) wherein control bits within one or more nonvolatile nanotube programmable logic devices are altered upon detection of such an event.

It is further an object of the present disclosure to provide means for precision control of signal delay through one or more nonvolatile nanotube programmable logic devices wherein a programmable supply voltage, supplied by one or more NV NT select circuits, is carefully selected to set a desired signal delay.

It is also an object of the present disclosure to provide means to regulate power consumption within one or more nonvolatile nanotube programmable logic devices by selecting programmable supply voltages supplied by one or more NV NT select circuits.

It is further an object of the present disclosure to provide an nonvolatile nanotube based FPGA (NFPGA) comprising an arrangement nonvolatile nanotube programmable devices selected from a group consisting of NCLBs, NPSMs, NT BiDi buffer circuits, NRAM based LUTs, NCCRs.

In one aspect, the present disclosure relates to a programmable nonvolatile nanotube select circuit that can include a first two-terminal nonvolatile nanotube switch and a second two-terminal nonvolatile nanotube switch. Each of the first and second two-terminal nonvolatile nanotube switches can include a first terminal and a second terminal, wherein the first and second terminals of the first nonvolatile nanotube switch are in contact with opposite ends of a first nanotube element and the first and second terminals of the second nonvolatile nanotube switch are in contact with opposite ends of a second nanotube element. The second terminal of the first nonvolatile nanotube switch and the second terminal of the second nonvolatile nanotube switch can share a common node. The programmable nonvolatile nanotube select circuit can also include a field effect transistor (FET) having a drain region, a source region, a channel region positioned between the drain and source regions, and a gate node in proximity to the channel region, wherein the gate node modulates the conductivity of the channel region and wherein the drain region of the FET is electrically coupled to the common node.

In some embodiments, the field effect transistor of the programmable nonvolatile nanotube select circuit is a nanotube field effect transistor.

In one aspect, the present disclosure relates to a programmable nanotube logic circuit that can include a programmable nonvolatile nanotube select circuit. The programmable nonvolatile nanotube select circuit can include a first two-terminal nonvolatile nanotube switch and a second two-terminal nonvolatile nanotube switch. Each of the first and second two-terminal nonvolatile nanotube switches can include a first terminal and a second terminal, wherein the first and second terminals of the first nonvolatile nanotube switch are in contact with opposite ends of a first nanotube element and the first and second terminals of the second nonvolatile nanotube switch are in contact with opposite ends of a second nanotube element. The second terminal of the first nonvolatile nanotube switch and the second terminal of the second nonvolatile nanotube switch can share a common node. The programmable nonvolatile nanotube select circuit can also include a field effect transistor (FET) having a drain region, a source region, a channel region positioned between the drain and source regions, and a gate node in proximity to the channel region, wherein the gate node modulates the conductivity of the channel region and wherein the drain region of the FET is electrically coupled to the common node. The programmable nanotube logic circuit can also include a Boolean logic circuit that can include at least one input and an output wherein a first input of the at least one inputs is electrically coupled to the common node of the programmable nonvolatile nanotube select circuit.

In one aspect, the present disclosure relates to a programmable nanotube circuit that can include a programmable nonvolatile nanotube select circuit. The programmable nonvolatile nanotube select circuit can include a first two-terminal nonvolatile nanotube switch and a second two-terminal nonvolatile nanotube switch. Each of the first and second two-terminal nonvolatile nanotube switches can include a first terminal and a second terminal, wherein the first and second terminals of the first nonvolatile nanotube switch are in contact with opposite ends of a first nanotube element and the first and second terminals of the second nonvolatile nanotube switch are in contact with opposite ends of a second nanotube element. The second terminal of the first nonvolatile nanotube switch and the second terminal of the second nonvolatile nanotube switch can share a common node. The programmable nonvolatile nanotube select circuit can also include a field effect transistor (FET) having a drain region, a source region, a channel region positioned between the drain and source regions, and a gate node in proximity to the channel region, wherein the gate node modulates the conductivity of the channel region and wherein the drain region of the FET is electrically coupled to the common node. The programmable nanotube circuit can also include a transfer device that can include an input, an output, and a control terminal wherein the control terminal is electrically coupled to the common node of the programmable nonvolatile nanotube select circuit to enable transfer of a signal at the input of the transfer device to the output of the transfer device.

In one aspect, the present disclosure relates to a nonvolatile nanotube configurable logic circuit that can include a first, second and third plurality of input terminals and at least an output terminal, a plurality of programmable nonvolatile nanotube select circuits. Each programmable nonvolatile nanotube select circuit can include a first two-terminal nonvolatile nanotube switch and a second two-terminal nonvolatile nanotube switch. Each of the first and second two-terminal nonvolatile nanotube switches can include a first terminal and a second terminal, wherein the first and second terminals of the first nonvolatile nanotube switch are in contact with opposite ends of a first nanotube element and the first and second terminals of the second nonvolatile nanotube switch are in contact with opposite ends of a second nanotube element. The second terminal of the first nonvolatile nanotube switch and the second terminal of the second nonvolatile nanotube switch can share a common node. The programmable nonvolatile nanotube select circuit can also include a field effect transistor (FET) having a drain region, a source region, a channel region positioned between the drain and source regions, and a gate node in proximity to the channel region, wherein the gate node modulates the conductivity of the channel region and wherein the drain region of the FET is electrically coupled to the common node. The first plurality of input terminals can be electrically coupled to the first terminals of the nonvolatile nanotube switches and the second plurality of terminals can be electrically coupled to the gate regions of the nonvolatile nanotube switches. A first plurality of transfer devices can be electrically coupled to the signals on the third plurality of input terminals. The first plurality of transfer devices can also be electrically coupled to the signals on the common nodes of the nonvolatile nanotube switches. A second plurality of transfer devices can be electrically coupled to the complementary signals on the third plurality of input terminals, the second plurality of transfer devices can also be electrically coupled to the complementary signals on the common nodes of the nonvolatile nanotube switches, and wherein the signals on the first plurality of input terminals can be able to configure the first plurality of transfer devices and the second plurality of transfer devices to implement a plurality of Boolean logic functions at the output terminal.

In one aspect, the present disclosure relates to a nonvolatile nanotube programmable switch matrix that can include a first, second and third plurality of terminals, a plurality of programmable nonvolatile nanotube select circuits. Each programmable nonvolatile nanotube select circuit can include a first two-terminal nonvolatile nanotube switch and a second two-terminal nonvolatile nanotube switch. Each of the first and second two-terminal nonvolatile nanotube switches can include a first terminal and a second terminal, wherein the first and second terminals of the first nonvolatile nanotube switch are in contact with opposite ends of a first nanotube element and the first and second terminals of the second nonvolatile nanotube switch are in contact with opposite ends of a second nanotube element. The second terminal of the first nonvolatile nanotube switch and the second terminal of the second nonvolatile nanotube switch can share a common node. The programmable nonvolatile nanotube select circuit can also include a field effect transistor (FET) having a drain region, a source region, a channel region positioned between the drain and source regions, and a gate node in proximity to the channel region, wherein the gate node modulates the conductivity of the channel region and wherein the drain region of the FET is electrically coupled to the common node. The first plurality of terminals can be electrically coupled to the first terminals of the nonvolatile nanotube switches and the second plurality of terminals can be electrically coupled to the gate regions of the nonvolatile nanotube switches, and a plurality of transfer devices can be electrically coupled to the common nodes of the programmable nonvolatile nanotube select circuits, the plurality of transfer devices can also be electrically coupled to the third plurality of terminals so as to provide routing between any two terminals of the third plurality of terminals.

In one aspect, the present disclosure relates to a nanotube bi-directional buffer circuit that can include a first and second bi-directional terminals, a first and second buffers, each buffer can include an input, an output, and a transfer device. The nanotube bi-directional buffer circuit can also include a programmable nonvolatile select circuit that can include a first two-terminal nonvolatile nanotube switch and a second two-terminal nonvolatile nanotube switch, wherein each of the first and second two-terminal nonvolatile nanotube switches that can include a first terminal and a second terminal, wherein the first and second terminals of the first nonvolatile nanotube switch are in contact with opposite ends of a first nanotube element and the first and second terminals of the second nonvolatile nanotube switch are in contact with opposite ends of a second nanotube element, and the second terminal of the first nonvolatile nanotube switch and the second terminal of the second nonvolatile nanotube switch share a common node, and a field effect transistor (FET) having a drain region, a source region, a channel region positioned between the drain and source regions, and a gate node in proximity to the channel region, wherein the gate node modulates the conductivity of the channel region and wherein the drain region of the FET is electrically coupled to the common node. The first bi-directional terminal can be electrically coupled to the input of the first buffer and the output of the second buffer, wherein the second bi-directional terminal can be electrically coupled to the input of the second buffer and the output of the first buffer, wherein the signal on the common node of the programmable nonvolatile nanotube select circuit can be electrically coupled to the transfer device of the first buffer to enable signal flow from the second bi-directional terminal to the first bi-directional terminal, wherein the complementary signal on the common node of the programmable nonvolatile nanotube select circuit can be electrically coupled to the transfer device of the second buffer to enable signal flow from the first bi-directional terminal to the second bi-directional terminal.

Other features and advantages of the disclosure invention will become apparent from the following description of the invention which is provided below in relation to the accompanying drawings.

BRIEF DESCRIPTION OF THE DRAWINGS

FIG. 10D shows a perspective drawing of a nonvolatile nanotube block switch;

FIG. 10E shows a perspective drawing of a cross point switch formed using nonvolatile nanotube blocks described in FIG. 10D;

FIG. 11A shows a schematic representation of an NRAM™ cell;

FIG. 11B shows a schematic representation of a nonvolatile nanotube select circuit;

FIG. 14B shows various logic circuit configurations formed by the nonvolatile nanotube configuration logic block of FIG. 14A based on the logic state of nonvolatile nanotube select circuits that provide nonvolatile configuration control states (or bits);

DETAILED DESCRIPTION

Integrated circuits for a wide variety of product applications in a competitive environment require fast time-to-market for new designs and low (or zero) non-recurring engineering cost (NRE) and low fabrication cost. As a result, the demand for field programmable devices (FPDs) solutions has increased rapidly. Low power is a requirement for most applications. Applications are increasingly portable so conservation of battery power is a requirement and nonvolatile operation is advantageous, especially since integration levels (more function) are increasing rapidly as is the requirement for high performance.

The present disclosure provides field programmable device (FPD) chips with large logic capacity and field programmability that are in-circuit programmable (in-place in the package without requiring sockets). They use small versatile nonvolatile nanotube switches that enable efficient architectures for dense low power and high performance chip implementations and are compatible with low cost CMOS technologies and simple to integrate (low additional mask count and few additional process steps). Field programmable devices (FPDs) are also sometimes referred to as programmable logic devices (PLDs) and the terms FPD and PLD are used interchangeably throughout the application.

User In-Circuit Programmable Switch Technologies

Overview of User Programmable Switch Technologies

Figure 8:
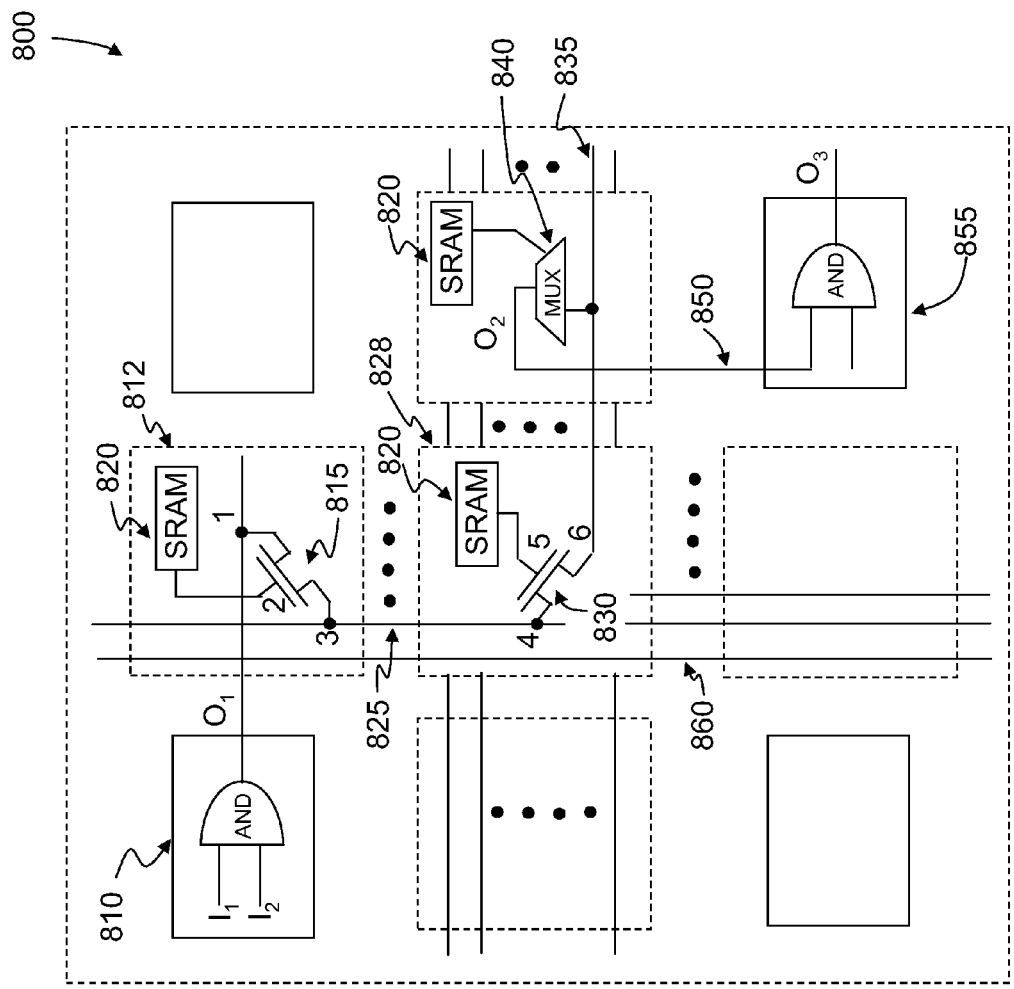
FIG. 8 is a block diagram of a field programmable gate array (FPGA) including an SRAM-configured programmable switch matrix.
Figure 9:
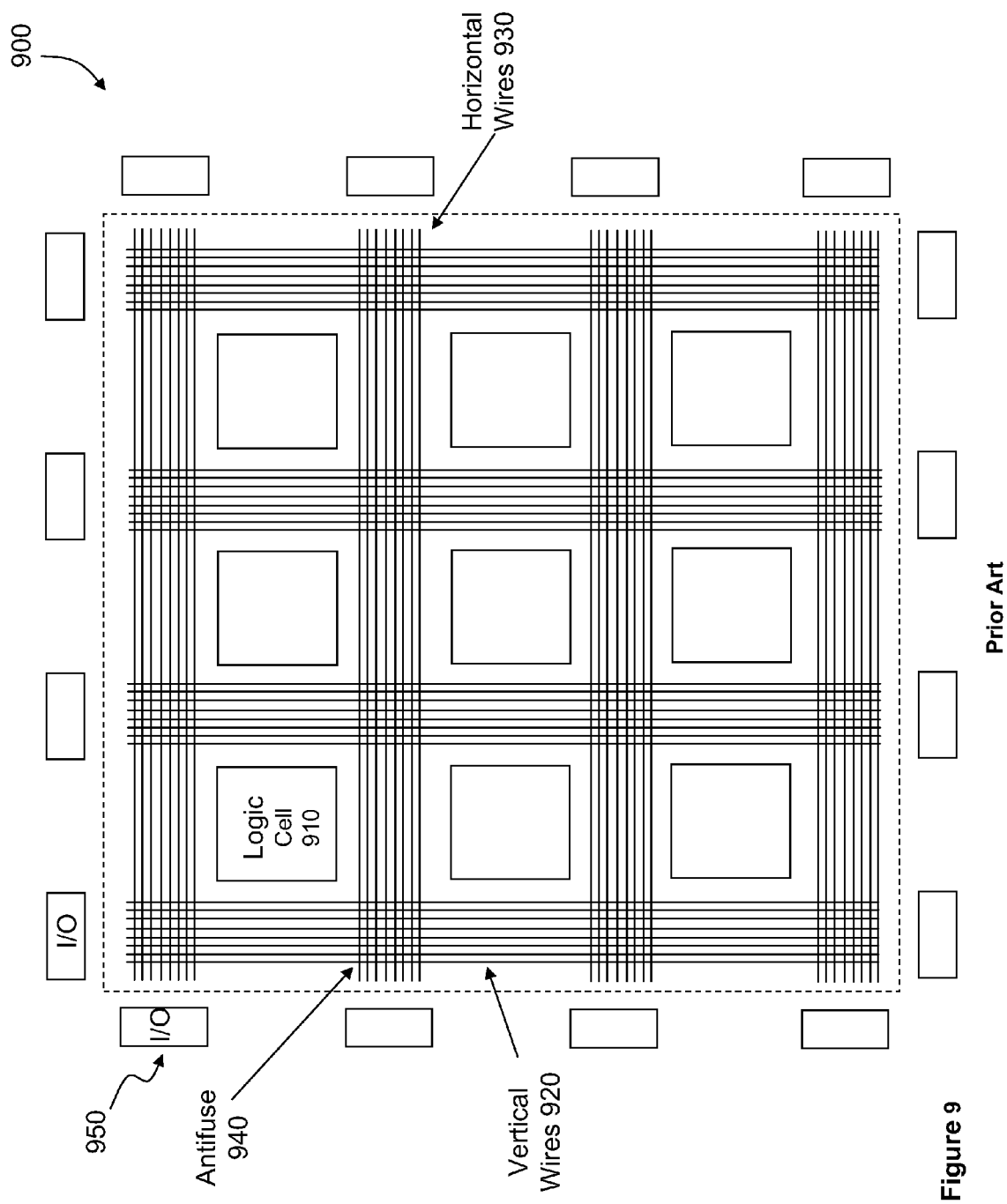
FIG. 9 is a block diagram of a field programmable gate array (FPGA) including antifuse-based programmable wiring.

Historically, CPLDs use EPROM and EEPROM switches and FPGAs use SRAM and antifuse switches. More recently, flash has also been used. As may be appreciated from the descriptions of FIGS. 8 and 9, the size, performance, and flexibility of switches used in FPGAs essentially determines FPGA architecture because FPGAs use a large amount of programmable wiring.

TABLE 1

| Switch Type | Reprogrammable In Circuit | Volatile | Typical Voltage | Technology |
|---|---|---|---|---|
| EPROM | NO (Out-of-Ckt: YES) | NO | Prog: 5-6 volts Operation: Std | UV-CMOS |
| EEPROM | YES | NO | Prog: 10-15 V Operation: higher voltage | EE-CMOS |
| FLASH | YES | NO | Prog: 10-15 V Operation: Std. | Flash-CMOS |
| SRAM | YES | YES | Std. | CMOS |
| Antifuse (AF) | NO | NO | Prog: 5-10 V. Operation: Std. | CMOS + special oxides & contacts |
| NV NT Switch | YES | NO | Prog: 3-7 V. Operation: Std. | CMOS & patterned nanotube fabric |

Table 1 is a summary of various switch types, their properties, programming and operating voltages, and underlying technologies. In some cases, more that one switch type may be used.

SRAMs used to control switches have the advantage of CMOS technology compatibility with the latest CMOS technology generation and compatibility with the standard (std.) technology operating voltages because no programming is required. However, very large switch area and volatile operation are disadvantages as well as high sensitivity to radiation and designs that can easily be copied. Antifuses have the advantage of small area size but are not reprogrammable because antifuses are OTP so the chip architecture cannot be modified once it is programmed. Antifuses typically require 5-10 volts and relatively high current in the 1-10 milliampere range. Antifuses have relatively high radiation tolerances and designs cannot easily be copied because "reverse engineering" is difficult. EPROMs with UV erase are typically limited to development prototypes. EEPROMs can be reprogrammed in-circuit but are larger than antifuses and require high programming voltage and require higher than standard operating voltages. Flash has high programming voltages but standard operating voltages. Flash devices are small in size but larger than antifuses and may be more sensitive to radiation than antifuses.

Nonvolatile nanotube (NV NT) switches such as those described in U.S. patent application Ser. No. 11/280,786, filed on Nov. 15, 2005, entitled "Two-Terminal Nanotube Devices and Systems and Methods of Making," U.S. Pat. No. 7,394,687 and U.S. patent application Ser. No. 12/165,007, filed on Jun. 30, 2008, entitled "Non-Volatile Shadow Latch Using a Nanotube Switch," U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," U.S. patent application Ser. Nos. 11/835,651, 11/835,759, 11/835,845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same," and U.S. patent application Ser. No. 11/835,613, filed on Aug. 8, 2007, entitled "Memory Elements and Cross Point Switches and Arrays of Same Using Nonvolatile Nanotube Blocks," may be used to form nonvolatile cross point switches that are as small as antifuses but can be programmed, erased, and reprogrammed multiple times. Such switches have a high tolerance to harsh environments such as high temperature and high radiation levels. NV NT switches may be combined with FETs to form nonvolatile NRAM™ memories with nonvolatile cells smaller than those of SRAMs as described in U.S. patent application Ser. No. 11/274,967, filed on Nov. 15, 2005, entitled "Memory Arrays Using Nanotube Articles with Reprogrammable Resistance." NV NT switches may be combined with FETs to form NanoLogic™ circuits as described in U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," and U.S. Patent Application No. 61/039,204, filed on Mar. 25, 2008, entitled "Carbon Nanotube-Based Neural Networks and Methods of Making and Using Same," that may be used for configurable (programmable) logic functions and programmable wire routing. So NV NT switches, which are compatible with CMOS technology and use programming voltages in the 3-7 volt range and corresponding programming currents in the tens of microamperes or less, are smaller than those of competing nonvolatile in-circuit reprogrammable technologies and operate at standard CMOS operating voltages and enable new more efficient CPLD and FPGA architectures. NV NT switch scaling of dimensions may be used to reduce programming voltages in future generations.

Nanotube switches fabricated as 2-D NV NT switches with a horizontal orientation or as 3-D NV NT block switches with a vertical orientation are illustrated in FIGS. 10A-10D and described in the above referenced patents. Other types of hybrid NanoLogic™ circuits may be fabricated as shown in U.S. Pat. Nos. 7,115,901 and 7,268,044 and U.S. patent application Ser. No. 11/731,946, each entitled "Non-Volatile Electromechanical Field Effect Devices and Circuits Using Same and Methods of Forming Same," U.S. Pat. No. 6,982,903, entitled "Field Effect Devices Having a Source Controlled via a Nanotube Switching Element," U.S. Pat. No. 7,280,394, entitled "Field Effect Devices Having a Drain Controlled via a Nanotube Switching Element," U.S. Pat. No. 7,211,854 and U.S. patent application Ser. No. 11/742,290, filed on Apr. 30, 2007, each entitled "Field Effect Devices Having a Gate Controlled via a Nanotube Switching Element," U.S. Pat. No. 7,301,802, entitled "Circuit Arrays Having Cells with Combinations of Transistors and Nanotube Switching Elements," and U.S. Pat. No. 7,112,493 and U.S. patent application Ser. No. 11/527,127, filed on Sep. 26, 2006, each entitled "Method of Making Non-Volatile Field Effect Devices and Arrays of Same." Also, NanoLogic™ circuits that use only nanotube elements are also possible. Such nanotube-only type of NanoLogic™ circuits are described in U.S. Pat. No. 7,115,960 and U.S. patent application Ser. No. 11/542,524, filed on Oct. 3, 2006, each entitled "Nanotube-Based Switching Elements," U.S. Pat. Nos. 6,990,009, 7,339,401 and U.S. patent application Ser. No. 11/971,476, filed on Jan. 9, 2008, each entitled "Nanotube-Based Switching Elements with Multiple Controls," U.S. Pat. No. 7,228,970 and U.S. patent application Ser. No. 11/929,076, filed on Oct. 30, 2007, each entitled "Integrated Nanotube and Field Effect Switching Device," U.S. Pat. No. 7,329,931 and U.S. patent application Ser. No. 12/029,118, filed on Feb. 11, 2008, each entitled "Receiver Circuit Using Nanotube-Based Switches and Transistors," U.S. Pat. No. 7,330,709 and U.S. patent application Ser. No. 12/029,661, filed on Feb. 12, 2008, each entitled "Receiver Circuit Using Nanotube-Based Switches and Logic," U.S. Pat. Nos. 7,164,744, 7,265,575 and U.S. patent application Ser. No. 11/897,812, filed on Aug. 31, 2007, each entitled "Nanotube-Based Logic Driver Circuits," U.S. Pat. Nos. 7,161,403, 7,405,605 and U.S. patent application Ser. No. 12/147,315, each entitled "Storage Elements Using Nanotube Switching Elements," and U.S. Pat. Nos. 7,167, 026, 7,288,961 and U.S. patent application Ser. No. 11/928, 538, filed on Oct. 30, 2007, each entitled "Tri-state Circuit Using Nanotube Switching Elements," and may be volatile or nonvolatile in operation. This specification will focus on NV NT switches and NV NT blocks for nonvolatile multiple-cycle cross point switches, hybrid FET-nanotube combinations for NRAM™ storage elements, and NanoLogic™ circuits.

User In-Circuit Nonvolatile Programmable Switch Technologies Using Nanotube Switches, Nanotube Cross Point Switches, NRAM™ Memories, and NanoLogic™ Circuits Examples of certain embodiments of nonvolatile nanotube-based user-programmable switches for use in nanotube FPGA (NFPGA) Logic, nanotube SPLD (NSPLD) logic, and nanotube CPLD (NCPLD) logic are described further below in FIGS. 10A-10G and 11, 12. These include two-dimensional and three-dimensional nonvolatile nanotube switches and dense multi-cycle bidirectional cross point switches, dense directional cross point switches, nonvolatile NRAM™ memory cells, and nonvolatile NanoLogic™ circuits.

Figure 10C:
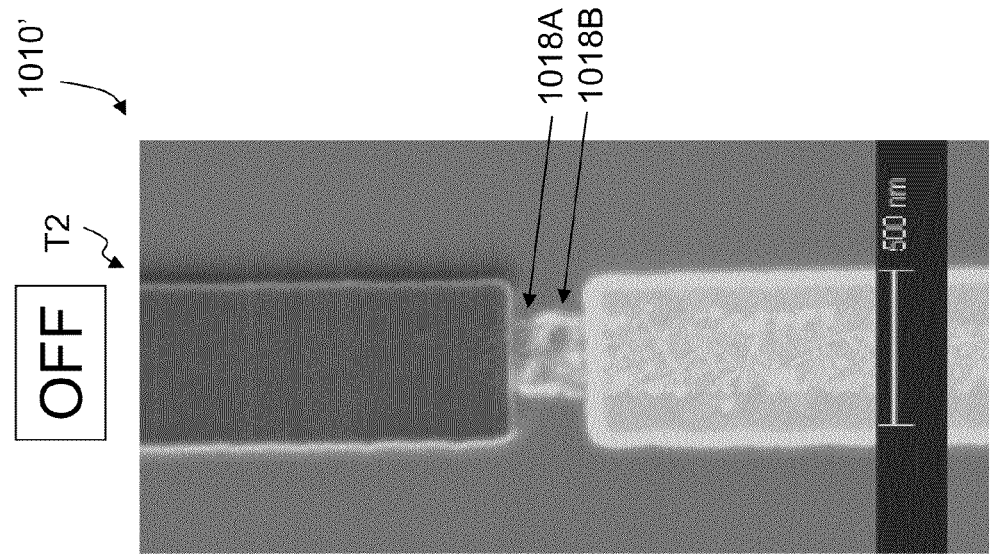
FIGS. 10B and 10C show a nonvolatile nanotube switch (NV NT switch) in ON and OFF states, respectively.
Figure 10B:
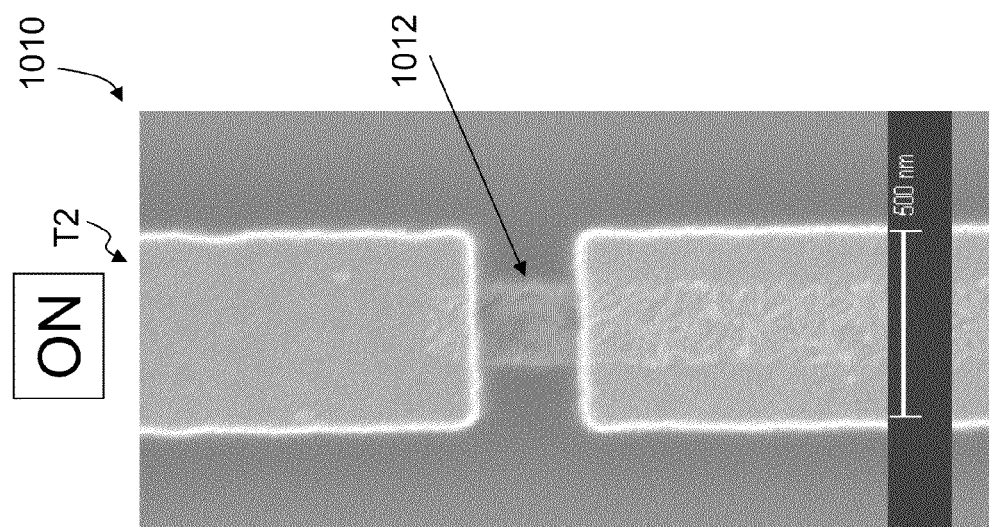
Figure 10A:
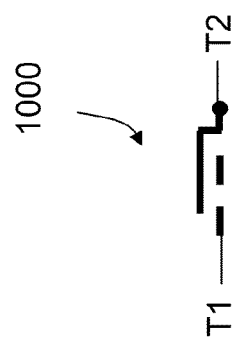
FIG. 10A illustrates a schematic of a nonvolatile nanotube switch (NV NT switch)

Nonvolatile nanotube (NV NT) switch 1000 illustrated in FIG. 10A is a schematic illustration of a two terminal switch with terminals T1 and T2 in contact with opposite ends of a patterned nanofabric (patterned non-woven nanotube fabric) as illustrated in U.S. Pat. Nos. 6,706,402, 6,942,921 and U.S. patent application Ser. Nos. 10/774,682, filed on Feb. 9, 2004, 11/111,582, filed on Apr. 21, 2005, each entitled "Nanotube Films and Articles," U.S. Pat. Nos. 6,835,591, 7,264,990, and 7,335,528, each entitled "Methods of Nanotube Films and Articles," and U.S. patent application Ser. No. 10/341,130, filed on Jan. 13, 2003, entitled "Carbon Nanotube Films, Layers, Fabrics, Ribbons, Elements and Articles." NV NT switch 1000 may be viewed as a resistor that changes resistance value, increasing or decreasing resistance, as a function of applied currents and voltages as described in U.S. patent application Ser. No. 11/280,786, filed on Nov. 15, 2005, entitled "Two-Terminal Nanotube Devices and Systems and Methods of Making," and U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches." Resistance values are nonvolatile and are retained (remembered) even if power is removed (switched OFF). In applications such as NRAM™ storage cells, switches may be switched between ON and OFF states in which the ON state resistance may be in the 10 k Ohm to 1M Ohm range and the OFF state is typically 1 G Ohm and higher.

It is also possible to store multiple bits on a single NV NT switch 1000 using multiple ON resistance values and one OFF value for increased memory density. For example, four resistance states store two bits of information on the same switch as described in U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches." Multi-resistance (greater than two) values may also be used in analog applications as described in U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches." In those applications featuring multi-resistance (greater than two) values, NV NT 1000 switches may be referred to as NANRISTORs. Since most of the NV NT 1000 switches as used in this application are digital (ON or OFF) the term NV NT switch is used.

Switch resistance values for NV NT NRAM™ cells and NanoLogic™ circuits typically range in ON values between 10 k Ohm and 1M Ohm. OFF resistance values are typically 1 G Ohm or higher. In the case of cross point switches, ON resistance values may be in the range of 50 Ohms to 500 Ohms for example because of time delay (performance) considerations. Resistance values are determined by material and geometric properties (dimensions) such as channel length and width and the density of the nanotube fabric. As illustrated above, different applications use different values of NV NT switch resistance values.

FIG. 10B shows a planar voltage contrast SEM image of a two terminal NV NT switch 1010 in an ON state in which nanotube channel region 1012 forms a continuous path between terminals T1 and T2. FIG. 10C shows two terminal NV NT switch 1010' in an OFF state. The same physical NV NT switch is used for both FIGS. 10B and 10C. However, NV NT switch 1010' is in an OFF state; that is there no continuous path between terminals T1 and T2. The nanotube channel region in FIG. 10C is electrically discontinuous with a portion of nanotube channel region 1018A in an OFF state and another series portion of nanotube channel regions 1018B in an ON state. FIGS. 10B and 10C are described in greater detail in U.S. patent application Ser. Nos. 11/835,651, 11/835,759, 11/835,845, 11/835,852, 11/835,856, 11/835, 865, each filed on Aug. 8, 2007, entitled "Nonvolatile Nanotube Diodes and Nonvolatile Nanotube Blocks and Systems Using Same and Methods of Making Same."

Programmable Wiring Using Nonvolatile Nanotube Cross Point Switches

In cross point switch applications which require high density, vertically oriented nonvolatile nanotube (NV NT) blocks may be used as illustrated by a perspective view of NV NT block 1020 in FIG. 10D. NV NT block 1020 is formed by etching a relatively thick (30 to 40 nm for example) nanofabric layer to form nanofabric block 1022 with bottom contact 1023 and top contact 1024. NV NT block 1020 switches may be in-circuit programmed between ON and OFF states multiple times. So for example, programmable antifuse 940 shown in FIG. 9 (which cannot be programmed or configured in-circuit) may be replaced with in-circuit programmable NV NT block 1020 at comparable densities.

FIG. 10E shows a perspective drawing of bidirectional cross point switch array 1025 formed using four NV NT blocks 1030-1, 1030-2, 1030-3, and 1030-4 corresponding to NV NT block 1020 in FIG. 10D. Traces 1032-1 and 1032-2 correspond to vertical wires 920 and traces 1034-1 and 1034-2 correspond to horizontal wires 930 in FPGA 900 schematic drawing illustrated in FIG. 9. These orthogonal pairs of traces in contact with bottom and top surfaces of NV NT blocks provide FPGA wiring and contacts to the four NV NT blocks thereby forming bidirectional cross point switch array 1025 that supports in-circuit programming (routing).

Trace 1032-1 forms array wiring and the bottom contact of NV NT blocks 1030-1 and 1030-3 and trace 1032-2 forms array wiring and the bottom contact of NV NT blocks 1030-2 and 1030-4. Trace 1034-1 forms array wiring and the top contact of NV NT blocks 1030-1 and 1030-2 and trace 1034-2 forms array wiring and the top contact of NV NT blocks 1030-3 and 1030-4.

Figures 10F, 10G:
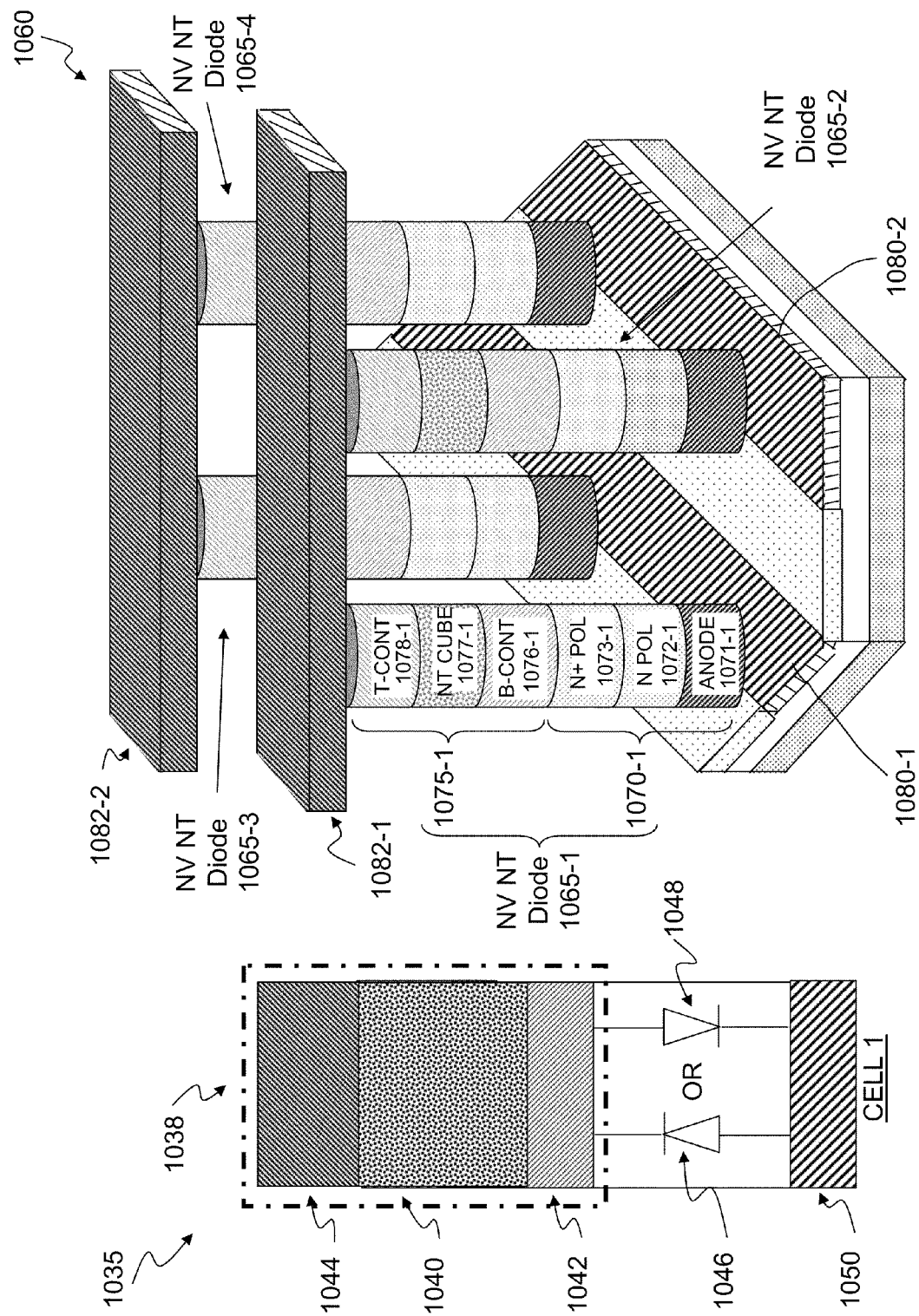
FIG. 10F shows a cross section of a nonvolatile nanotube block in series with steering (select) diodes shown in schematic form, with a first diode having a cathode in contact with a terminal of the nonvolatile nanotube block, or a second diode having an anode in contact with a terminal of the nonvolatile nanotube block.
FIG. 10G shows a perspective drawing of four memory cells (or four cross point switch cells) formed using the memory cell shown in FIG. 10F.

Bidirectional cross point switch array 1025 illustrated in perspective view in FIG. 10E enables or prevent bidirectional flow of signals, currents, voltages, or power in a densely packed array of NV NT block nonvolatile in-circuit programmable switch matrix. It may be desirable for some dense switch matrices to enable or prevent unidirectional flow of signals, currents, voltages, or power in dense arrays nonvolatile switches. FIG. 10F illustrates a nonvolatile nanotube (NV NT) diode 1035 that includes a NV NT block 1038 corresponding to NV NT block 1020 in series with a diode and is described in further detail in U.S. patent application Ser. Nos. 11/835,651, 11/835,759, 11/835,845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same." NV NT block 1038 conducts current in any direction and is not sensitive to voltage polarity. NV NT block 1038 includes NV NT block 1040, bottom contact 1042, and top contact 1044. Diode 1046 illustrated schematically is oriented such that the cathode is connected to bottom contact 1042 and the anode is connected to contact 1050 enabling vertical current flow in the upward direction. Alternatively, diode 1048 illustrated schematically is oriented such that the anode is connected to bottom contact 1042 and the cathode is connected to contact 1050 enabling vertical current flow in the downward direction. Diodes 1046 and 1048 may be may be Schottky diodes, PN diodes, or diodes formed with nanotube fabric anodes as described in U.S. patent application Ser. Nos. 11/835,651, 11/835,759, 11/835,845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same."

Unidirectional cross point switch array 1060 illustrated in perspective view in FIG. 10G enables or prevent unidirectional flow of signals, currents, voltages, or power in a densely packed array of NV NT block nonvolatile in-circuit programmable switch matrix. Unidirectional cross point switch array 1060 formed using four nonvolatile nanotube (NV NT) diodes 1065-1, 1065-2, 1065-3, and 1065-4 that correspond to NV NT diode 1035 illustrated in FIG. 10F and illustrates a Schottky diode version of diode 1046 as the current steering device. The NV NT diode 1065-1 structure is representative of NV NT diodes 1065-2, 1065-3, and 1065-4. NV NT diode 1065-1 is formed by NV NT block 1075-1 and Schottky diode 1070-1. Note that PN diode and diodes with nanotube anodes may also be used as described in U.S. patent application Ser. Nos. 11/835,651, 11/835,759, 11/835,845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same." Schottky diode 1070-1 is formed by anode 1071-1 in contact with N− poly 1072-1, in contact with N+ poly 1073-1; NV NT block 1075-1 is formed by NT cube 1077-1 in contact with bottom contact 1076-1 and top contact 1078-1. Traces 1080-1 and 1080-2 correspond to vertical wires 920 and traces 1082-1 and 1082-2 correspond to horizontal wires 930 in FPGA 900 schematic drawing illustrated in FIG. 9. These orthogonal pairs of traces in contact with diode 1070-1 anode 1071-1 for example and top contact 1078-1 for example of NV NT diode 1065-1 and corresponding diode anodes and top contacts of NV NT diodes 1065-2, 1065-3, and 1065-4 simultaneously provide unidirectional FPGA wiring and four NV NT diodes thereby form unidirectional cross point switch array 1060 that supports in-circuit programming. Trace 1080-1 forms array wiring and the contact to anodes of corresponding NV NT diodes 1065-1 and 1065-3 and trace 1080-2 forms array wiring and the top contact of NV NT diodes 1065-2 and 1065-4. Trace 1082-1 forms array wiring and the top contact of NV NT diodes 1065-1 and 1065-2 and trace 1082-2 forms array wiring and the top contact of NV NT diodes 1065-3 and 1034-4.

High Application Function Security Using Programmable Wiring with Nonvolatile Nanotube Cross Point Switches and Programmable Logic Blocks There are certain sensitive applications in which it is desirable that a logic application function remain proprietary. Such applications include intelligence functions, military applications, industrial secrets, and others. However, there are situations in which a logic application function can be determined based on hardware implementations such as in integrated circuit chips for example in which such chips may be stolen or fall into unfriendly territory. In cases where hard wire connections are permanent, hard wires can be traced and the logic function can be identified. Alternatively, in some cases, chips may be interrogated electronically by a security breach in an internet connection. What is needed are effective countermeasures that provide high application function security.

A logic application function can be identified based on the logic blocks used and wiring interconnections between the logic blocks. A logic application function may be secured by reprogramming one or more programmable wiring interconnections between individual wires and logic (or logic and memory) blocks if a security event (breach) is detected. In another approach, a logic application function may be secured by reprogramming one or more programmable logic blocks if a security event is detected. In still another approach, a logic application function may be secured by both reprogramming one or more programmable wiring interconnections and further reprogramming one or more programmable logic blocks if a security event is detected. These and other similar electronic countermeasure approaches to logic application function security require dense nonvolatile switches that can be programmed multiple times and changed in case of a security event.

In certain situations, a security event may be detected and sufficient time exists to deploy electronic countermeasures such as the reprogramming of integrated circuit chips. If a security event is detected, the logic application functions may be changed by altering programmable wiring connections, altering programmable logic blocks, or altering both wiring connections and logic blocks as described further above. However, this requires dense nonvolatile switches such as nonvolatile nanotube cross point switches (FIGS. 10D, 10E, 10F, and 10G) and other nonvolatile nanotube switch types such as the NV NT switch illustrated in FIGS. 10A-10C that can be programmed multiple times. One-time-programmable (OTP) antifuses, or any kind of OTP switch, cannot be used because OTP switches cannot be reprogrammed. Additional examples of nonvolatile nanotube-based switches are illustrated further below with respect to FIGS. 11 and 12 for example, and various FPGA logic examples also illustrated further below. In case of a security event, logic application functions may be altered in many ways, such as, but not limited to, reprogramming said logic application functions in a random manner or setting a plurality of programmable interconnections to an open state. Alternatively, the logic application function may be altered such that a different logic application function is formed to deliberately mislead.

In other situations, a security event may take place which is undetected or in which there is insufficient time to deploy electronic countermeasures. For example, an integrated circuit chip that includes high application function security logic may be stolen. In this situation, chip designs that make the application of advanced reverse engineering (failure analysis) techniques difficult may be used to protect high application function security chips. For example, a high application security function may include extra circuits, devices, and interconnections for the purpose of complicating reverse engineering of integrated circuit chips. For hard-wired logic functions, interconnections and contact regions may be traced (that is, interconnections between circuit elements detected using electronic equipment such as scanning electron microscopes) at high magnification to identify logic functions. If antifuses are used instead of contacts, it is difficult to tell whether an antifuse has been activated (is conductive) and forms a contact or if the antifuse is nonactivated (nonconducting) by examining the chip regions under high magnification. However, since cross sectional techniques to determine oxide integrity are well known in the industry, the logic function may be reverse engineered using known failure analysis techniques to see if an antifuse oxide has been ruptured and is in a conductive state or if the oxide is intact and the antifuse is in a noncontactive state.

Cross point switches using patterned nanofabric, as described in U.S. patent application Ser. No. 11/280,786, filed on Nov. 15, 2005, entitled "Two-Terminal Nanotube Devices and Systems and Methods of Making," to form nonvolatile nanotube switches such as illustrated in FIGS. 10D and 10E are nearly impossible to reverse engineer. Typically, the patterned nanofabric cross point switch area (or volume) is about 90% void or filled with non-carbon nanotube material. Cross sectioning such a cross point switch tends to destroy it completely. Even if the switch is not destroyed completely, it is likely to be damaged so that the state of the switch (low or high resistance) cannot be reliably determined.

Another approach to nanotube-based security is to leverage the difficulty of reverse engineering cross point switches using patterned nanofabric (as described further above) and to include patterned nanofabric contacts in logic as part of logic wiring (interconnects) that are very difficult to reverse engineer. This is possible because such patterned nanofabric contacts are (or can be made) normally as conducting nonvolatile nanotube crosspoint switches as-fabricated. Keeping the logic operating voltages below the switching voltage of the nonvolatile nanotube cross point switches enables the patterned nanofabric to act as a patterned nonfabric contact. The switching voltage of nonvolatile nanotube cross point switches may be increased to well above that the logic voltage swings as needed as to ensure that patterned nanofabric contacts remain conductive, as described in U.S. Pat. Nos. 6,706, 402, 6,942,921 and U.S. patent application Ser. Nos. 10/774, 682, filed on Feb. 9, 2004, 11/111,582, filed on Apr. 21, 2005, each entitled "Nanotube Films and Articles."

NRAM™ Cells and NanoLogic™ Analog and Digital Circuits

FIG. 11A illustrates NRAM™ cell 1100 comprising NV NT switch 1110 and FET 1120 in series. Nonvolatile NRAM™ memories are formed with multiple NRAM cells similar to NRAM cell 1100 as described in U.S. patent application Ser. No. 11/280,786, filed on Nov. 15, 2005, entitled "Two-Terminal Nanotube Devices and Systems and Methods of Making," and U.S. patent application Ser. No. 11/274,967, filed on Nov. 15, 2005, entitled "Memory Arrays Using Nanotube Articles with Reprogrammable Resistance," and with respect to FIG. 19 further below, with nonvolatile cells smaller in area than volatile 6 FET SRAM cells. Multiple word lines (not shown) are arranged horizontally and in contact with gates of FETs corresponding to gate G of FET 1120; bit lines (not shown) essentially orthogonal to word lines are arranged vertically and contact a diffusion terminal corresponding to terminal T1 in FIG. 11A. One side of the NV NT switches corresponding to NV NT switch 1110 is in contact with a terminal of FETs such as FET 1120 and the other side is in contact with common reference lines (not shown) in contact with a terminal of NV NT switches such as NV NT switch 1110. Such contacts may be formed with reference lines that may be parallel to word or bit lines, or may be formed by a reference plane (not shown), with reference voltage held at a reference voltage such as ground.

In operation, NRAM™ cell 1100 may be programmed to a high resistance state such as 1 G Ohm or higher for example, and a low resistance state in the 100 k Ohm to 1M Ohm range for example. Voltages in the range of 3-7 volts are applied for write 1 (program) and write 0 (erase) operations with readout voltages in the 1.5 to 2.5 volt range. Operating conditions are a function of the NV NT switch material and geometrical characteristics such as distance between terminal contacts to the patterned nanofabric material. Waveform examples are illustrated in U.S. patent application Ser. No. 11/280,786, filed on Nov. 15, 2005, entitled "Two-Terminal Nanotube Devices and Systems and Methods of Making," U.S. patent application Ser. No. 11/274,967, filed on Nov. 15, 2005, entitled "Memory Arrays Using Nanotube Articles with Reprogrammable Resistance," U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches."

In order to further facilitate in-circuit configurable (programmable) logic blocks (cells, functions) and in-circuit programmable switch matrices for routing signals, currents, voltages, and/or power for example, NanoLogic™ circuits with various combinations of nonvolatile switches and FETs may be formed. NanoLogic™ circuits may be used in FPGAs, SPLDs, CPLDs, and in other digital circuit applications as well as analog applications. FPGA, SPLD, and CPLD programmable logic functions configured using nanotube-based NanoLogic™ and memory functions such as NRAM™ may be referred to as NFPGA, NSPLD, and NCPLD logic functions, respectively.

FIG. 11B illustrates an embodiment of NanoLogic™ configurable (programmable) NV NT select circuit 1150 formed using NV NT switch 1155 (SW1) and NV NT switch 1160 (SW2) sharing a common node referred to as select node 1170. Terminals T1 and T2 are connected to a second terminal of NV NT switches 1155 and 1160, respectively. FET 1165 has a diffusion connected to common select node 1170 and the other diffusion connected to a reference such as ground as described in U.S. Patent Application No. 61/039,204, filed on Mar. 25, 2008, entitled "Carbon Nanotube-Based Neural Networks and Methods of Making and Using Same."

In operation, when a logic function is programmed, FET 1165 is activated (ON) during program (write 1) or erase (write 0) operations by applying a high voltage to gate G of FET 1165 which connects select node 1170 to ground and provides a current path between terminal T1 and ground and terminal T2 and ground through NV NT switches 1155 and 1160, respectively. Combinations of erase and program operations are used to set resistance states (values) of NV NT switches 1155 and 1160. Erase and program operations are described further above with respect to FIG. 11A and in more detail in U.S. patent application Ser. No. 11/280,786, filed on Nov. 15, 2005, entitled "Two-Terminal Nanotube Devices and Systems and Methods of Making," U.S. patent application Ser. No. 11/274,967, filed on Nov. 15, 2005, entitled "Memory Arrays Using Nanotube Articles with Reprogrammable Resistance," U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches." NV NT switches 1155 and 1160 may be viewed as NANRISTORS. These resistance states (values) remain nonvolatile even after power is removed or lost. After program or erase operations, FET 1165 is in an (OFF) state by applying a low voltage such as ground to gate G of FET 1165 and select node 1170 is disconnected from ground. NV NT select circuit 1150 is now ready to provide a configured (programmed) logic block function operating at 2.5 volts for example. Note that while NanoLogic™ circuits are designed to be in-circuit programmed, this does not preclude programming in sockets for example as is done in some older technologies. In fact, NanoLogic™ circuits may be embedded and operate in chips with older programmable technologies and with CMOS digital and analog circuits. Note that the terms configurable and programmable are used interchangeably.

During logic operation, after the configurable logic function has been programmed and is stored in a nonvolatile state by NV NT switches 1155 and 1160 operating voltages are kept sufficiently low, less than 3 volts for example, so that the resistance states (values) of NV NT switches 1155 and 1160 are not changed (disturbed) under NFPGA, NCPLD, NSPLD, and other programmable logic function operation. If NV NT switch 1155 is in high resistance state, 1 G Ohm for example, and NV NT switch 1160 is in low resistance state, 100 k Ohms for example, and if T1 is at an on-chip voltage of $V_{DD}$=2.5 volts and T2 is at a reference voltage such as ground (zero volts), then select node 1170 voltage will be at approximately 0 volts. However, if switch NV NT switch 1155 is in a low resistance state, 100 k Ohm for example, and NV NT switch 1160 is in a high resistance state, 1 G Ohm for example, then select node 1170 voltage will be at 2.5 volts. FET 1165 is OFF during logic operations.

Logic operation has been described in terms of applying inputs to terminals T1 and T2 to generate a select node 1170 output voltage. However, an input voltage may be applied to select node 1170 and output voltages may be generated at terminals T1 and T2 based on the resistance states (values) of NV NT switches 1155 and 1160 and circuits (not shown) connected to terminals T1 and T2.

Figure 7:
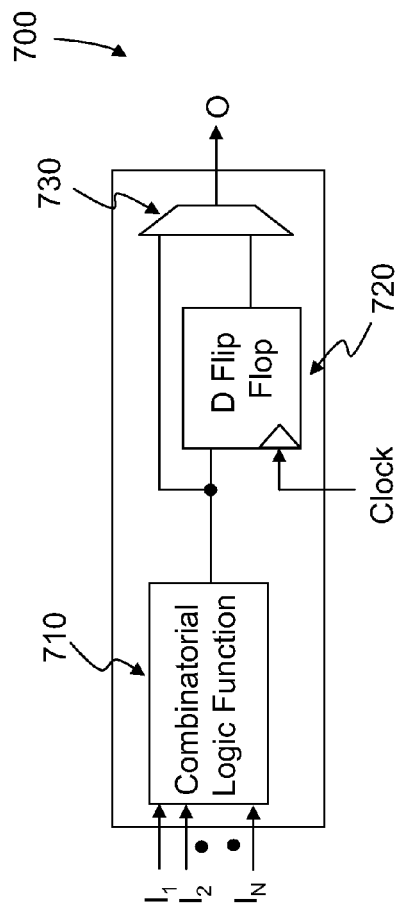
FIG. 7 is a block diagram of a configurable logic block (CLB) including a combinational logic function, a D-flip flop, and a multiplexer.

FIGS. 12A-12D illustrate various embodiments of NanoLogic™ nonvolatile nanotube configurable logic blocks (circuits, functions, cells) with inputs X1 and X2 to NV NT switches and a mode control input Y connected to the gate of a mode control (program/erase or operate) FET. Inputs X1 and X2 and mode control input Y may be shared by multiple NanoLogic™ circuits as illustrated further below in FIG. 13. The NanoLogic™ circuits illustrated in FIG. 12 correspond to combinatorial logic function 710 illustrated in FIG. 7. Flip flops and multiplexers often included as part of configurable logic blocks, as illustrated in FIG. 7, are not shown in FIG. 12 but may be included as needed.

Figure 12A:
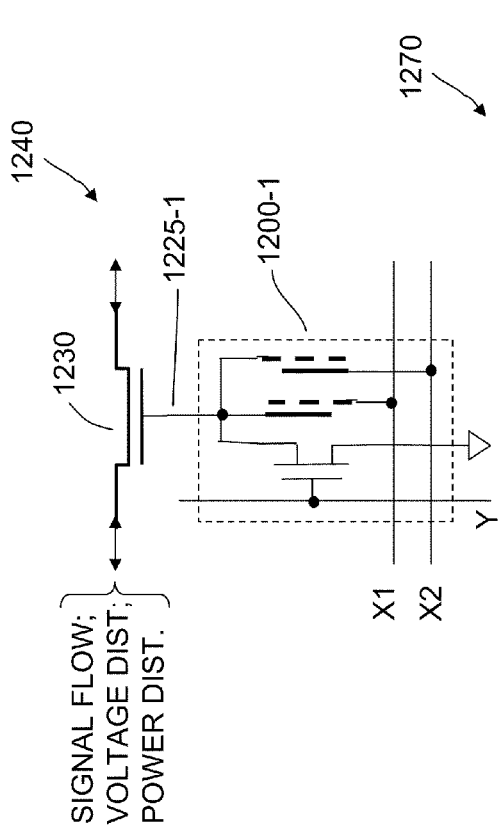
FIG. 12A shows the nonvolatile nanotube select circuit of FIG. 11B wired as one cell in an X-Y array configuration.

NanoLogic™ programmable NV NT select circuit 1200 illustrated in FIG. 12A corresponds to programmable NV NT select circuit 1150 illustrated in FIG. 11B. Inputs X1 and X2 correspond to inputs T1 and T2, respectively; switches 1205 and 1210 correspond to switches 1155 and 1160, respectively; FET 1215 corresponds to FET 1165. Mode control input Y is connected to the gate of FET 1215 which corresponds to gate G of FET 1165. Select node 1220 corresponds to select node 1170. Programmable NV NT select circuit 1200 operation corresponds to the operation of programmable NV NT select circuit 1150 described further above with respect to FIG. 11B.

Figure 12B:
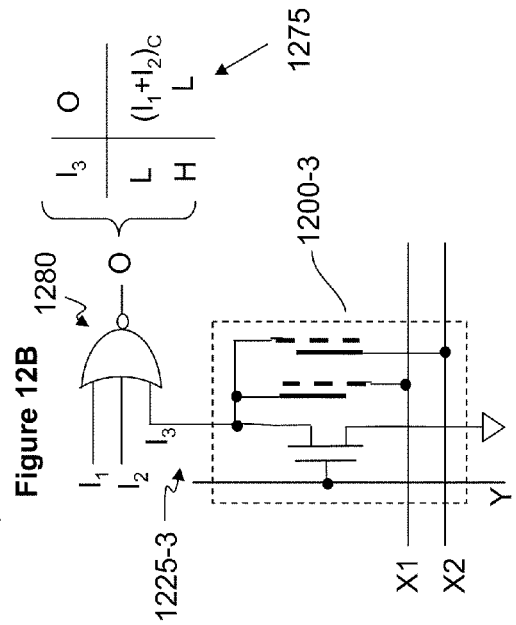
FIG. 12B shows the nonvolatile nanotube select circuit shown of FIG. 12A used to control the ON/OFF state of a transfer device.

FIG. 12B illustrates programmable NanoLogic™ circuit 1240 in which programmable NV NT select circuit 1200-1 with select node 1225-1 corresponds to programmable NV NT select circuit 1200, and controls the gate voltage of FET 1230 transfer device. The logic function of programmable NV NT select circuit 1200-1 is determined as described further above with respect to programmable NV NT select circuits 1200 and 1150 and retains the programmed logic function even if power is removed or is lost.

In operation, select node 1225-1 turns FET 1230 ON if it is at a high voltage such as 2.5 volts and turns FET 1230 OFF if is at a low voltage such as ground. When FET 1230 is ON, signal flow, voltage distribution, current distribution, and power distribution are enabled; and when FET 1230 is in an OFF state, then transmission of these functions is disabled. NanoLogic™ circuit 1240 may be used to control switches that route signals as illustrated further below with respect to FIGS. 13, 16, 17A, and 17B. Also, multiple NanoLogic™ circuits 1240 may be combined to generate larger nonvolatile nanotube logic blocks (circuits, functions, cells) as illustrated in FIG. 14, and corresponding FIG. 15 and FIG. 14B.

Figure 12C:
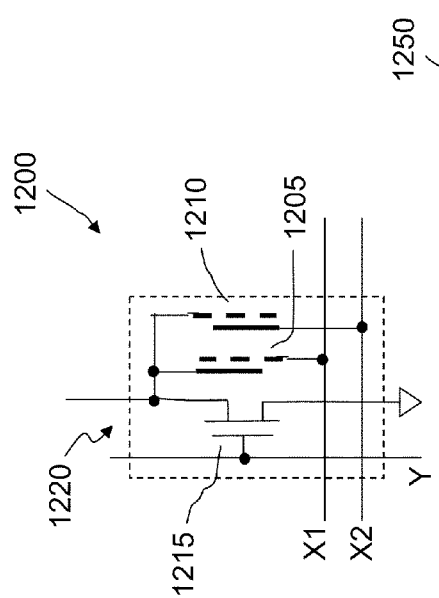
FIG. 12C shows the nonvolatile nanotube select circuit of FIG. 12A used as an input that controls a NAND logic circuit operation.

FIG. 12C illustrates programmable NanoLogic™ circuit 1250 in which programmable NV NT select circuit 1200-2 with select node 1225-2 corresponds to programmable NV NT select circuit 1200, and controls an input voltage of NAND gate 1260. The logic function of programmable NV NT select circuit 1200-2 is determined as described further above with respect to programmable NV NT select circuits 1200 and 1150 and retains the programmed logic function even if power is removed or is lost.

Figure 13:
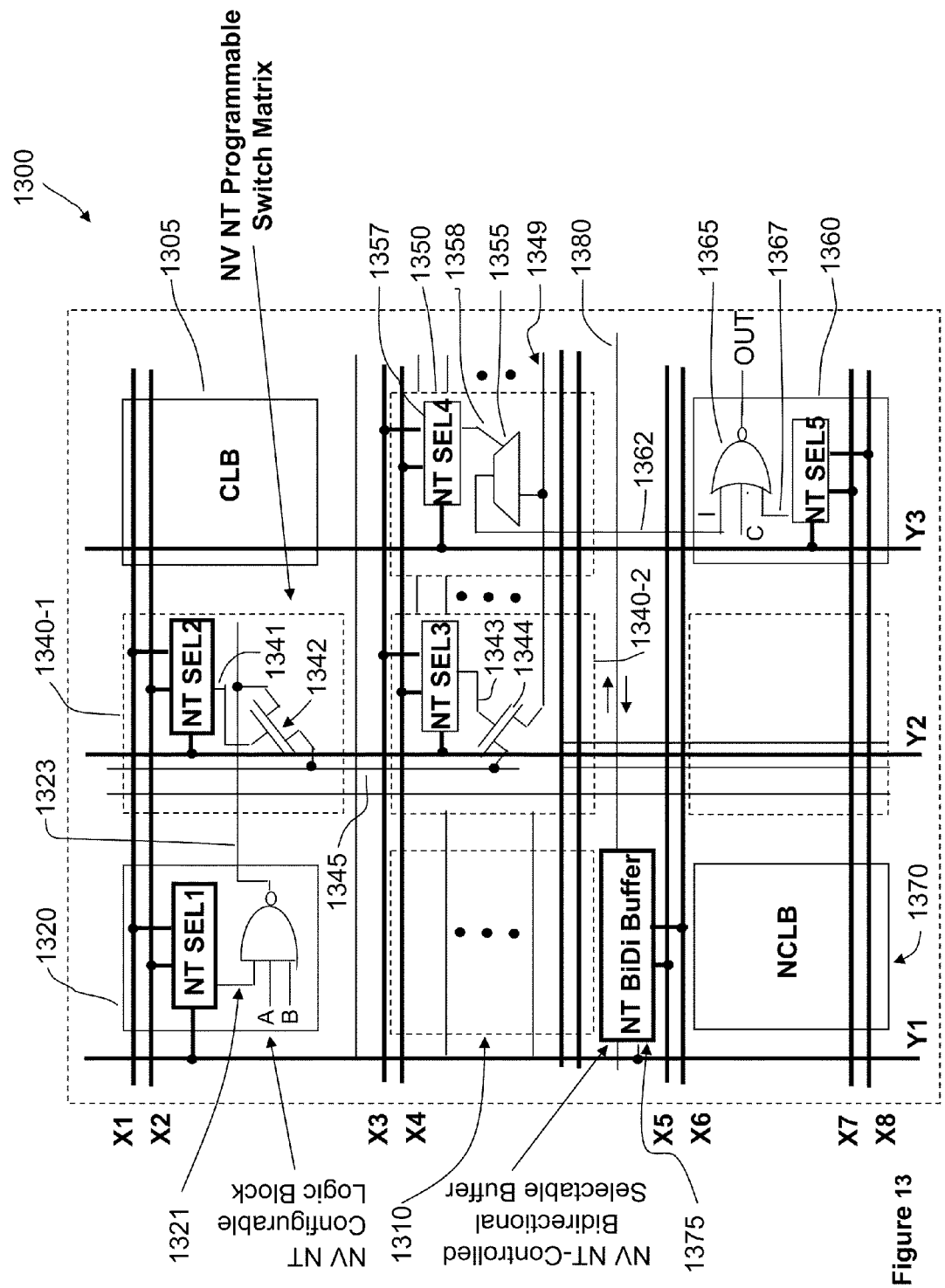
FIG. 13 shows a nonvolatile nanotube field programmable gate array (NFPGA) with configurable logic blocks and programmable switch matrices controlled by nonvolatile nanotube select circuits.
Figure 14A:
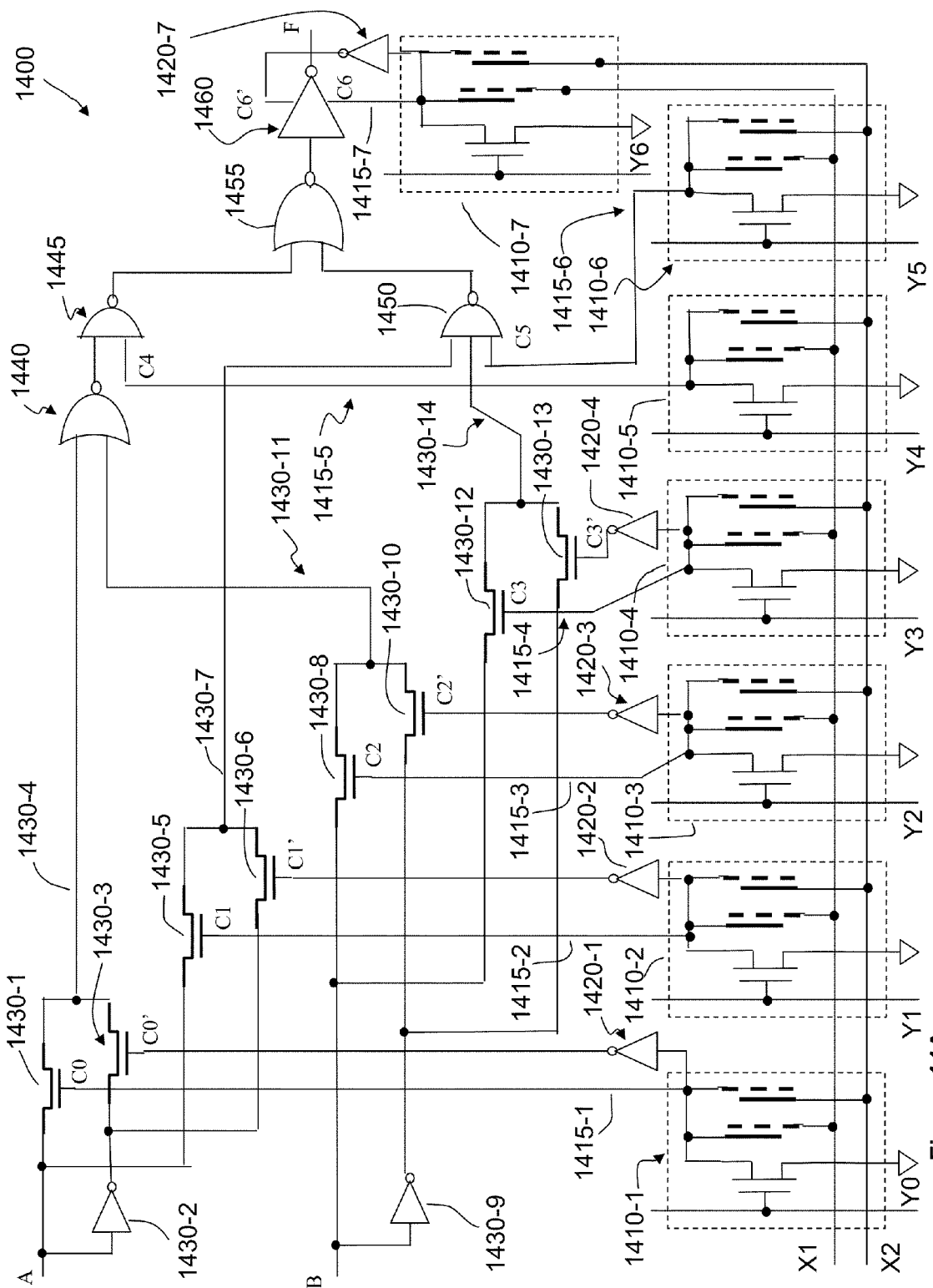
FIG. 14A shows a nonvolatile nanotube configurable logic block (NCLB) formed using transfer gates, NAND, NOR, and tristate circuits whose logic function is determined by logic states provided nonvolatile nanotube select circuits.

In operation, if select node 1225-2 is at a high voltage state H such as 2.5 volts then NAND gate 1260 operates as a two input NAND gate with inputs A and B and the complement of A·B (A·B)$_C$ as the output as illustrated in table 1265. However, when select node 1225-2 is at a low voltage state L such as zero volts, NAND gate 1260 output remains at a high voltage state H such as 2.5 volts independent of inputs A and B as illustrated in table 1265. Programmable NanoLogic™ circuit 1250 may be used as a NV NT configurable (programmable) logic block as illustrated in FIG. 13.

Figure 12D:
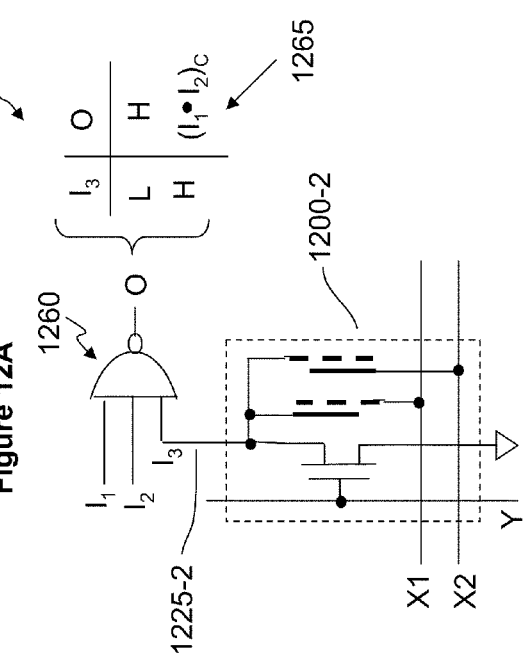
FIG. 12D shows the nonvolatile nanotube select circuit of FIG. 12A used as an input that controls a NOR logic function operation.

FIG. 12D illustrates programmable NanoLogic™ circuit 1270 in which programmable NV NT select circuit 1200-3 with select node 1225-3 corresponds to programmable NV NT select circuit 1200, and controls an input voltage of NOR gate 1280. The logic function of programmable NV NT select circuit 1200-3 is determined as described further above with respect to programmable NV NT select circuits 1200 and 1150 and retains the programmed logic function even if power is removed or is lost.

In operation, if select node 1225-3 is at a low voltage state L such as zero volts then NOR gate 1280 operates as a two input NOR gate with inputs A and B and the complement of the sum of A plus B (A+B)$_C$ as the output as illustrated in table 1275. However, when select node 1225-3 is at a high voltage such as 2.5 volts, NOR gate 1280 output remains at a low voltage state L such as zero volts independent of inputs A and B as illustrated in table 1275. Programmable NanoLogic™ circuit 1270 may be used in a NV NT configurable (programmable) logic block as illustrated in FIG. 13.

Nanotube Nonvolatile NFPGA Logic

FPGA architectures are dominated by interconnects. FPGAs are therefore much more flexible in terms of the range of designs that can be implemented and logic functions in the hundreds of thousands to millions and tens-of-millions of equivalent logic gates may be realized. In addition, the added flexibility enables inclusion of higher-level embedded function such adders, multipliers, CPUs, and memory. The added interconnect (routing) flexibility of FPGAs also enables partial reconfiguration such that one portion of an FPGA chip may be reprogrammed while other portions are running FPGAs that can be reprogrammed while running may enable reconfigurable computing (reconfigurable systems) that reconfigure chip architecture to better implement logic tasks.

Nonvolatile nanotube switches combined with basic building blocks of FPGAs such as configurable logic blocks (CLBs), programmable switch matrices (PSMs), bidirectional buffers (BiDi buffers) result denser, low power, and high performance nonvolatile nanotube building blocks such as NCLBs, NPSMs, N-BiDi buffers, and other functions that enable nonvolatile nanotube FPGA (NFPGA) logic operation.

Nonvolatile nanotube select circuits (NV NT select circuits) described in U.S. Patent Application No. 61/039,204, filed on Mar. 25, 2008, entitled "Carbon Nanotube-Based Neural Networks and Methods of Making and Using Same," are combined with CLB and PSM functions to form NCLB and NPSM building blocks that may be integrated to form NFPGA logic as described with respect to FIGS. 13-18 illustrated further below.

NFPGAs which include NCLB, NPSM, N-BiDi, nonvolatile nanotube programmable voltage generators and other logic and memory functions may reprogrammed in case of a security event to protect high application function security integrity as described further above. Thus, for example, configuration control bits supplied by NV NT select circuits or other NanoLogic™ circuits, NRAM™ memory arrays, or nonvolatile nanotube-based shift registers can be dynamically reprogrammed thereby altering the NFPGA logic function in response to a security event (threat).

Nanotube Configurable Logic Blocks (NCLB) & Nanotube Programmable Switch Matrix (NPSM) Using Nonvolatile Nanotube Select Circuits NFPGA Function and Operation Using Nonvolatile Nanotube Select Circuits FIG. 13 illustrates a block diagram of an embodiment of NFPGA 1300 formed using NanoLogic™ circuits that include nonvolatile nanotube (NV NT) select circuits (labeled NT SEL1-5) as part of nanotube configurable logic blocks (NCLBs) such as NCLB 1320 for example and nanotube programmable switch matrices (NPSMs) such as NPSM 1340-1. NFPGA 1300 also includes nanotube bidirectional buffers such as NT BiDi buffer 1375 that controls the direction of signal flow in global wire 1380. Flip flops and multiplexers (shown in FIG. 7) may be included as well. Multiple NV NT select circuits share select/program/operate row lines X1 . . . X8 and mode control lines Y1 . . . Y3.

The NFPGA 1300 logic function is configured by performing program or erase operations on NV NT select circuits, labeled NT SEL1-5 in FIG. 13, using rows of select/program/operate lines X1 . . . X8 and columns of mode control lines Y1 . . . Y3 as described further above with respect to NV NT select circuits 1150 and 1200. Multiple nanotube configurable logic blocks (NCLBs), nanotube programmable switch matrices (NPSMs), and NT BiDi Buffers such as NT BiDi Buffer 1375 are configured (programmed) and define the NFPGA 1300 logic function. Then, X1 . . . X8 voltages are set to a combination of high and low voltage values and Y1 . . . Y3 are set to a low voltage such as ground to enable NFPGA 1300 logic operation as described further above with respect to NV NT select circuit 1150 in FIG. 11B.

Figure 1:
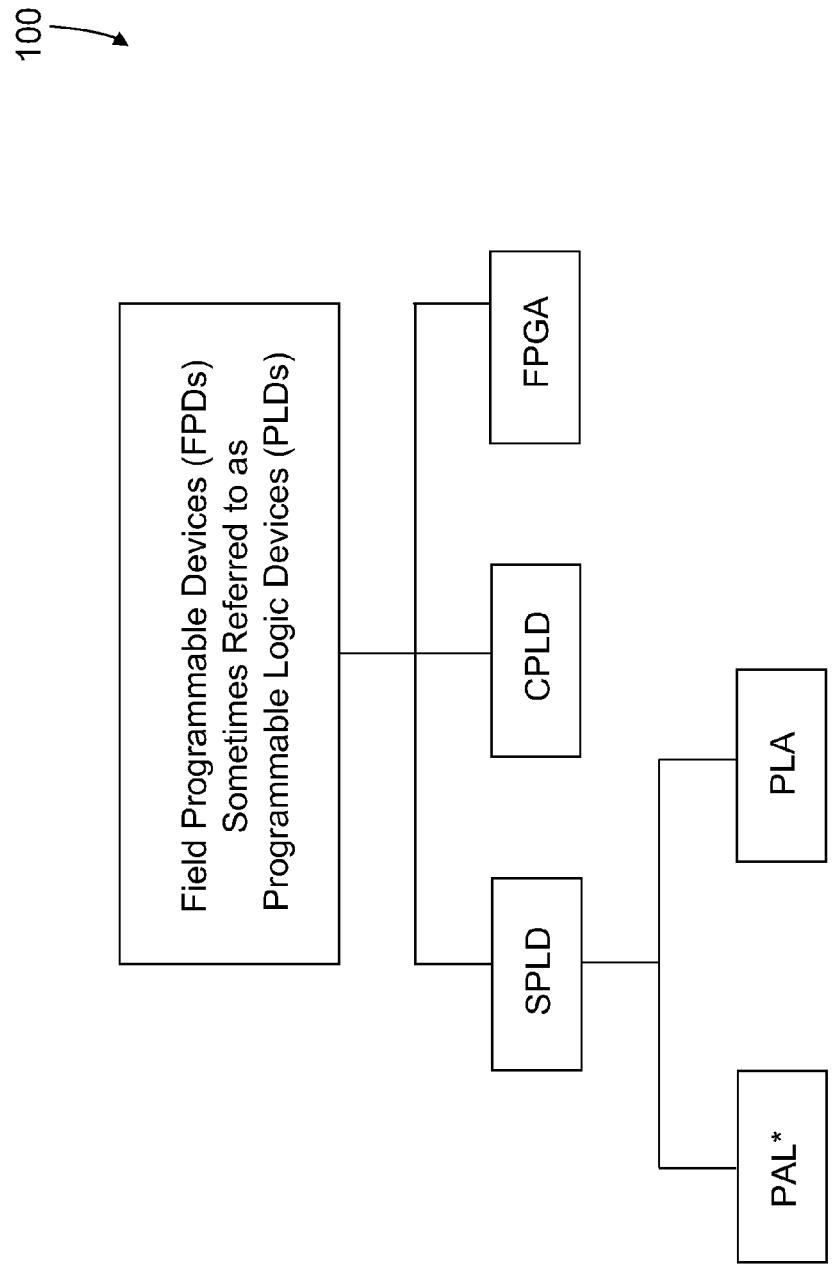
FIG. 1 is an overview of field programmable devices (FPDs), sometimes referred to as programmable logic devices (PLDs)
Figure 2:
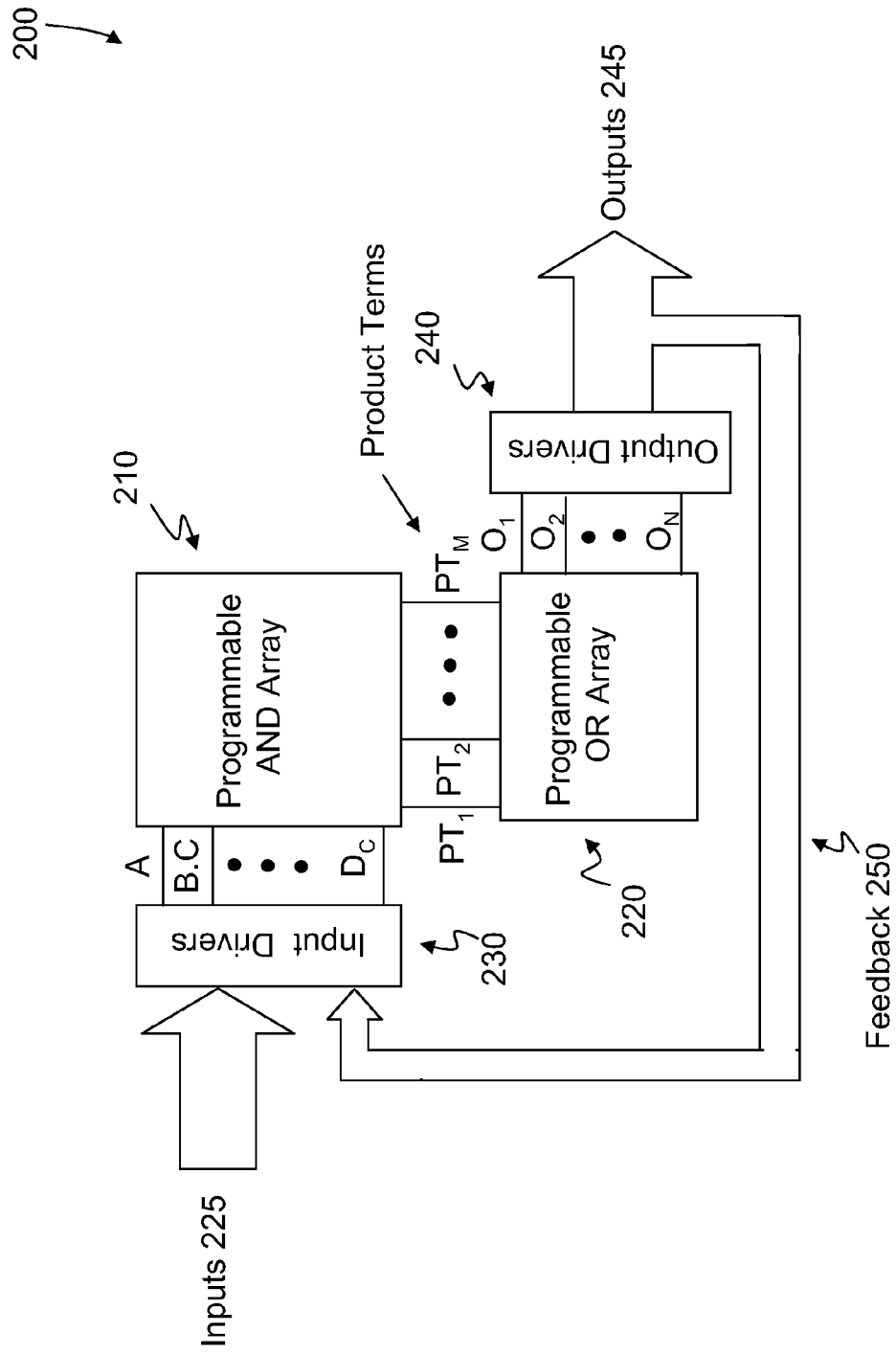
FIG. 2 is a block diagram of a programmable logic array (PLA)
Figure 3:
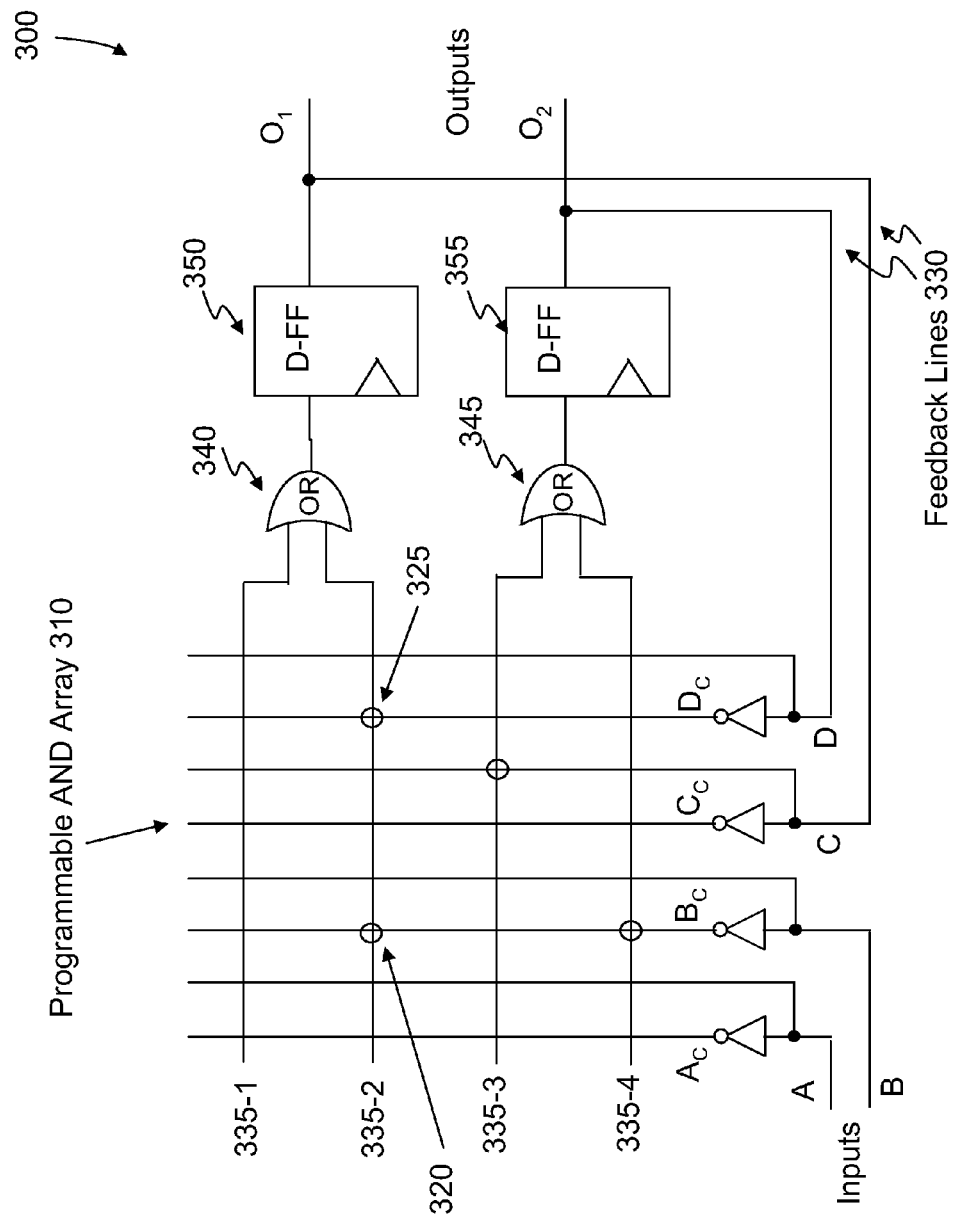
FIG. 3 is a schematic of a programmable array logic (PAL™) device. PAL™ is a trademark of AMD.
Figure 4:
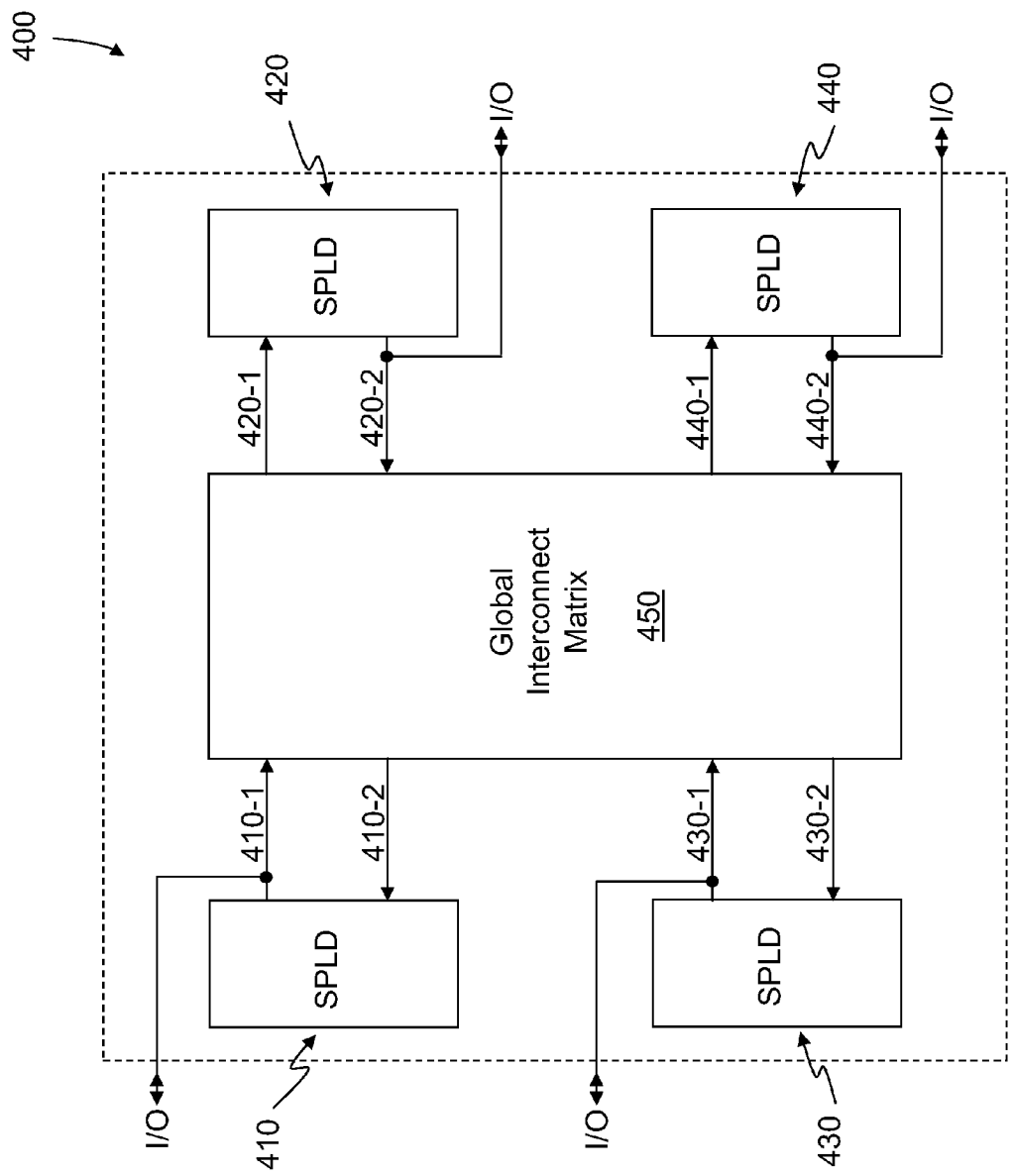
FIG. 4 is a block diagram of a complex programmable logic device.
Figure 5:
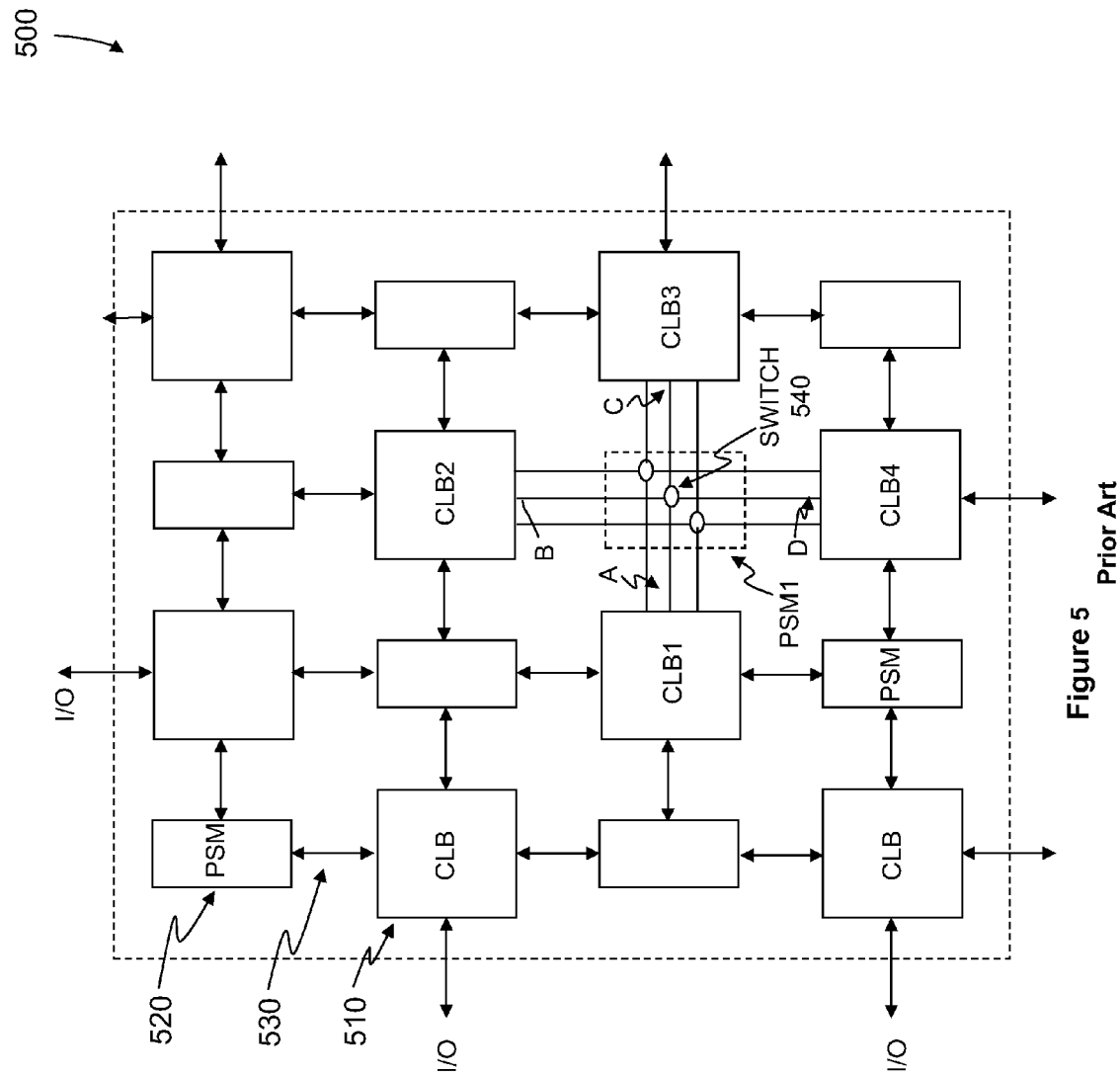
FIG. 5 is a block diagram of a field programmable gate array (FPGA) including a plurality of configurable logic blocks (CLBs)
Figure 6:
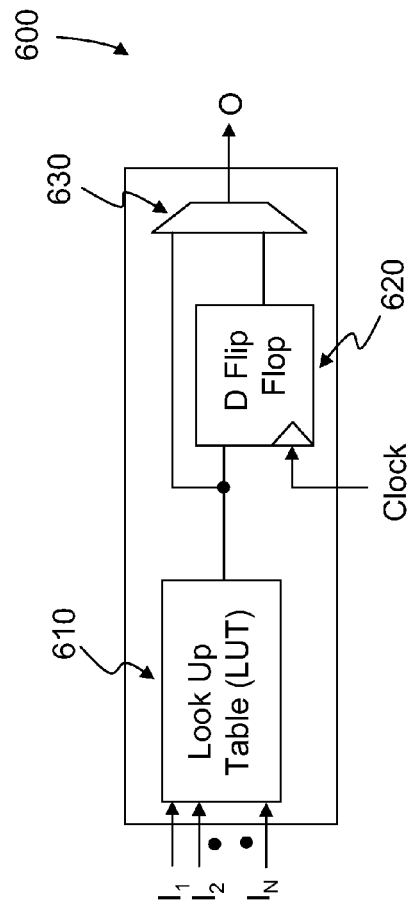
FIG. 6 is a block diagram of a configurable logic block (CLB) including a look-up table (LUT), a D-flip flop, and a multiplexer.

NCLB 1320 corresponds to NanoLogic™ circuit 1250 illustrated in FIG. 12C and flip flops and multiplexers (not shown) as needed such as illustrated in FIG. 7; NPSM 1340-1 corresponds to NanoLogic™ circuit 1240 illustrated in FIG. 12B; NPSM 1340-2 also corresponds to NanoLogic™ circuit 1240; NCLB 1360 corresponds to NanoLogic™ circuit 1270 illustrated in FIG. 12D and flip flop and multiplexers (not shown) as needed such as illustrated in FIG. 7; NCLB 1350 includes NT SEL4 also referred to as NV NT select circuit 1357 that corresponds to NV NT select circuit 1200 which controls the operation of multiplexer 1355 and may include flip flops and other multiplexers (not shown) as illustrated in FIG. 7. CLB functions such as 1305 and 1370 may include configurable logic functions such as illustrated in FIGS. 6 and 7 and may or may not include NanoLogic™ functions. Wiring region 1310 shows horizontal wires that may be used for various interconnections (not shown). NT BiDi Buffer 1375 controls the direction of signal flow on wire 1380 as explained further below with respect to FIG. 17.

In logic configuration operations, NV SEL1 . . . NV SEL5 share control and mode select lines X1 . . . X8 and Y1 . . . Y3, respectively. In performing erase and programming operations, it is important not to disturb other NV NT select circuits sharing the same control and mode select lines. One method of implementing a configuration-setting operation is to first erase all pairs of NV NT switches to a high resistance (OFF) state such illustrated by NV NT switch 1010' in FIG. 10C which corresponds to NV NT switches 1155 and 1160 illustrated in FIG. 11B and NV NT switches corresponding to NV NT switches 1205 and 1210 illustrated in FIG. 12A, along pairs of row lines such as X1 and X2. Then, program selected individual NV NT switches to a low resistance (programmed) state, leaving unselected NV NT switches in a high resistance (erased) state as described further below. Another method of implementing a configuration-setting operation is to first program all pairs of NV NT switches to a low resistance (ON) state such as illustrated by NV NT switch 1010 in FIG. 10B which corresponds to NV NT switches 1155 and 1160 illustrated in FIG. 11B and NV NT switches corresponding to NV NT switches 1205 and 1210 illustrated in FIG. 12A, along pairs of row lines such as X1 and X2. Then, program selected individual NV NT switches to a high resistance (erased) state, leaving unselected NV NT switches in a low resistance (erased) state as described further below. Still another method of implementing a configuration-setting operation is to selectively modify those NV NT switches that need to be changed from a low resistance (ON) state to a high resistance (OFF) state or from a high resistance (OFF) state to a low resistance (ON) state. In the operation descriptions that follow, the configuration-setting operation examples are based on erasing all NV NT switches to a high resistance (OFF) state and then selectively programming selected NV NT switches to a low resistance (ON) state.

In this configurable logic configuration-setting operation example, NCLB 1320 NT SEL1 circuit is programmed such that select node 1321 is at a high voltage enabling logic function $(A \cdot B)_C$ output to wire 1323 and NPSM 1340-1 NT SEL2 circuit is programmed such that select node 1341 is at a high voltage which turns FET 1342 to an ON state so that the wire 1323 signal is transmitted to wire 1345.

In an erase operation (low-to-high resistance state transition), X1, X2, X3-X8 control lines are set to zero volts and mode select lines Y1, Y2, and Y3 are set to a high voltage such as 2.5 volts to connect all select nodes, including select nodes 1321 and 1341 to ground. Next, control lines X1 and X2 may be activated using one or more erase pulses $V_E$ such that corresponding NV NT switches in NT SEL1 and NT SEL2 are in a high resistance state. Note that it is also possible to do a block erase of all NT SEL circuits. Erase pulses $V_E$ are typically in the 5 to 7 volt range with relatively fast rise time in nanosecond range.

Next, a programming operation (high-to-low resistance state transition) is performed on NT SEL1 circuit at the intersection of X1, X2, and Y1. In this example, NT SEL 1 select node 1321 is to be in a high voltage state during NFPGA 1300 logic operation. NT SEL1 operation corresponds to NV NT select circuit 1200 operation and corresponding NV NT switch 1205 and 1210 states are set based on NFPGA 1300 operational requirements. Therefore, NV NT switch 1205 (FIG. 12A) is programmed to a low resistance state and NV NT switch 1210 is left in a high resistance state. However, if select node 1321 were to have a low voltage state during logic operation then NV NT switch 1205 would be left in a high resistance state and NV NT switch 1210 would be programmed to a low resistance state.

In a programming operation for NT SEL1, mode line Y1 is set at a high voltage such as 2.5 volts such that select node 1321 is grounded by an FET corresponding to FET 1215 (FIG. 12A) prior to applying programming pulses $V_P$. Mode lines Y2 and Y3 are set at ground so that select nodes such as select node 1341 are not held at ground by mode control FETs such as FET 1215. Next, control line X2 is held at $V_P/2$ and control line X1 is pulsed with programming pulses $V_P$ which are typically in the 3 to 5 volts range with rise times in microsecond range and the NV NT switch corresponding to NV NT switch 1205 is programmed from a high to low resistance state (from 1 G Ohm to 100 k Ohm for example). Control line X2 is held at $V_P/2$ so that the NV NT switch in NT SEL1 corresponding to NV NT switch 1210 is not disturbed since only $V_P/2$ appears across it and remains in a high resistance state such as 1 G Ohm for example, and also so that NV NT switches in adjacent NT SEL2 circuit corresponding to NV NT switches NV NT 1205 and 1210 are not disturbed and remain in a high resistance state. NT SEL2 NV NT switches corresponding to NV NT switches 1205 and 1210 are not disturbed because the difference between voltages on control lines X1 and X2 is applied to the series combination of two NV NT switches; that is $V_P-V_P/2=V_P/2$ appears across two NV NT switches in series corresponding to NV NT switches 1205 and 1210 because the mode control FET corresponding to FET 1215 is OFF. Actually, a voltage of $V_P/2$ applied to a single NV NT switch is also insufficient to cause switching. Unselected control line pairs, such as X3-X4; X5-X6, and X7-X8, are held at ground.

Next, in a programming operation for NT SEL2, mode line Y2 is set at a high voltage such as 2.5 volts such that select node 1341 is grounded by an FET corresponding to FET 1215 (FIG. 12A) prior to applying programming pulses $V_P$. Mode lines Y1 and Y3 are set at ground so that select nodes such as select node 1321 are not held at ground by mode control FETs such as FET 1215. Next, control line X2 is held at $V_P/2$ and control line X1 is pulsed with programming pulses $V_P$ which are typically in the 3 to 5 volts range with rise times in microsecond range and the NV NT switch corresponding to NV NT switch 1205 is programmed from a high to low resistance state (from 1 G Ohm to 100 k Ohm for example). Control line X2 is held at $V_P/2$ so that the NV NT switch in NT SEL2 corresponding to NV NT switch 1210 is not disturbed since only $V_P/2$ appears across it and remains in a high resistance state such as 1 G Ohm for example, and also so that NV NT switches in adjacent NT SEL1 circuit corresponding to NV NT switches NV NT 1205 and 1210 are not disturbed and remain in a high resistance state. NT SEL1 NV NT switches corresponding to NV NT switches 1205 and 1210 are not disturbed because the difference between voltages on control lines X1 and X2 is applied to the series combination of two NV NT switches; that is $V_P-V_P/2=V_P/2$ appears across two NV NT switches in series corresponding to NV NT switches 1205 and 1210 because the mode control FET corresponding to FET 1215 is OFF. Actually, a voltage of $V_P/2$ applied to a single NV NT switch is also insufficient to cause switching. Unselected control line pairs are held at ground.

Erase and program operations for NT SEL3 and NT SEL4 circuits correspond to those described with respect to NT SEL 1 and SEL2 circuits except that X3 and X4 control lines are used instead of X1 and X2 control lines. Unselected control line pairs are held at ground.

NCLB 1360 corresponds to NanoLogic™ circuit 1250 illustrated in FIG. 12D and flip flops and multiplexers (not shown) such as illustrated in FIG. 7. An erase operation for NanoLogic™ circuit 1360 NT SEL5 circuit is similar to the erase operations described above with respect to NT SEL1 and NT SEL2. However, in this example, select node 1367 output voltage is selected to be zero so that NOR gate 1365 transmits $(C+I)_C$ to output OUT of NCLB 1360 so the programming operation is different.

In a programming operation for NT SEL5, mode line Y3 is set at a high voltage such as 2.5 volts such that select node 1367 is grounded by an FET corresponding to FET 1215 (FIG. 12A) prior to applying programming pulses $V_P$. Mode lines Y1 and Y2 are set at ground so that other select nodes (not shown) are not held at ground by mode control FETs such as FET 1215. Next, control line X7 is held at $V_P/2$ and control line X8 is pulsed with programming pulses $V_P$ which are typically in the 3 to 5 volts range with rise times in microsecond range and the NV NT switch corresponding to NV NT switch 1205 is programmed from a high to low resistance state (from 1 G Ohm to 100 k Ohm for example). Control line X7 is held at $V_P/2$ so that the NV NT switch in NT SEL1 corresponding to NV NT switch 1210 is not disturbed since only $V_P/2$ appears across it and remains in a high resistance state such as 1 G Ohm for example, and also so that NV NT switches in adjacent NT SEL circuit (not shown) are not disturbed and remain in a high resistance state. NV NT switches (not shown) are not disturbed because the difference between voltages on control lines X7 and X8 is applied to the series combination of two NV NT switches of any NV SEL circuits that share control lines X7 and X8; that is $V_P-V_P/2=V_P/2$ appears across two NV NT switches in series because the mode control FET corresponding to FET 1215 is OFF. Actually, a voltage of $V_P/2$ applied to a single NV NT switch is also insufficient to cause switching. Unselected control line pairs are held at ground.

The programmed NFPGA 1300 logic function is stored in a nonvolatile state even with no voltage applied to the chip. Voltage may be applied to the entire chip or routed only to portions of the chip required for logic operation in order to reduce overall chip power dissipation. In the NFPGA 1300 logic operating mode, a low voltage such as ground is applied to control lines Y1, Y2, and Y3 and a high voltage such as an on-chip voltage of 2.5 volts is applied to control lines X1, X3, X5, and X7 and ground to control lines X2, X4, X6, and X8

(corresponding controller logic is not shown). Referring to NV NT select circuit 1200 in FIG. 12A, FET 1215 is OFF. If NV NT switch 1205 is programmed to a low resistance state and NV NT switch 1210 is programmed to a high resistance state, then select node 1220 will be at a high voltage state of 2.5 volts when 2.5 volts is applied to X1 and ground is applied to X2. However, if NV NT switch 1205 is in a high resistance state and NV NT switch 1210 is in a low resistance state, then when 2.5 volts is applied to X1 and ground is applied to X2, select node 1220 will be at ground.

NV SEL1-5 circuits shown in NFPGA 1300 correspond to NV NT select circuit 1200 illustrated in FIG. 12A. Programming these switches as described further above with respect to NV NT select circuit 1200 results in select nodes 1321, 1341, 1343, and 1358 at high voltage such as 2.5 volts and select node 1367 at ground. In a logic operation, if A and B inputs are applied to inputs of NCLB 1320, $(A \cdot B)_C$ appears on wire 1323 and since both FET 1342 and 1344 are in an ON state, then $(A \cdot B)_C$ is propagated to wire 1345 and then wire 1349; wire 1349 is connected to the input to multiplexer 1355 which is activated because NT SEL4 NV NT select circuit 1357 has output 1358 at a high voltage of 2.5 volts. Therefore, $(A \cdot B)_C$ propagates along wire 1362 to NOR gate 1365 input I. Because select node 1367 voltage is ground, NOR gate 1365 propagates $((A \cdot B)_C + C)_C$ to NCLB 1360 output node OUT. The subscript $_C$ is used to indicate the complement of a logic term or function.

NCLB Function and Operation Using Nonvolatile Nanotube Select Circuits

NFPGA 1300 illustrated in FIG. 13 illustrates nonvolatile configurable logic blocks and nonvolatile programmable switch matrices using relatively simple examples based on NV NT select circuits and NanoLogic™ functions illustrated in FIG. 12. Nonvolatile configurable logic block (NCLB) 1400 illustrates an embodiment of a larger nanotube-based logic function corresponding to combinatorial logic function 710 illustrated in FIG. 7 except that flip flop function and multiplexer are not shown in this example. NCLB 1400 is a configurable (programmable) two input (inputs A and B) one output (output F) logic function formed using a cascade of FET transfer devices and other logic functions such as NAND, NOR, and a tristate output. The ON or OFF state of each transfer gate and logic operation of some NAND and NOR circuits and the state (tristate or nontristate) of the tristate output driver is controlled by a configuration control logic state (or may be referred to as a configuration control bit) supplied by NV NT select circuit nodes. NV NT select circuits 1410-1, 1410-2, ..., 1410-7 corresponding to NV NT select circuit 1150 shown in FIG. 11B and NV NT select circuit 1200 shown in FIG. 12A are used to provide nonvolatile configuration control logic states. The select node logic state of each NV NT select circuit is programmed using X1 and X2 control lines and Y0 to Y6 mode lines as described with respect to FIG. 13. Each select node also includes an inverter where needed so that both true and complement configuration control values are provided for select node outputs. Select node logic states are nonvolatile and remain unchanged even if power is lost or removed from the circuit.

NCLB 1400 includes input A to one terminal of FET 1430-1 and input $A_C$ formed by inverter 1430-2 and applied to one terminal of FET 1430-3, with the second terminal of each of FETs 1430-1 and 1430-3 dotted and connected to wire 1430-4 which drives one input of two input NOR gate 1440. Inputs A and $A_C$ are also connected to one terminal of FET 1430-5 and one terminal of FET 1430-6, respectively, with the second terminal of each of FETs 1430-5 and 1430-6 dotted and connected to wire 1430-7 which is connected to one input of three input NAND gate 1450. NV NT select circuit 1410-1 provides configuration control logic state C0 on select node 1415-1 output to the gate of FET 1430-1 and $C0_C$ formed by inverter 1420-1 to the gate of FET 1430-3. NV NT select circuit 1410-2 provides configuration control logic state C1 on select node 1415-2 output to the gate of FET 1430-5 and $C1_C$ formed by inverter 1420-2 to the gate of FET 1430-6.

NCLB 1400 also includes input B to one terminal of FET 1430-8 and input $B_C$ formed by inverter 1430-9 and applied to one terminal of FET 1430-10, with the second terminal of each of FETs 1430-8 and 1430-10 dotted and connected to wire 1430-11 which drives the second input of two input NOR gate 1440. Inputs B and $B_C$ are also connected to one terminal of FET 1430-12 and one terminal of FET 1430-13, respectively, with the second terminal of each of FETs 1430-12 and 1430-13 dotted and connected to wire 1430-14 which is connected to a second input of three input NAND gate 1450. NV NT select circuit 1410-3 provides configuration control logic state C2 on select node 1415-3 output to the gate of FET 1430-8 and $C2_C$ formed by inverter 1420-3 to the gate of FET 1430-10. NV NT select circuit 1410-4 provides configuration control logic state C3 on select node 1415-4 output to the gate of FET 1430-12 and $C3_C$ formed by inverter 1420-4 to the gate of FET 1430-13.

NCLB 1400 also includes NV NT select circuit 1410-5 with select node 1415-5 providing output C4 to one input of two input NAND gate 1445. The second input to NAND gate 1445 is supplied by the output of NOR gate 1440. NV NT select circuit 1410-6 with select node 1415-6 provides output C5 to the third input of three input NAND gate 1450. The outputs of two input NAND 1445 and three input NAND 1450 drive the two inputs of NOR gate 1455. The output of two input NOR gate 1455 drives the input of tristate inverter 1460. The state of tristate inverter F is controlled by C6 and C6' which are provided by NV NT select circuit 1410-7. Select node 1415-7 provides C6 and inverter 1420-7 provides $C6_C$.

Figure 15:
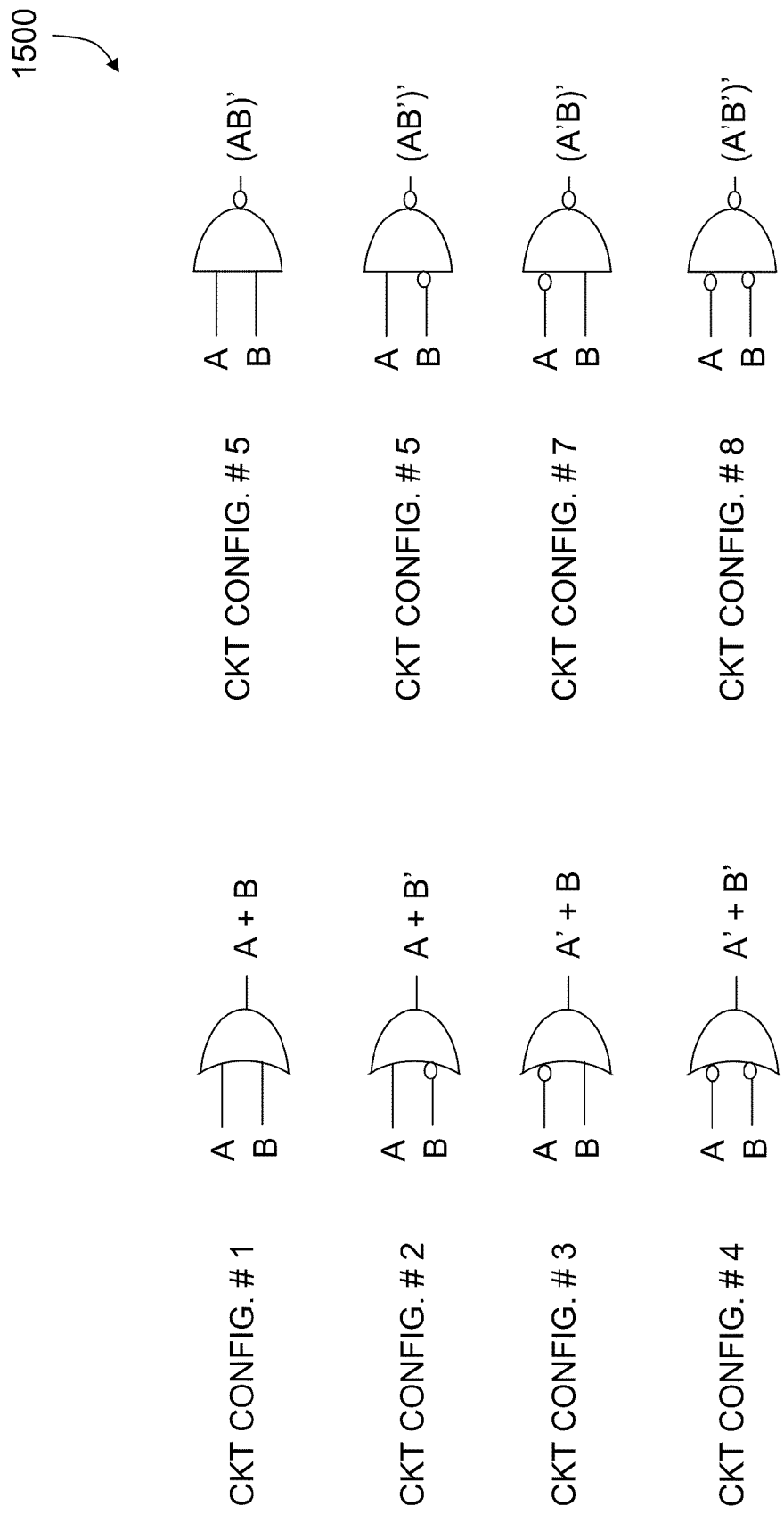
FIG. 15 shows various equivalent logic circuits corresponding to the various logic configurations formed by the nonvolatile nanotube configuration logic block as shown in FIG. 14B.

FIG. 14B illustrates eight nonvolatile circuit configurations (CKT CONFIG. #s 1-8) and the corresponding values of C0, $C0_C$, ..., C5 used to generate CKT CONFIG. #s 1-8 for NCLB 1400. FIG. 14B gives an output F function based on inputs A and B and the configuration control logic states. Output F outputs logic values if the C6 state is a logic 1 and $C6_C$ is a logic 0. However, if the C6 state is a logic 0 state and $C6_C$ is a logic 1, then output F remains tristate with no defined value. FIG. 15 illustrates equivalent circuits 1500 corresponding to CKT CONFIG. 1-8.

NPSM Function and Operation Using Nonvolatile Nanotube Select Circuits

NFPGA 1300 illustrated in FIG. 13 illustrates configurable logic blocks and programmable switch matrices using relatively simple examples based on NV NT select circuits and NanoLogic™ functions illustrated in FIG. 12. Nonvolatile programmable switch matrix (NPSM) 1600 illustrates an embodiment of a larger nanotube-based routing function corresponding to NPSM 1340-1 and NPSM 1340-2 in FIG. 13. NPSM 1600 is a programmable switch matrix 1610 with FET transfer gates controlled by select node outputs from NV NT select circuits 1620-1, 1620-2, ..., 1620-6. PSM 1610 is formed by six FET devices to route signals, voltages, currents, or power between any combination of terminals A, B, C, and D. NV NT select circuits 1620-1, 1620-2, ..., 1620-6 with corresponding select nodes 1630-1, 1630-2, ..., 1630-6 provide corresponding configuration control logic states C1, C2, ..., C6 to control the OFF or ON state of each FET in PSM 1610 by providing high voltages such as 2.5 volts for an ON state and a low voltage such as ground for an OFF state.

PSM 1610 includes FET TS1 with terminals connected to terminals C and D and gate controlled by configuration control logic state C1; FET TS2 with terminals connected to terminals A and D and gate controlled by configuration control logic state C2; FET TS3 with terminals connected to terminals A and C and gate controlled by configuration control logic state C3; FET TS4 with terminals connected to terminals B and D and gate controlled by configuration control logic state C4; FET TS5 with terminals connected to terminals A and B and gate controlled by configuration control logic state C5; and FET TS6 with terminals connected to terminals B and C and gate controlled by configuration control logic state C6.

Figure 16:
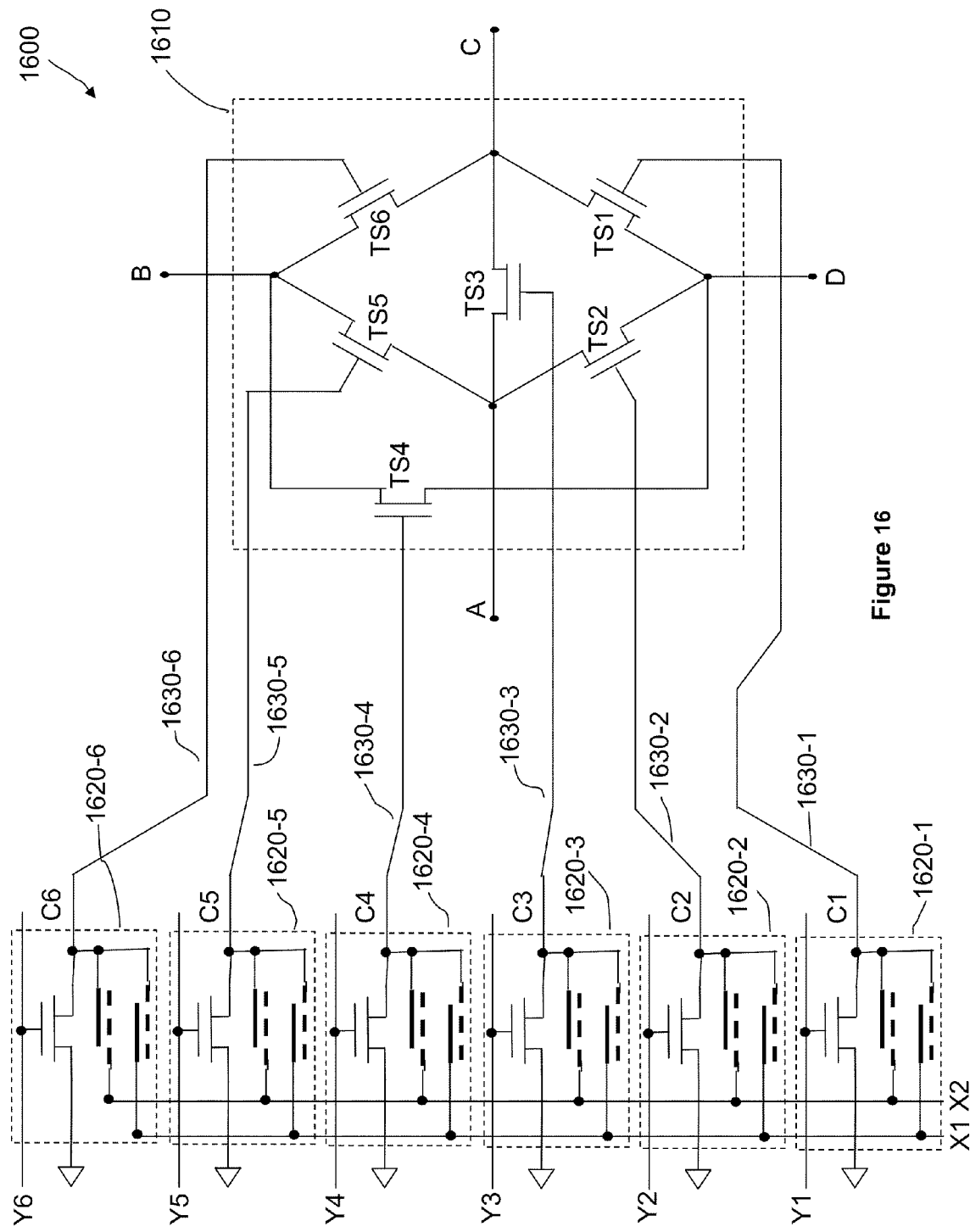
FIG. 16 shows a nonvolatile nanotube programmable switch matrix with various signal routing configurations controlled by nonvolatile nanotube select circuits.

In operation, the nonvolatile state of select nodes 1630-1 (C1), 1620-2 (C2), . . . , 1620-6 (C6) are programmed using control lines X1 and X2 and mode lines Y1-Y6 illustrated in FIG. 16. Programming methods correspond to those described further above with respect to FIG. 13. After programming, configuration control logic states C1-C6 at either high voltage such as 2.5 volts or low voltage such as ground are applied to the gates of the FETs in PSM 1610 and signal routing is established.

Configuration control logic states programmed in NPSM 1600 may be used to form various routings between terminals A, B, C, and D. Exemplary interconnections achievable with NPSM 1600 are listed in Table 2 below.

TABLE 2

| Number of FETs in ON State | Possible Terminal Combinations | Comments |
| --- | --- | --- |
| One | AB, AC, AD, BC, BD, CD | Independent paths |
| Two | AB & CD, AD & BC, AC & BD | Independent paths |
| Three | ABC, ABD, ACD, BCD | Shared paths |
| Four | ABCD | Shared paths |

Nanotube programmable switch matrix NPSM 1600 may be used to route signals, voltages, currents, and power as described further above with respect to FIG. 16. Individual FETs included in NPSM 1600 such transfer gate FETs TS1-TS6 enable or disable pathways between terminals such as terminals A, B, C, and D. However, transfer gates enable signal, voltage, current, and power flow in both directions, that is between source and drain or between drain and source of FET transfer devices. In some applications, it is desirable to control signal propagation direction, for example, and bidirectional buffers may be used. Bidirectional buffers may be used in conjunction with NPSMs. The direction of signal propagation may be controlled using a control circuit. If a nonvolatile control circuit is used, then a signal flow direction may be set for a particular direction which remains in effect even if power is removed. The signal flow direction remains the same when power is restored. Signal flow direction may be reversed by changing the state of the nonvolatile control circuit. NPGA 1300 illustrated in FIG. 13 nanotube-based bidirectional buffers such as NT BiDi Buffer 1375 control the direction of voltage propagation (and current flow) on wires such as wire 1380. Voltage waveforms propagate left to right or right to left depending on the nonvolatile state of NT BiDi Buffer 1375 as illustrated further below with respect to FIG. 17.

Figure 17A:
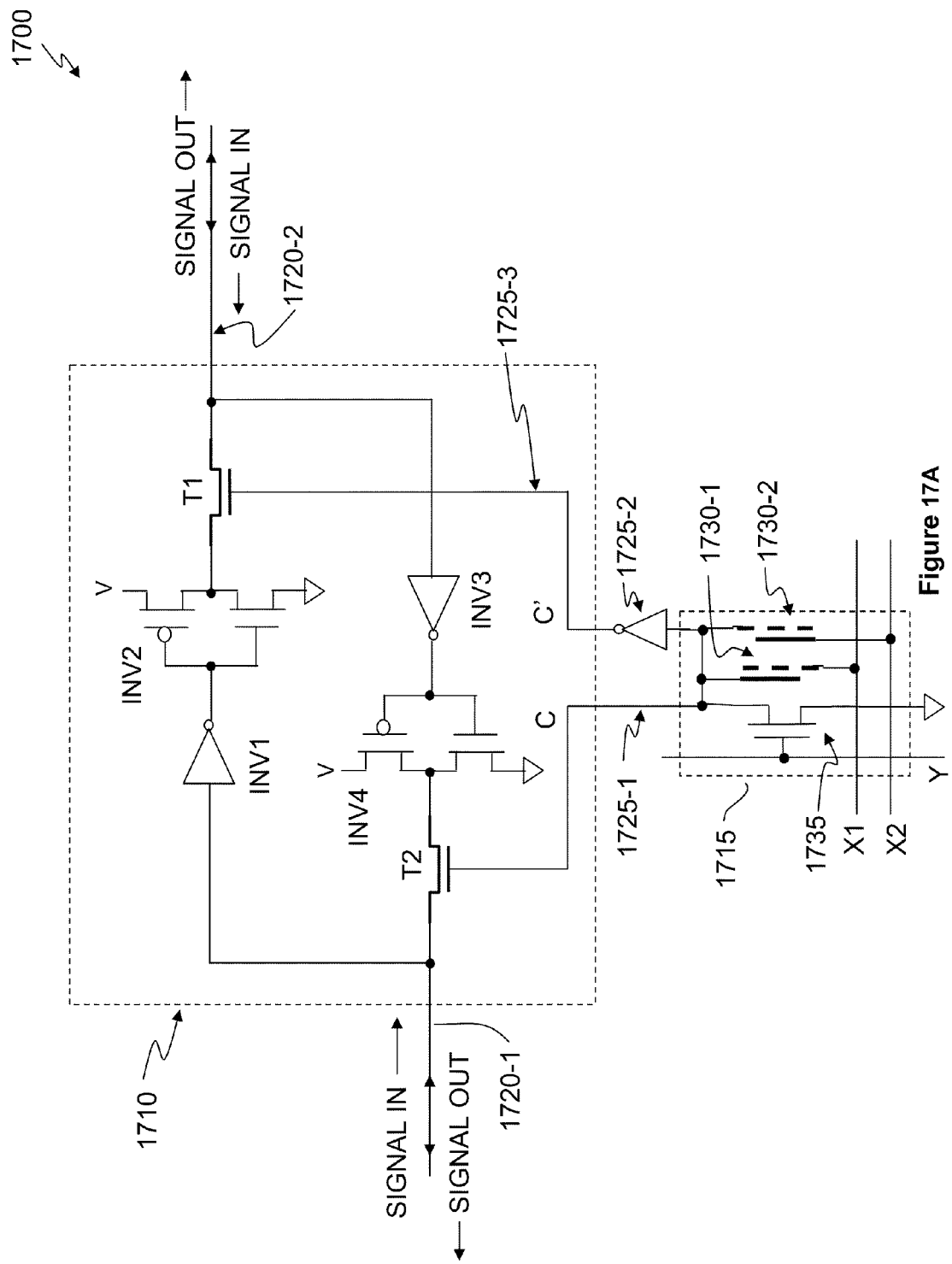
FIG. 17A shows a nonvolatile nanotube bidirectional buffer in which the direction of signal flow is controlled by a nonvolatile nanotube select circuit.

NT Bidirectional Buffer Function and Operation Using Nonvolatile Nanotube Select Circuits FIG. 17A illustrates an embodiment of a nanotube-controlled bidirectional buffer circuit NT BiDi Buffer 1700 which corresponds to NT BiDi Buffer 1375 shown in FIG. 13.

The direction of signal flow in bidirectional buffer circuit BiDi Buffer 1710 is controlled by true and complement configuration control logic states C and C' provided by NV NT select circuit 1715. If C is at ground and C' is at a positive voltage such as 2.5 volts for example, then signal-in on wire 1720-1 and signal-out on wire 1720-2 is enabled. However, if C is at a positive and C' is ground, then signal-in on wire 1720-2 and signal-out on 1720-1 is enabled. Signals traveling relatively long distances on global wires may experience waveform deterioration in rise and fall time and also amplitude. Waveforms of signals flowing between wire 1720-1 and 1720-2 or between wire 1720-2 and wire 1720-1 are restored by inverters INV1 and INV2 or by inverters INV3 and INV4, respectively.

BiDi Buffer 1710 includes inverter INV1 with input connected to wire 1720-1 and to a first terminal of FET T2. The output of INV1 drives the input of inverter INV2. The output of INV2 is connected to a first terminal of FET T1 whose gate is controlled by configuration control logic state C' supplied by select node 1725-3 of NV NT select circuit 1715 through inverter 1725-2. A remaining second terminal of FET T1 is connected to wire 1720-2 and also to the input of inverter INV3. The output of INV3 drives the input of inverter INV4 whose output drives a second terminal of FET T2. The gate of FET T2 is controlled configuration control logic state C supplied by select node 1725-1 of NV NT select circuit 1715. The first terminal of FET T2 is connected to wire 1720-1 and to the input of INV1 as described further above.

NV NT select circuit 1715 may be used to control the direction of signal flow in BiDi Buffer 1710. NV NT select circuit 1715 corresponds to NV NT select circuit 1150 shown in FIG. 11B and may be programmed and operated as described with respect to FIG. 11B. NV NT select circuit 1715 also corresponds to NV NT select circuit 1200 shown in FIG. 12A and also to the operation of NT SEL1 circuit as part of in NCLB 1320 shown in FIG. 13. Mode control Y may be set to programming mode or to an operating mode as described further above with respect to FIGS. 11B, 12, and 13 and X1 and X2 may be used to program the nonvolatile resistance states of the NV NT switches. In the operating mode, X1 is set to a high voltage such as 2.5 volts for example and X2 is set to ground. Configuration control logic state C may be at a high voltage such as 2.5 volts and configuration control logic state C' (complement of C) may be at ground (zero volts). Alternatively, configuration control logic state C may be at a low voltage such as ground and configuration control logic state C' (complement of C) may be at a high voltage such as 2.5 volts.

In operation, NT BiDi Buffer 1700 enables signal flow from wire 1720-1 to wire 1720-2 or from wire 1720-2 to wire 1720-1. If C is at ground and C' is at a positive voltage such as 2.5 volts for example, then FET T2 is in an OFF state and FET T1 is in an ON state. A signal arriving on wire 1720-1 propagates through INV1 and INV2 and FET T1 to wire 1720-2. However, a signal arriving on wire 1720-2 can only flow through T1 to the output node of INV2 and is blocked. Similarly, the signal can propagate through INV3 and INV4 but is blocked by FET T2 in an OFF state. Alternatively, if C is at a positive voltage such as 2.5 volts and C' is at ground for example, then FET T1 is in an OFF state and FET T2 is in an ON state. A signal arriving on wire 1720-2 propagates through INV3 and INV4 and FET T2 to wire 1720-1. However, a signal arriving on wire 1720-1 can only flow through T2 to the output node of INV4 and is blocked. Similarly, the signal can propagate through INV1 and INV2 but is blocked by FET T1 in an OFF state. A description of NT-BiDi Buffers similar to NT-BiDi Buffer 1700 may be found in U.S. patent Application No. 61/039,204, filed on Mar. 25, 2008, entitled "Carbon Nanotube-Based Neural Networks and Methods of Making and Using Same."

Figure 17B:
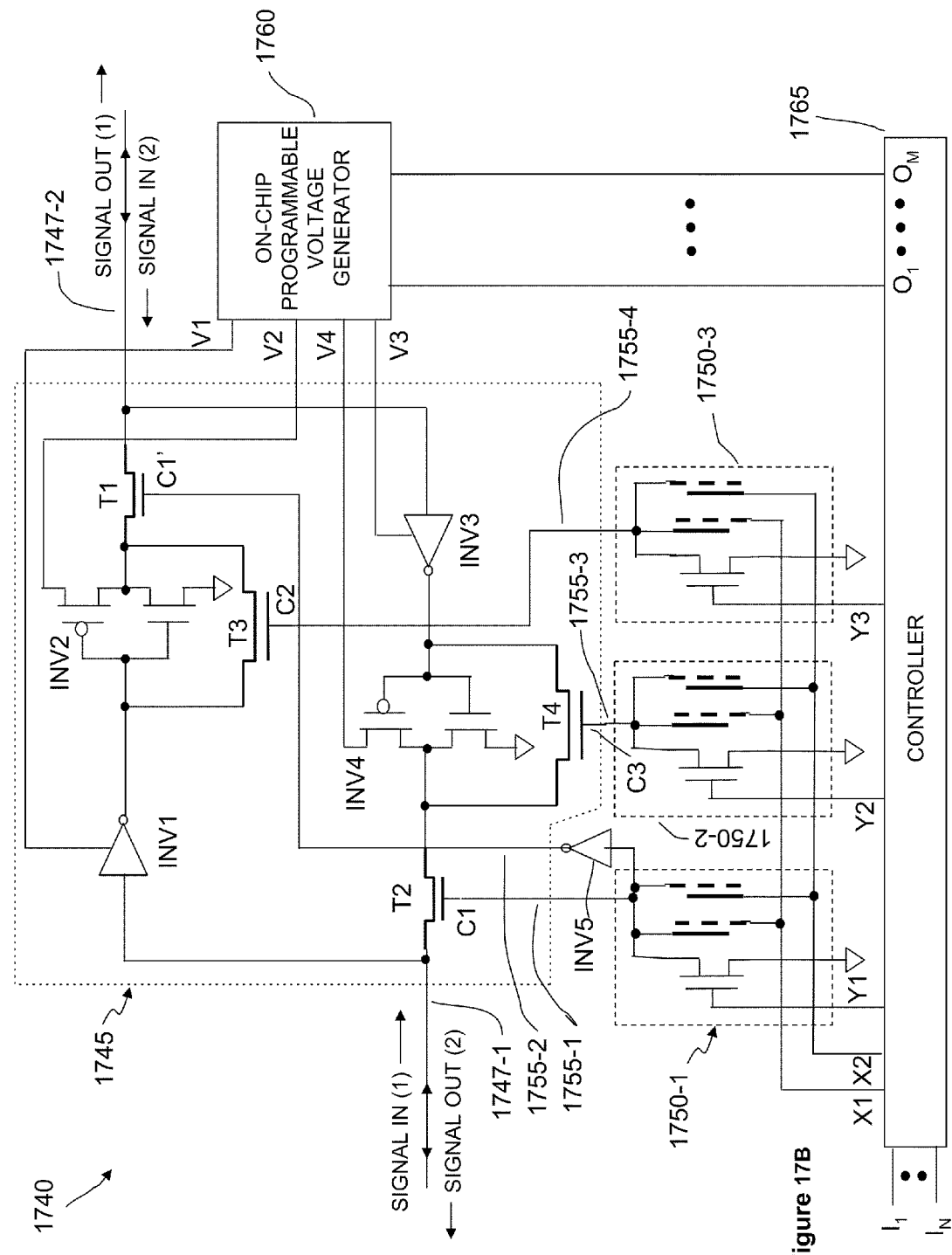
FIG. 17B shows a nonvolatile nanotube enhanced bidirectional buffer in which the direction, polarity, and amplitude of signal flow is controlled by a nonvolatile nanotube select circuit.

FIG. 17B illustrates an embodiment of a NT enhanced bidirectional buffer circuit NT_E-BiDi Buffer 1740 that not only controls the direction of signal flow as does NT BiDi Buffer 1700, but may also be used to invert (or not invert) signal polarity and restore pulses to different (or the same) voltage amplitudes as described further below with respect to FIG. 17B and also with respect to U.S. Patent Application No. 61/039,204, filed on Mar. 25, 2008, entitled "Carbon Nanotube-Based Neural Networks and Methods of Making and Using Same." Signal flow from wire 1747-1 to 1747-2 is processed independently of signal flow from wire 1747-2 to 1747-1.

NT_E-BiDi Buffer 1740 circuit is formed by a combination of enhanced bidirectional buffer circuit E-BiDi buffer 1745, NV NT select circuits 1750-1, 1750-2 and 1750-3, on-chip voltages V1, V2, V3, and V4 generated by on-chip programmable voltage generator 1760, and controller 1765. Note that voltages V1, V2, V3, and V4 are supplied to inverters INV1, INV2, INV3, and INV4, respectively, by on-chip programmable voltage generator 1760. The operation of on-chip programmable voltage generator 1760 is described further below with respect to FIG. 18. The programming and operation of NV NT select circuits 1750-1, 1750-2 and 1750-3 correspond to the programming and operation of NV NT select circuit 1150 shown in FIG. 11B, NV NT select circuit 1200 illustrated in FIG. 12A, the operation of NV NT select circuits 1410-1 . . . 1410-7 shown in FIG. 14A, and the operation of NV NT select circuits 1620-1 . . . 1620-6 shown in FIG. 16.

E-BiDi Buffer 1745 includes inverter INV1 with input connected to wire 1747-1 and to a first terminal of FET T2. The output of INV1 drives the input of inverter INV2. The output of INV2 is connected to a first terminal of FET T1 whose gate is controlled by configuration control logic state C1' supplied by select node 1755-2 inverter INV5 output whose input is connected to the NV NT select circuit 1750-1 output node. FET T3 is connected in parallel with INV2 with a first terminal connected to the output of INV1 and a second terminal connected to a first terminal of FET T1. The gate of FET T3 is controlled by configuration control logic state C2 supplied by select node 1755-4 of NV NT select circuit 1750-3. A remaining second terminal of FET T1 is connected to wire 1747-2 and also to the input of inverter INV3. The output of INV3 drives the input of inverter INV4. The output of INV4 is connected to a first terminal of FET T2 whose gate is controlled by configuration control logic state C1 supplied by select node 1755-1 of NV NT select circuit 1750-1 output node. FET T4 is connected in parallel with INV4 with a first terminal connected to the output of INV3 and a second terminal connected to a second terminal of FET T2. The gate of FET T4 is controlled by configuration control logic state C3 supplied by select node 1755-3 of NV NT select circuit 1750-2. A remaining second terminal of FET T2 is connected to wire 1747-1 and also to the input of inverter INV1.

On-chip voltages V1, V2, V3, and V4 are supplied to E-BiDi Buffer 1745 by on-chip nonvolatile nanotube programmable voltage generator 1760 as described further below with respect to FIG. 18. V1 (and V2, V3, and V4) may be varied over a relatively large range of voltages (0 to 5 volts, for example). Controller 1765 outputs $O_1 \ldots O_M$ are inputs to on-chip NV NT programmable voltage generator 1760 used to program the values of V1, V2, V3, and V4 as described further below with respect to FIG. 18. Controller 1765 also controls the programming and operation of NV NT select circuits 1750-1, 1750-2, and 1750-3 to control the logical operation of E-BiDi Buffer 1745 with outputs X1, X2, Y1, Y2, and Y3 connected to corresponding NV NT select circuits that control the logic operation of NT_E BiDi buffer 1740. Inputs $I_1 \ldots I_N$ to controller 1765 are processed by the controller 1765 logic (not shown).

In operation, NT BiDi Buffer 1740 enables non-inverted signal flow from wire 1747-1 to wire 1747-2 or from wire 1747-2 to wire 1747-1 if FET T3 and FET T4 are in an OFF state. If C1 is at ground and C1' (logical complement of C1) is at a positive voltage such as 2.5 volts for example, then FET T2 is in an OFF state and FET T1 is in an ON state. A signal arriving on wire 1747-1 propagates through INV1 and INV2 and FET T1 to wire 1747-2. However, a signal arriving on wire 1747-2 can only flow through T1 to the output node of INV2 and is blocked. Similarly, the signal can propagate through INV3 and INV4 but is blocked by FET T2 in an OFF state. Alternatively, if C1 is at a positive voltage such as 2.5 volts and C1' is at ground for example, then FET T1 is in an OFF state and FET T2 is in an ON state. A signal arriving on wire 1747-2 propagates through INV3 and INV4 and FET T2 to wire 1747-1. However, a signal arriving on wire 1747-1 can only flow through T2 to the output node of INV4 and is blocked. Similarly, the signal can propagate through INV1 and INV2 but is blocked by FET T1 in an OFF state.

In operation, on-chip voltage V1 is applied to the inverter INV1 and V2 is applied to inverter INV2 PFET source terminal. Voltages V1 and V2 may be varied over a range of voltages from 0 to 5 volts for example by on-chip NV NT programmable voltage generator 1760. In the case of a non-inverting signal transmission, FET T3 is in OFF state and voltages V1 and V2 may be varied from 1 to 5 volts for example. However, in an inverting operation, voltage V2 is reduced to zero to enable FET T3 turn-ON. V1 may be set in the 1 to 5 volts range and the signal flowing from wire 1747-1 to wire 1747-2 will be inverted and its amplitude may remain the same or may be modified.

In operation, on-chip voltage V3 is applied to the inverter INV3 and V4 is applied to inverter INV4 PFET source terminal. Voltages V3 and V4 may be varied over a range of voltages from 0 to 5 volts for example by on-chip NV NT programmable voltage generator 1760. In the case of a non-inverting signal transmission, FET T4 is in OFF state and voltages V3 and V4 may be varied from 1 to 5 volts for example. However, in an inverting operation, voltage V4 is reduced to zero to enable FET T4 turn-ON. V3 may be set in the 1 to 5 volts range and the signal flowing from wire 1747-2 to wire 1747-1 will be inverted and its amplitude may remain the same or may be modified.

Figure 18:
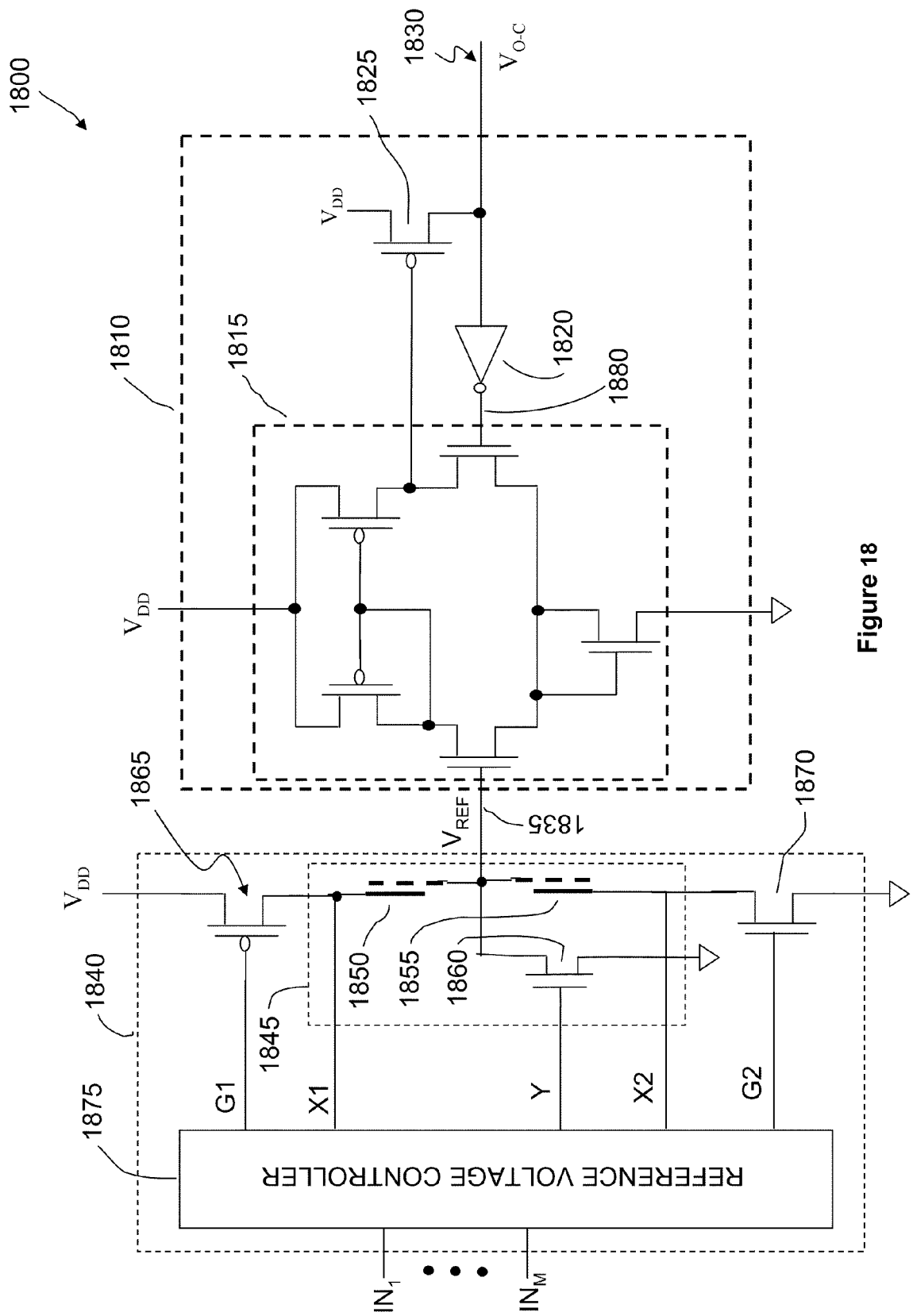
FIG. 18 shows a nonvolatile nanotube programmable voltage generator that generates a programmed on-chip voltage determined by a nonvolatile nanotube select circuit.

FIG. 18 illustrates an embodiment of a nonvolatile nanotube-controlled on-chip programmable voltage generator circuit (NV NT programmable voltage generator 1800) NT_V-GEN 1800 that corresponds to on-chip NV NT programmable voltage generator 1760 illustrated in FIG. 17B. On-chip voltage regulator 1810 is connected to a power source at voltage $V_{DD}$ and generates an on-chip voltage $V_{O-C}$ on output node 1830 when provided with a reference voltage $V_{REF}$ on first input terminal 1835. Differential amplifier 1815 holds output voltage $V_{O-C}$ on output node 1830 equal to reference voltage $V_{REF}$. Differential amplifier 1815 operation is similar to the operation of differential amplifiers described in R, Jacob Baker et al., "CMOS circuit Design, Layout, and Simulation," IEEE Press, 1998, p. 579-592. Regulated output voltage $V_{O-C}$ and corresponding output current to on-chip circuits is supplied by PFET 1825 typically having a wide channel width (width-to-length ratio of 100:1 or more for example). Inverter 1820 provides output voltage feedback to a second input terminal 1880 of differential amplifier 1815. A reference voltage is supplied to a first input terminal 1835 of differential amplifier 1815 by nanotube-controlled nonvolatile nanotube voltage reference generator NT_R-GEN 1840. NT_R-GEN 1840 includes NV NT select circuit 1845 with reference node connected to first input terminal 1835. A pair of NV NT switches is programmed to a ratio of ON resistance values (states) that sets reference voltage $V_{REF}$ based on a ratio of NV NT resistor values. In this application, NV NT switches are used in an analog mode and both NV NT switches are typically in an ON state of different resistance values and are referred to NANRISTORS in which ON resistance values are held in a nonvolatile state. NV NT select circuit 1845 includes NANRISTORS 1850 and 1855 sharing common first nodes which forms a select node that generates $V_{REF}$ on the first input terminal 1835 of differential amplifier 1815. FET 1860 is a mode control FET which is ON during programming and OFF during operation as described further above with respect to NV NT select circuit 1150 in FIG. 11B for example. PFET 1865 has one terminal connected to a second node of NANRISTOR 1850 and a second terminal connected to a power source at voltage $V_{DD}$. NFET 1870 has one terminal connected to a second node of NANRISTOR 1855 and a second terminal connected to a reference voltage such as ground. The gate voltage of PFET 1865 is controlled by reference voltage controller 1875 output G1; the gate of FET 1870 is controlled by output G2, and mode Y output to the gate of FET 1860 selects program or operate modes. X1 and X2 provide programming (program and erase) pulses as described further above with respect to FIG. 11B.

In a programming operation, G1 is at a high voltage such as 2.5 volts for example and PFET 1865 is OFF and G2 is at ground and NFET 1870 is OFF. Y is at a high voltage such as 2.5 volts for example and NFET 1860 is ON and the select node connected to first input terminal 1835 is at ground. X1 and X2 apply pulses to the second terminals of nonvolatile NANRISTORS 1850 and 1855 and resistor values are adjusted such that a ratio of NANRISTOR 1850 and 1855 values results in a voltage $V_{REF}$ when $V_{DD}$ is applied during NT_R-GEN 1840 operation. Programming corresponds to programming as described with respect to NV NT select circuit 1150 in FIG. 11B. All pulses are controlled by reference voltage controller 1875 based on inputs $IN_1 \ldots IN_M$ which correspond to $O_1 \ldots O_M$ in FIG. 17B.

In a reference voltage setting operating mode, Y is at ground and NFET 1860 is OFF. X1 and X2 are tristated. G1 is a ground such that PFET 1865 is ON and connects a second terminal of NANRISTOR 1850 to $V_{DD}$. G2 is at a high voltage such as 2.5 volts such that NFET 1870 is ON. PFET 1865 and NFET 1870 are designed such that the FET ON channel resistance is negligibly small compared to NANRISTOR 1850 and 1855 resistance values which may be in 100 k Ohm to 10M Ohm range for example. Higher NANRISTOR values result in less current flow during operation. Also, since NANRISTOR values are nonvolatile, power may be removed from portions of chips not in use.

In operation, $V_{REF}$ is determined as follows $$V_{REF} = R_{NANRISTOR\ 1855} \times V_{DD}/(R_{NANRISTOR\ 1850} + R_{NANRISTOR\ 1855})$$

Note: if $R_{NANRISTOR\ 1850} = R_{NANRISTOR\ 1855}$, $V_{REF} = V_{DD}/2$ $V_{REF}$ at first input terminal 1835 of differential amplifier 1815 is set equal to the desired voltage level for $V_{O-C}$ and the output node 1830 of differential amplified 1815 which also corresponds to output node 1830 of NT_V-GEN 1800 is held at $V_{O-C}$ even as circuit load at output 1830 is varied (draws more or less current). NT_V-GEN 1800 circuit output $V_{O-C}$ corresponds to one of voltage outputs V1, V2, V3, and V4 shown in FIG. 17B. The number of NT_V-GEN 1800 circuits needed depends on the number of on-chip voltages to be generated.

NV NT Bidirectional Buffer Function and NV NT Programmable Voltage Generator Used to Generate Precision Timing (Delay) and for Power Management Nonvolatile nanotube programmable voltage (NT_V-GEN) 1800 shown in FIG. 18 may be used to generate and control on-chip voltage to various circuits in an integrated circuit chip such as nonvolatile nanotube bidirectional buffer (NT_E-BiDi Buffer) 1740 shown in FIG. 17B for example. CMOS circuits, as is well known in the industry, swing from rail-to-rail and operate over a wide range of voltages. CMOS circuits with threshold voltages of 0.7 volts, for example, in the range of 1 to 3.5 volts for example but at varying speeds and power dissipation. If the operating voltage is low, approaching 1 volt for example, then CMOS circuits will operate more slowly due to reduced overdrive but also will dissipate less power. However, CMOS circuits will operate at high speed if the circuit is operated at a higher voltage such as 3.5 volts for example. Switching CMOS circuits dissipate power proportional to $f \cdot C \cdot V^2$, where f is the frequency of operation, C is the capacitive load, typically primarily due to wiring capacitance, and the square of the rail-to-rail voltage swing V.

Controller 1765 is described above with respect to control of voltages V1-V4 applied to NT_E-BiDi Buffer 1740 to modify the amplitude and polarity of pulses between input and output of NT-E-BiDi Buffer 1740. However, by controlling the voltage applied to NT_E-BiDi Buffer 1740, controller 1765 also varies power dissipation and delay through the buffer circuit.

Controller 1765 may be used to vary voltages applied to NT_E-BiDi Buffer 1740 to achieve continuous precision timing (delay) control because varying CMOS voltage can be used to control delay through CMOS circuits as described further above. Bertin et al U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," precision timing (delay) control in discrete steps until a pulse appears in a valid data window defined by a strobe pulse. In this case, pulse timing (delay) NT_E-BiDi buffer 1740 circuit may be monitored by sensing for the presence or absence of an output pulse in a valid data window defined by a strobe pulse. Voltages are adjusted by NT_V-GEN 1800, under the control of controller 1765, until the output pulse is detected by a comparator circuit (not shown) and a signal is sent to controller 1765. Reference voltage generator 1875, based on inputs from controller 1765 or another signal source, incrementally changes the ratio of the resistance values of Nanristors 1850 and 1855 in NT_R-GEN 1840 (as described further above) until the output voltage of NT_V-GEN 1840 circuit (or circuits since there may be more than one used) results in the desired timing speed (delay). At this point Nanristor 1850 and 1855 nonvolatile resistance values are left unchanged. As a consequence of this method of continuous speed (delay) adjustment, the amplitude of the signal output may be different to that of the signal input. The amplitude may be restored to a full rail-to-rail swing of, for example, 3.5 volts may be restored by sending the signal through one or more inverter stages (not shown). Delays introduce by inverter(s) are in series with the signal path and will be included in the adjusted precision timed waveform.

Power management (control of power dissipation) may be implemented for various regions of a chip (or the entire chip) by reducing the on-chip voltage output of NT_R-GEN 1840. This may be achieved by inputs to the reference voltage controller 1875 and corresponding adjustment of the values of nanristors 1850 and 1855 as described further above with respect to signal speed (delay) timing control. A power reduction signal may be provided to chips by the system by an OP-Code to a detector as described further below. Alternatively, a temperature sensor may be located on-chip that sends a signal to a controller such as reference controller 1875 to reduce operating voltage which reduces power dissipation.

NV NT Bidirectional Buffer Function and/or NV NT Programmable Voltage Generator Used as Security Event Response Functions In the event that a security event is detected, the operation of NT_E-BiDi buffer 1740 and NT_V-GEN 1800 may be changed. For example, voltages such V1-V4 may be driven to zero and switching operations terminated. Alternatively, voltages may be changed, amplitudes, polarities, timings (delays) may be modified to conditions that do not reflect the correct operating conditions of the application.

One method of detecting a security event is to use an on-chip detector that monitors an OP-Code stream and detects a security event (alarm) code as described in Bertin et al. U.S. Pat. No. 7,394,687. Once detected, programmable wiring and programmable logic and signal routing circuits may be modified as described further so that the high application function security is changed and therefore protected.

Nanotube Configurable Logic Blocks (NT_CLB) & Nanotube Programmable Switch Matrix (NT_PSM) Using Nonvolatile NRAM-Controlled Select Circuits Various NRAM™ memory architectures are combined with CLB and PSM functions to form NCLB and NPSM building blocks that may be integrated to form NFPGA logic as described with respect to FIGS. 19-26 illustrated further below.

NFPGA Function and Operation Using NRAM™s

Figure 19:
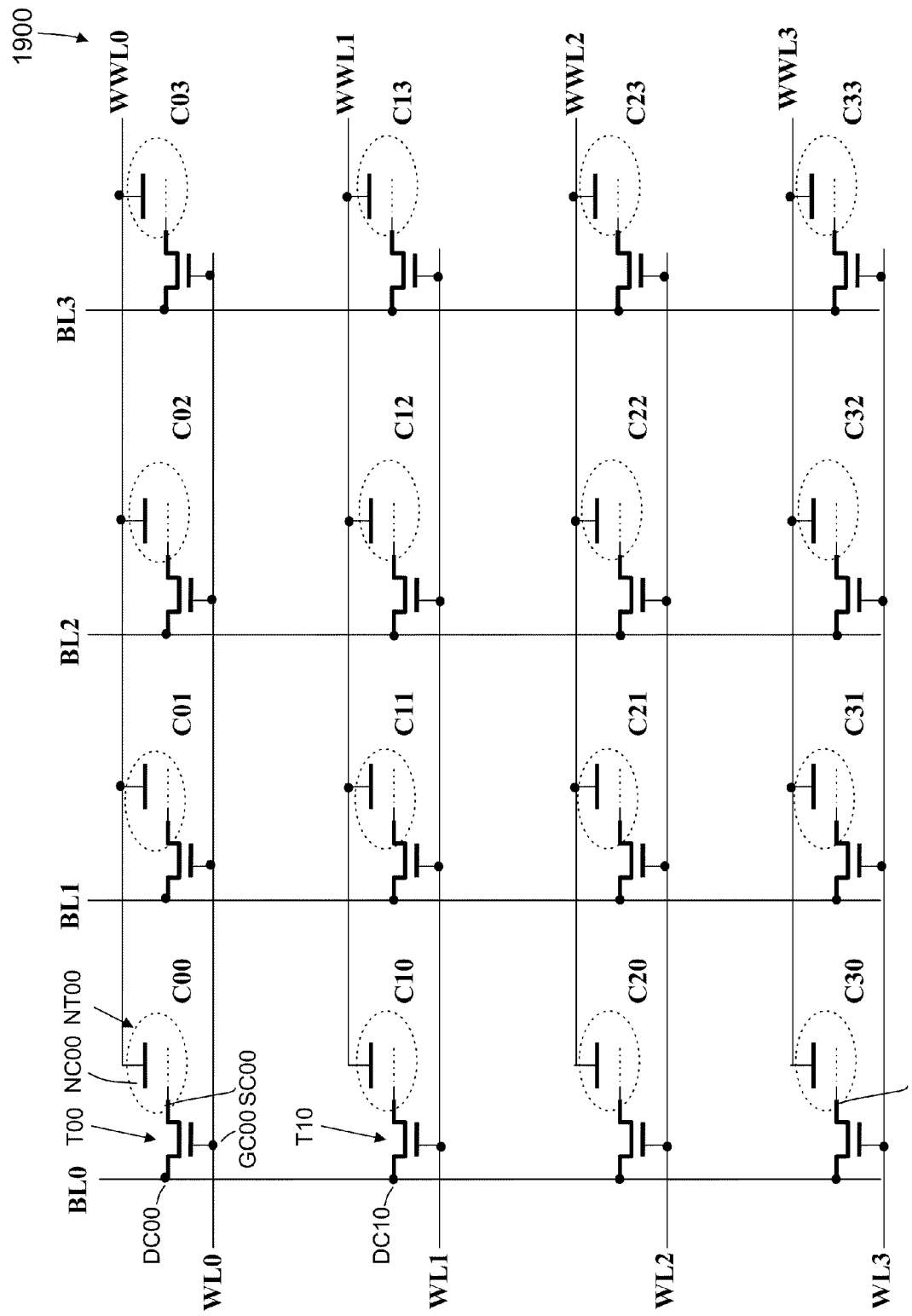
FIG. 19 shows a sixteen bit NRAM™ memory array.

Nonvolatile NRAM™ array schematic 1900 includes a matrix of 16 nonvolatile storage cells C00, C01, . . . , C33 as illustrated in FIG. 19. NRAM™ memory architecture and operation are described in U.S. patent application Ser. No. 11/280,786, filed on Nov. 15, 2005, entitled "Two-Terminal Nanotube Devices and Systems and Methods of Making," U.S. patent application Ser. No. 11/274,967, filed on Nov. 15, 2005, entitled "Memory Arrays Using Nanotube Articles with Reprogrammable Resistance," U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," and U.S. patent application Ser. No. 11/835,613, filed on Aug. 8, 2007, entitled "Memory Elements and Cross Point Switches and Arrays of Same Using Nonvolatile Nanotube Blocks," and are hereby incorporated by reference. Each memory cell illustrated in NRAM™ array schematic 1900, such as representative cell C00, includes a select transistor T00 that may be an NFET as shown, or may also be a PFET (not shown) or a CMOS transfer device (not shown) that includes both NFET and PFET devices, or other types of switching devices (not shown) such as diode steering devices as described in U.S. patent application Ser. Nos. 11/835,651, 11/835,759, 11/835, 845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same." Each cell, such as cell C00, also includes a nonvolatile nanotube storage node NT00 such as NV NT switch 1110 as illustrated by NRAM™ cell 1100 in FIG. 11A. Nonvolatile nanotube storage node NT00 (NV NT storage node) may be formed using NV NT switch-types or NV NT block switch-types illustrated further above and summarized in FIGS. 10B, 10C and 10D, respectively.

Nonvolatile storage cells such as cell C00 are formed by connecting the source SC00 of a transistor such as NFET T00 to a first terminal of a NV NT storage node such as NV NT storage node NT00 illustrated in FIG. 19. NRAM™ array schematic 1900 is formed by connecting word lines WL0, WL1, WL2, and WL3 to corresponding gates of NFET select transistors in corresponding storage cells; connecting secondary word lines WWL0, WWL1, WWL2, and WWL3 (typically used as reference lines connected to a voltage such as ground (zero volts)) to corresponding second terminals of NV NT storage nodes in corresponding storage cells; and connecting bit lines BL0, BL1, BL2, and BL3 to corresponding drain diffusions of corresponding NFET select transistors in corresponding nonvolatile storage cells as illustrated in FIG. 19. For example, word line WL0 is connected to the gate of NFET T00 by contact GC00; secondary word line WWL0 is connected to the second terminal of nonvolatile nanotube storage node NT00 by contact NC00; and bit line BL0 is connected to the drain of NFET T00 by contact DC00.

In erase and programming operations, a word line such as word line WL0 is selected and FETs C00, C01, C02, and C03 are turned ON. Word lines WL1, WL2, and WL3 are kept at ground and all other FETs are in an OFF state. In an erase (write "0") operation, bit lines are pulsed in the range of 5 to 7 volts with rise times in the nanosecond range using one or more pulses. One approach is to erase all bits along selected word line WL0 so that all NV NT switches are in a high resistance (OFF) state corresponding to a logical "0" state. Next, selected cells along WL0 are programmed to a low resistance (ON) state corresponding to a logical "1" state. So for example, if cell C00 is to store a low resistance value, a program (write "1") operation is performed in which bit line BL0 is pulsed in the range of 3-5 volts with rise times in the microsecond range using one or more pulses. If cells C01, C02, and C03 are to remain in a high resistance logical "0" state, then bit lines BL1, BL2, and BL3 are held at ground.

In read operating mode, bit lines such as BL0, BL1, BL2, and BL3 are precharged to a voltage such as 2.5 volts for example. A word line such as word line WL0 is selected and select FETs in NRAM™ cells C00, C01, C02, and C03 are turned ON. In this example, cell C00 is in a low resistance state corresponding to a logical "1" state and bit line BL0 is discharged and a logical "1" state will sensed and latched. Since cells C01, C02, and C03 are in a high resistance state, bit lines BL1, BL2, and BL3 will not discharge and a logical "0" state will be sensed and latched. In a x4 NRAM™ configuration, all 4 bits are provided at the NRAM™ memory output. In a x1 NRAM™ configuration, 1 of 4 bits is selected and provided at the NRAM™ memory output.

Figure 20:
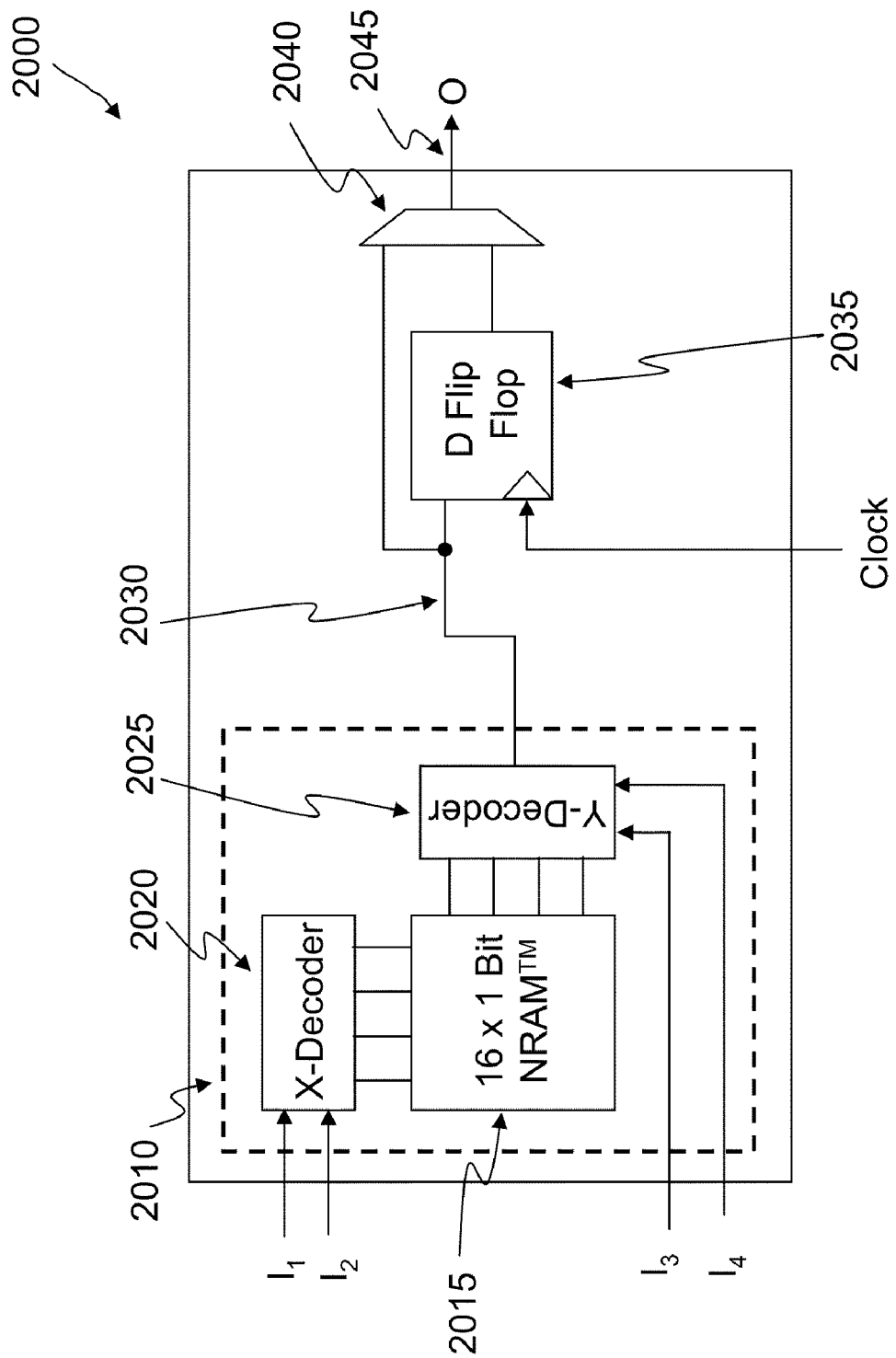
FIG. 20 shows a nonvolatile nanotube configurable logic block with a look-up table formed using a 16 bit NRAM memory, a D-flip flop, and a multiplexer.

FIG. 6 illustrates CLB 600 which includes look up table (LUT) 610. LUT 610 is described further above with respect to FIG. 6 which corresponds to LUTs as described in U.S. Pat. Re. 34,363 Jun. 24, 1991 Ross Freeman in which a 16 bit RAM (a volatile SRAM) in a x1 configuration is used to generate LUT 610 logic look up table. An NRAM™ may be used instead as the RAM function. An NRAM™ has the advantage of smaller array size because of smaller cell size and nonvolatile operation. FIG. 20 illustrates NCLB 2000 including NLUT 2010 that includes 16 bit NRAM™ array 2015 that corresponds to NRAM™ array schematic 1900 described further above with respect to FIG. 19. Inputs $I_1$ and $I_2$ to X-Decoder 2020 and $I_3$ and $I_4$ to Y-Decoder 2025 select one of 16 bits to output to wire 2030. NLUT 2010 output drives wire 2030 which in turn drives an input to D flip flop 2035, which also includes a clock input, and also drives a first terminal of multiplexer (MUX) 2040. A second terminal of MUX 2040 is driven by the output of D flip flop 2035. MUX 2040 drives wire 2045 providing NCLB 2000 output O.

Figure 21:
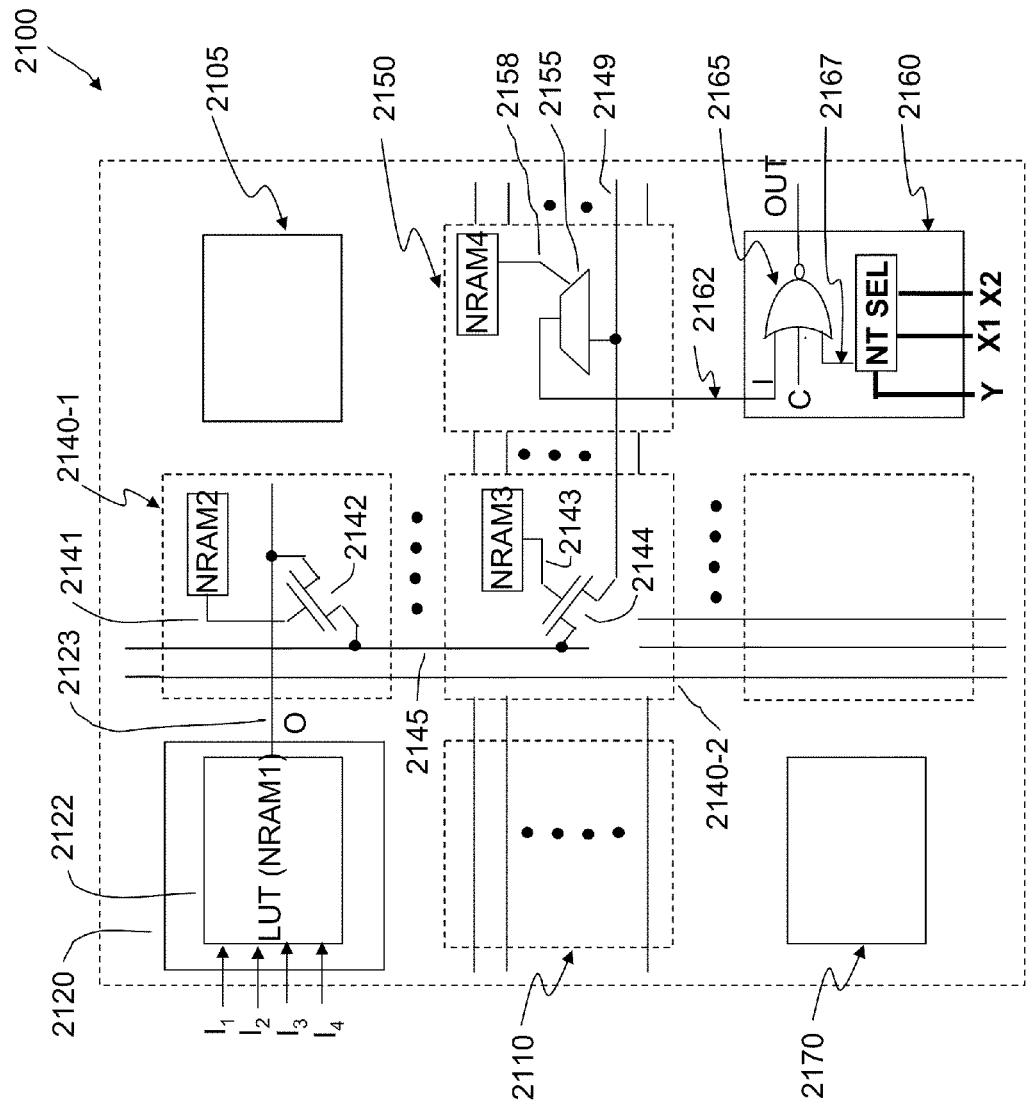
FIG. 21 shows a nonvolatile nanotube field programmable gate array (NFPGA) with configurable logic blocks and programmable switch matrices controlled by nonvolatile NRAM™ memory outputs.

FIG. 21 illustrates a block diagram of an embodiment of NFPGA 2100 formed using NRAM™ controlled NCLBs such as NCLB 2120 and NRAM™ controlled NPSMs such as NPSM 2140-1. NFPGA 2100 also includes a NanoLogic™ circuit that includes a nonvolatile nanotube select circuit (labeled NT SEL) that forms nanotube configurable logic block NCLB 2160 and an NRAM™ controlled MUX 2155 as part of NCLB 2150. NRAM™ controlled bidirectional buffers (not shown) may also be included. Flip flops and multiplexers (shown in FIGS. 6 and 7) may be included as well.

The NFPGA 2100 logic function is configured using NRAM™ memories (or memory sub-arrays) NRAM1-NRAM4 whose operations are described further above with respect to FIGS. 19 and 20. In addition to NRAM™s, NCLB 2160 programming also includes NV NT select circuit NT SEL as shown in FIG. 21 and described further above with respect to FIG. 13 using program and operation inputs X1, X2, and mode control input Y. Multiple nanotube-configurable logic blocks (NCLBs) and nanotube programmable switch matrices (NPSMs) are configured (programmed) and determine NFPGA 2100 logic function.

NCLB 2120 corresponds to NCLB 2000 illustrated in FIG. 20 that may include flip flops and multiplexers (not shown) such as illustrated in FIG. 6; NPSM 2140-1 uses NRAM2 output 2141 to control the ON/OFF state of FET 2142; NPSM 2140-2 uses NRAM3 output 2143 to control the ON/OFF state of FET 2144; NCLB 2160 corresponds to NanoLogic™ circuit 1270 illustrated in FIG. 12D and flip flop and multiplexers (not shown) such as illustrated in FIG. 7; NCLB 2150 includes NRAM4 whose output 2158 controls the operation of multiplexer 2155 and may include flip flops and other multiplexers (not shown) as illustrated in FIG. 7. CLB functions such as 2105 and 2170 may include configurable logic functions such as illustrated in FIGS. 6 and 7 which may or may not include NRAM™ and NanoLogic™ functions. Wiring region 2110 shows horizontal wires that may be used for various interconnections (not shown). NT BiDi Buffers controlled by NRAM™s (not shown) may be used to controls the direction of signal flow on selected wires as explained further above with respect to FIGS. 17A and 17B. Using said NT BiDi Buffers, configuration control logic states (may also be referred to as configuration control bits) are supplied by NRAM™ memory outputs.

In logic configuration setting operations for NCLB 2120, NCLB 2150, NPSM 2140-1 and NPSM 2140-2, NRAM1-NRAM4 are programmed as described with respect to NRAM™ array schematic 1900 (FIG. 19) and NRAM™ array 2015 by word and bit line waveforms selected by X-decoder 2020 and Y-decoder 2025 (FIG. 20) to generate nonvolatile logic voltages that control device ON/OFF states and control logic block functions. NCLB 2160 logic function is determined by NT SEL based on inputs X1, X2, and Y as described further above with respect to FIG. 11B, FIG. 12A, and FIG. 13 for example.

In this logic configuration setting operation example, NCLB 2120 logic function includes NLUT 2122 with NRAM1 corresponding to FIG. 20 with NLUT 2122 programmed such that a logic function such as $(A \cdot B)_C$ (the complement of A logically ANDed with B) for example is outputted to wire 2123 and NPSM 2140-1 NRAM2 is programmed such that output 2141 is at a high voltage which turns FET 2142 to an ON state so that the wire 2123 signal is transmitted to wire 2145. NPSM 2140-2 NRAM3 is programmed such that output 2143 is at a high voltage which turns FET 2144 to an ON state so that the wire 2145 signal is transmitted to wire 2149. NCLB 2150 NRAM4 is programmed such that output 2158 activates MUX 2155 which is connected to wire 2149 and transmits the signal on wire 2149 to wire 2162.

NCLB 2160 corresponds to NanoLogic™ circuit 1250 illustrated in FIG. 12D and flip flops and multiplexers (not shown) such as illustrated in FIG. 7. Three input NOR gate 2165 has a first input controlled by the select node 2167 output of NT SEL. Input I corresponds to the signal on wire 2162 and is applied to a second input of NOR gate 2165. Input C is applied to a third input of NOR gate 2165. In this example, select node 2167 output voltage is selected to be zero so that NOR gate 2165 transmits $(C+I)_C$ to output OUT of NCLB 2160. With FPGA 2100 NRAM™ and NV NT select circuits programmed as described in this example, $(A \cdot B)_C$ appears on wire 2123 and since both FET 2142 and 2144 are in an ON state, then $(A \cdot B)_C$ is propagated to wire 2145 and then to wire 2149; wire 2149 is also an input to multiplexer 2155 which is activated because NRAM4 has output 2158 at a high voltage such as 2.5 volts. Therefore, $(A \cdot B)_C$ propagates along wire 2162 to NOR gate 2165 input I. Because select node 2167 voltage is ground, NOR gate 2165 propagates $((A \cdot B)_C + C)_C$ to NCLB 2160 output node OUT.

NCLB Function and Operation Using NRAM™s

Figure 22A:
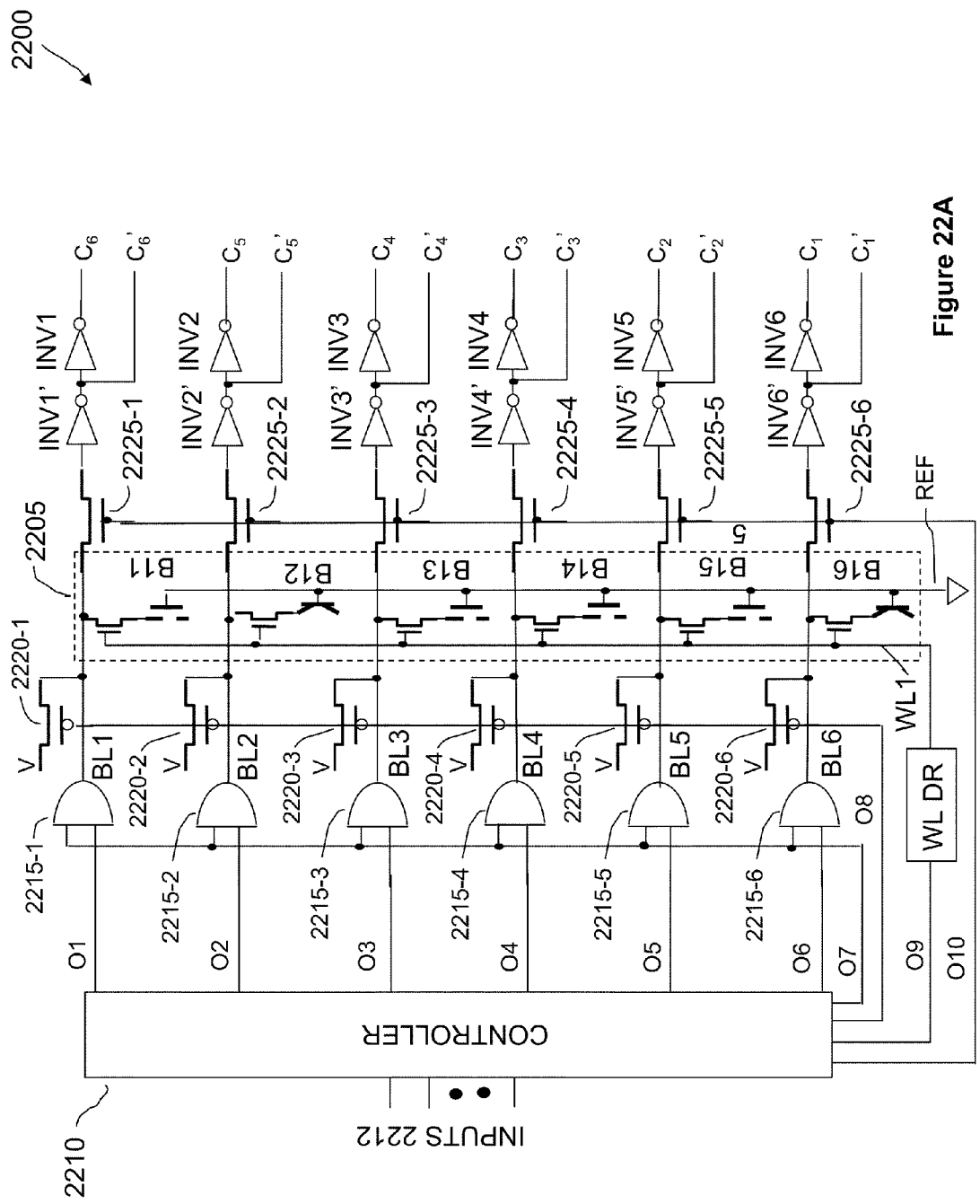
FIG. 22A shows a 1×6 nonvolatile NRAM™ memory architecture used as an NRAM™-based nonvolatile control bit generator that provides true and complement control bit outputs.
Figure 22B:
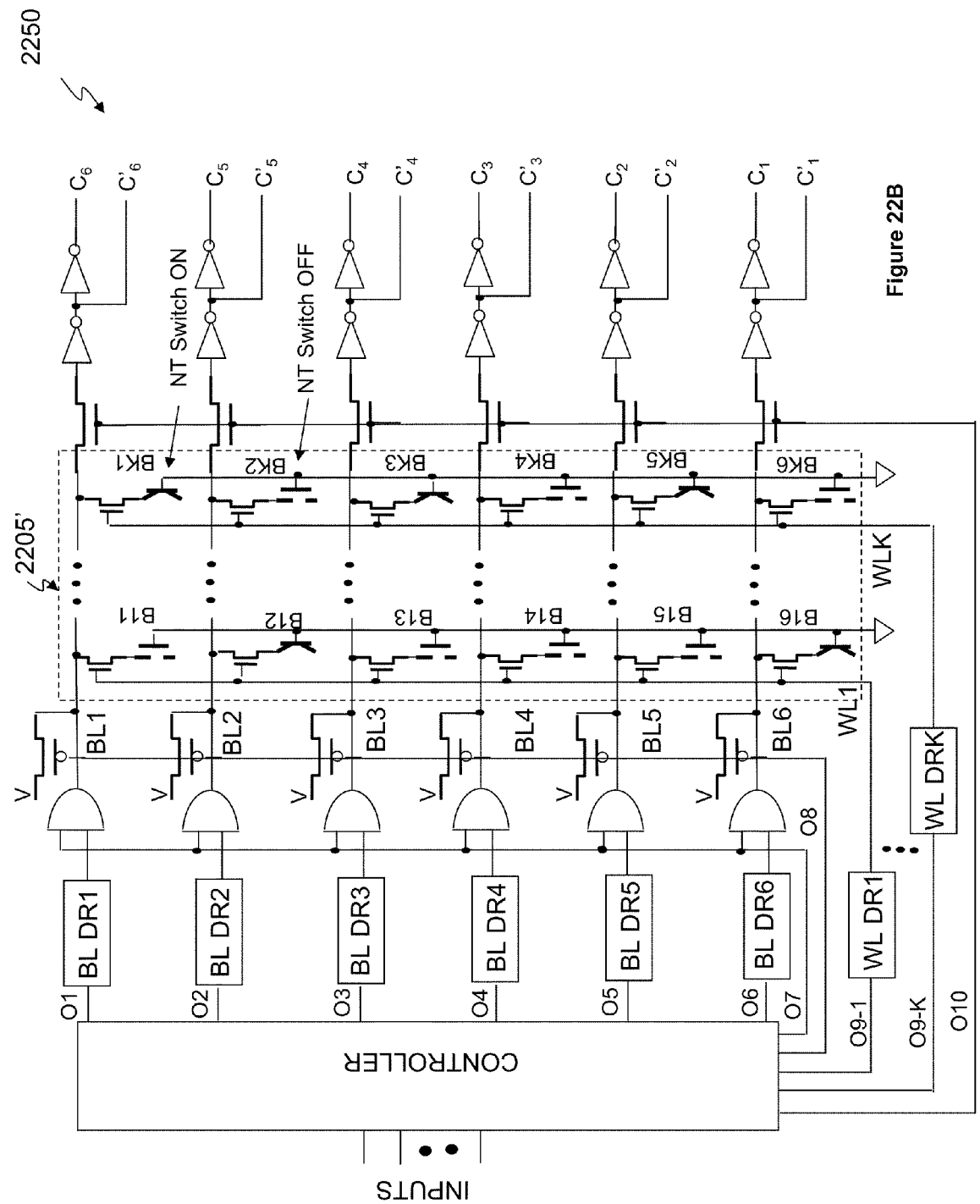
FIG. 22B shows a K×6 nonvolatile NRAM™ memory architecture used as an NRAM™-based nonvolatile control bit generator that provides true and complement control bit outputs.

NFPGA 2100 illustrated in FIG. 21 illustrates nonvolatile configurable logic blocks and nonvolatile programmable switch matrices using relatively simple examples based on NRAM™s illustrated in FIGS. 19 and 20. One nonvolatile configurable logic block based on a nonvolatile nanotube select circuit as described further above with respect to FIG. 12D is also included to illustrate the ability to mix NRAM™-based and NV NT select circuit-based approaches to nonvolatile configurable logic blocks in the same NFPGA design. Since nonvolatile configurable logic blocks have been described further above with respect to FIGS. 13 and 14, the emphasis is on NRAM™-controlled programmable logic functions. FIGS. 22A and 22B described further below illustrate NRAM™ architectures that provide NRAM™-generated configurable control bits (corresponding to configurable control logic states) based on bit configurations stored in NRAM™ arrays similar to NRAM™ array schematic 1900 in FIG. 19.

NRAM™ architectures may be similar to the NRAM™ architecture described with respect to NCLB 2000. NCLB 2000 is illustrated further above with respect to FIG. 20 and includes an NRAM™ memory used to realize nonvolatile look up table (NLUT) 2010 which provides configuration control logic states (or configuration controlled bits) as part nonvolatile programmable logic block (NCLB) 2000 function. NRAM™ architectures may also be designed to provide multi-bit outputs in parallel and may use fewer on-pitch circuits to implement NCLB functions in a smaller physical area for example as illustrated further below by NRAM™ 2200 in FIG. 22, and configured to provide nonvolatile configuration control bits.

FIG. 22A illustrates an embodiment of NRAM™ 2200 architecture shown in schematic form that may be used as an NRAM™-based nonvolatile control bit generator that provides true and complement control bit outputs. NRAM™ 2200 includes NV memory array 2205 shown in schematic form which corresponds to nonvolatile NRAM™ array schematic 1900 illustrated in FIG. 19, but with only one word line and six parallel bit lines. Controller 2210 accepts inputs 2212 and generates outputs O1-O10. Outputs O1-O6 drive a first input of two terminal tristate AND gates 2215-1 to 2215-6, respectively. Output O7 drives second input gates of two terminal tristate AND gates 2215-1 to 2215-6 to enable or disable bit line selection for program or erase operations. Outputs of two terminal tristate AND gates 2215-1 to 2215-6 drive bit lines BL1-BL6, respectively. Bit lines BL1-BL6 are also connected to the drain of corresponding NFET select transistors shown in NV memory array 2205. A word line WL1 is connected to the output of word line driver WL DR which is driven by output O9 of controller 2210. Word line driver WL DR drives array word line WL1 which is connected to gates of FET select devices shown in NV memory array 2205 for cells B11, B12, . . . , B16. Storage nodes may be formed using NV NT switches or NV NT blocks as described further above with respect to FIGS. 10B, 10C and FIG. 10D, respectively. Each first terminal of a NV NT switch or a NV NT block is connected to a source of a corresponding select FET and a second terminal is connected to a common reference line such as reference line REF which may be connected to ground. PFETs 2220-1 to 2220-6 have first terminals connected to a voltage source V. Each second terminal of PFETs 2220-1 to 2220-6 is connected to bit lines BL1-BL6, respectively, and gate terminals are connected to a common control line which is connected to controller 2210 output O8 which enables or disables read operations. Bit lines BL1-BL6 are also connected to a first terminal of each transfer NFET 2225-1 to NFET 2225-6 transfer devices, respectively. A second terminal of each transfer device NFET 2225-1 to NFET 2225-6 drives an input of inverters INV1'-INV6', respectively, and the gates of transfer devices NFET 2225-1 to NFET 2225-6 are connected to a common control line which is driven by output O10. The outputs of inverters INV1'-INV6' provide complement configuration control bits $C_1'$-$C_6'$. The outputs of inverters INV1'-INV6' also drive inputs of inverters INV1-INV6, respectively, whose outputs generate configuration control bits C1-C6, respectively. Note that the complement of a logic (or bit) variable may be indicated as C' or $C_C$ for example. Both forms are used interchangeably throughout the specification. NRAM™ 2200 configuration control bits C1-C6 and complement configuration control bits C1'-C6' may be used as part of NCLB 2300 illustrated further below in FIG. 23 and may also be used as part of NPSM 2400 illustrated further below with respect to FIG. 24.

FIG. 22B illustrates an embodiment of NRAM™ 2250 in schematic form which corresponds to NRAM™ 2200 but with a larger 6×K nonvolatile memory array 2205' compared with 1×6 nonvolatile memory array 2205. Additional word drivers, word driver input, and output lines have been added to NRAM™ 2200 to accommodate the larger memory array. Word line driver WL DR with input O9 driving word line WL1 has been replaced with word line drivers WL DR1 to WL DRK with corresponding inputs O9-1 to O9-K and corresponding outputs driving word lines WL1-WLK, respectively. Word line WL1 drives gates of select FET transistors in cells B11-B16; other word lines (not shown) drive corresponding gates of select FET transistors in other cells; and word line WLK drives gates of select FET transistors in cells BK1-BK6. All other functions are unchanged and are as described with respect to FIG. 22A.

Referring to FIG. 22A, in erase and program operations, controller output O8 is held at a high voltage such as 2.5 volts and PFETs 2220-1 to 2220-6 are OFF. Transfer NFETs 2225-1 to 2225-6 gates are held at ground (zero volts) by O10 and are in an OFF state. Two input tristating AND gates 2215-1 to 2215-6 are activated by O7 at a high voltage such as 2.5 volts which disables tristate and enables two input AND gate operation. At this time, erase and/or program NRAM™ operations may be performed as described further above with respect to FIG. 19. Once NV NT switches (or NV NT blocks) in NV memory array 2205 cells have been switched to ON or OFF states, erase and program operations are terminated and a nonvolatile high resistance state (OFF) or a nonvolatile low resistance state (ON) is stored. A high resistance state may correspond to a logic "0" state and a low resistance state may correspond to a logic "1" state for example. NV memory array 2205 cells are in the following states as illustrated in FIG. 22A. B11 is in a high resistance state; B12 is in a low resistance state; B13, B14, and B15 are in high resistance states, and B16 is in a low resistance state.

Referring to FIG. 22A, in a read operation, controller output O7 is at ground and two input tristate AND gates 2215-1 to 2215-6 are inactive and tristated. Controller output O8 is at ground and PFETs 2220-1 to 2220-6 are ON. PFETs are designed for a high ON channel resistance values using minimum widths and greater than minimum lengths. Therefore voltage V is applied through a channel resistance of 1M Ohm for example. A read voltage is applied by WL DR to word line WL1 and all select FETs are turned ON. In cells with NV NT switches (or NV NT blocks) are in a high resistance state, typically 1 G Ohm and higher, the output voltage on the corresponding bit lines is V. If however, the series combination of select FET ON resistance and NV NT switch ON resistance is 100 k Ohms or less, then the voltage on the corresponding bit lines will be at a low voltage at V/10 or less. With transfer NFETs 2225-1 to 2225-6 held in an ON state by controller output O10 at a high voltage such as 2.5 volts, bit line BL1-BL6 voltages are applied to inverters INV1'-INV6', respectively, generating complement configuration control bits C1'-C6'; and INV1'-INV6' outputs drive corresponding inverters INV1-INV6 generating configuration control bits C1-C6, respectively. In the NRAM™ 2200 example with NV memory array 2205 cells programmed as illustrated in FIG. 22A configuration control bit (true and complement) outputs during a read operation are as follows: C1', C2, C3, C4, C5' and C6 are at a high voltage such as 2.5 volts for example; C1, C2', C3', C4', C5, and C6' are at a low voltage such as ground.

Referring to FIG. 22B, erase and program operations are as described with respect to FIG. 22A for each of the word lines WL1 . . . WLK. Also, read operations are as described with respect to FIG. 22A for each of the word lines WL1 . . . WLK. Bits B11, B12, . . . , B16 in FIG. 22B are in the same state as bits B1-B6 in FIG. 22A. However, bits BK1-BK6 states are not all the same. Therefore, in the NRAM™ 2250 example illustrated in FIG. 22B, NV memory array 2205' word line WLK configuration control bit (true and complement) outputs during a read operation are as follows: C1, C2', C3, C4', C5 and C6' are at a high voltage such as 2.5 volts for example; C1', C2, C3', C4, C5', and C6 are at a low voltage such as ground.

In read operations, the logic state (logic "1" or logic "0") of configuration control bits illustrated in FIG. 22B may be rapidly changed between multiple pre-programmed states stored in NRAM™ 2205' to reconfigure programmable logic functions for reconfigurable computing operation. In order to maximize reconfigurable computing speed, a pipelined memory operating mode architecture such as used in high speed memory cache operations may be used in which a new set of configuration control bits may be generated during each clock cycle after an initial latency (read access time) delay of multiple clock cycles. If the logic function or routing matrix to be programmed has the required configuration stored in NRAM™ arrays, then for relatively small NRAM™ arrays, configuration control bits (true and complement) may be changed in cycle times of 150 ps corresponding to clock frequencies of 6.7 GHz for example for a 90 nm technology node when corresponding NRAM™ arrays are operated in a pipelined architecture.

Nonvolatile nanotube configurable logic block (NCLB) 2300 illustrates an embodiment of a larger nanotube-based logic function corresponding to combinatorial logic function 710 illustrated in FIG. 7 except that flip flop function and multiplexer are not shown in this example. NCLB 2300 is a nanotube configurable (programmable) two input (inputs A and B) one output (output F) logic block (function) formed using a cascade of FET transfer devices and other logic functions such as NAND, NOR, and a tristate output and is similar to the logic function illustrated in FIG. 14A. The ON or OFF state of each transfer gate and logic operation of some NAND and NOR circuits is controlled by a configuration control bit (which may also be referred to as a configuration control logic state) supplied by NRAM™ output bits. NRAM™ 2310 is used to generate true and complement configuration control bits C0, C0', C1, C1', . . . C6, and C6'. NRAM™ 2310 corresponds to NRAM™ 2200 shown in FIG. 22A or NRAM™ 2250 shown in FIG. 22B.

NCLB 2300 includes input A to one terminal of FET 2330-1 and input $A_C$ formed by inverter 2330-2 is applied to one terminal of FET 2330-3, with the second terminal of each of FETs 2330-1 and 2330-3 dotted and connected to wire 2330-4 which drives one input of two input NOR gate 2340. Inputs A and $A_C$ are also connected to one terminal of FET 2330-5 and one terminal of FET 2330-6, respectively, with the second terminal of each of FETs 2330-5 and 2330-6 dotted and connected to wire 2330-7 which is connected to one input of three input NAND gate 2350. NRAM™ 2310 provides configuration control bits C0 to the gate of FET 2330-1 and C0' to the gate of FET 2330-3. NRAM™ 2310 provides configuration control bits C1 to the gate of FET 2330-5 and C1' to the gate of FET 2330-6.

NCLB 2300 also includes input B to one terminal of FET 2330-8 and input $B_C$ formed by inverter 2330-9 and applied to one terminal of FET 2330-10, with the second terminal of each of FETs 2330-8 and 2330-10 dotted and connected to wire 2330-11 which drives the second input of two input NOR gate 2340. Inputs B and $B_C$ are also connected to one terminal of FET 2330-12 and one terminal of FET 2330-13, respectively, with the second terminal of each of FETs 2330-12 and 2330-13 dotted and connected to wire 2330-14 which is connected to a second input of three input NAND gate 2350. NRAM™ 2310 provides configuration control bits C2 to the gate of FET 2330-8 and C2' to the gate of FET 2330-10. NRAM™ 2310 provides configuration control logic bits C3 to the gate of FET 2330-12 and C3' to the gate of FET 2330-13.

NCLB 2300 also includes NRAM™ 2310 providing output C4 to one input of two input NAND gate 2345. The second input to NAND gate 2345 is supplied by the output of NOR gate 2340. NRAM™ 2310 output C5 is connected to the third input of three input NAND gate 2350. The outputs of two input NAND 2345 and three input NAND 2350 drive the two inputs to NOR gate 2355. The output of two input NOR gate 2355 drives the input of tristate inverter 2360. The state of tristate inverter F is determined by configuration control bits C6 and C6' which are provided by NRAM™ 2310.

FIG. 14B described further above illustrates eight nonvolatile circuit configurations (CKT CONFIG. #s 1-8) and the corresponding values of C0, C0', . . . , C5 used to generate CKT CONFIG. #s 1-8 for NCLB 2300. FIG. 14B gives an output F function based on inputs A and B and the configuration control logic states. Output F outputs logic values if the C6 state is a logic 1 and C6' is a logic 0. However, if the C6 state is a logic 0 state and C6' is a logic 1, then output F remains in tristate with no defined value. FIG. 15 illustrates equivalent circuits 1500 corresponding to CKT CONFIG. 1-8.

NPSM Function and Operation Using NRAM™s

Figure 24:
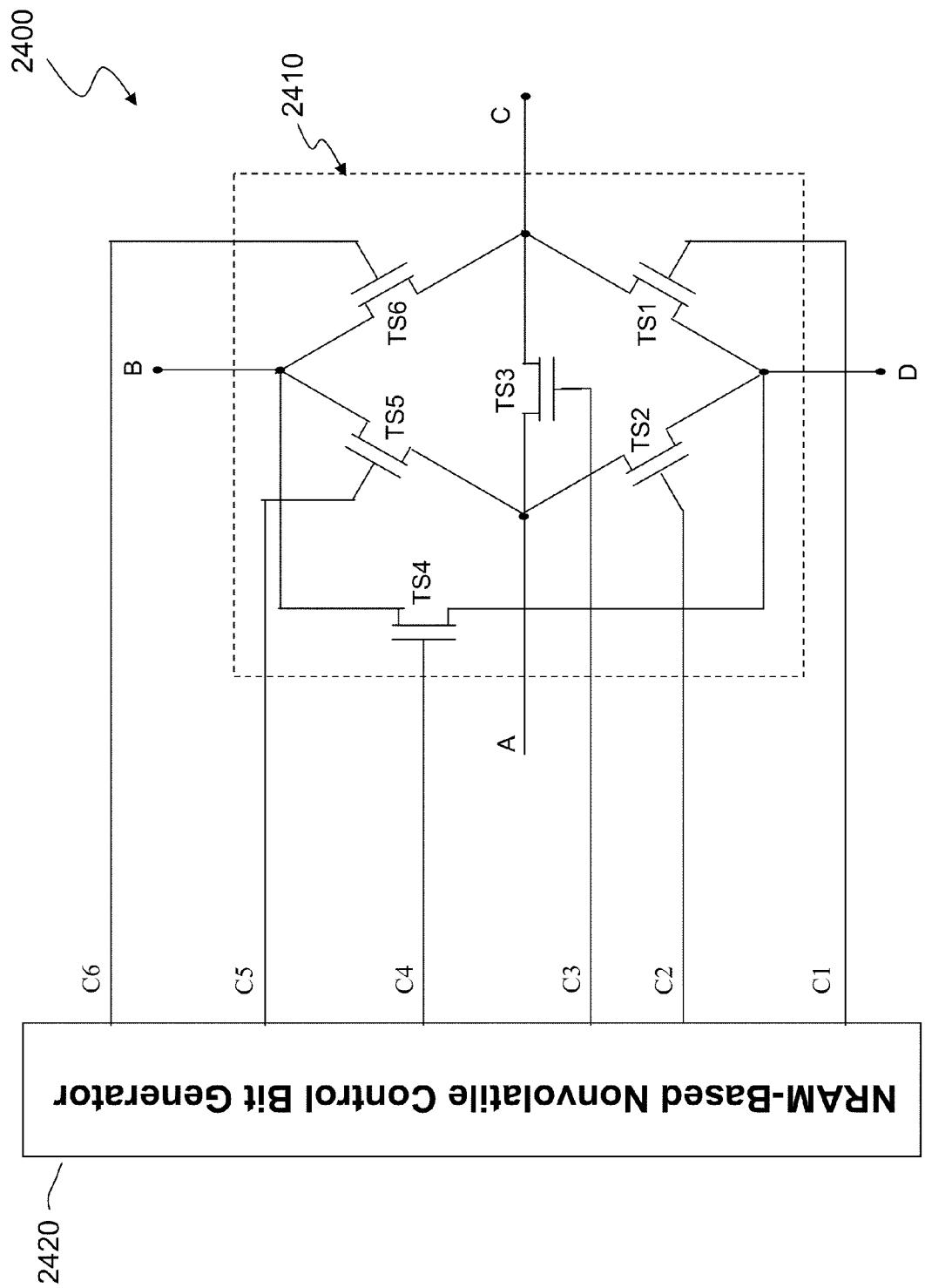
FIG. 24 shows a nonvolatile nanotube programmable switch matrix with various signal routing configurations controlled by nonvolatile true and complement control bits generated by a nonvolatile NRAM™ memory such as described with respect to FIG. 22A or FIG. 22B.

An embodiment of nonvolatile nanotube programmable switch matrix NPSM 2400 illustrated in FIG. 24 shows programmable switch matrix (PSM) 2410 configured by nonvolatile NRAM™ 2420 outputs that provide configuration control bits. Programmable switch matrix (PSM) 2410 is the same as PSM 1610 described further above with respect to FIG. 16. NRAM™ 2420 may correspond to NRAM™ 2200 shown further above in FIG. 22A, NRAM™ 2250 shown further above in FIG. 22B, or other NRAM™ configurations (not shown). Nonvolatile configuration control bits C1-C6 control the configuration of PSM 2410 as described above with respect PSM 1610 shown in FIG. 16. Configuration control bits C1-C6 drive the gates of FETs TS1, TS2, . . . , TS6, respectively, and determine the ON or OFF states these FETs.

As described further above with respect to FIG. 16, configuration control bits (also referred to as configuration control logic states) programmed in NPSM 2400 may be used to form various routings between terminals A, B, C, and D. Exemplary interconnections achievable with NPSM 1600 are listed in Table 3 below.

TABLE 3

| Number of FETs in ON State | Possible Terminal Combinations | Comments |
|---|---|---|
| One | AB, AC, AD, BC, BD, CD | Independent paths |
| Two | AB & CD, AD & BC, AC & BD | Independent paths |
| Three | ABC, ABD, ACD, BCD | Shared paths |
| Four | ABCD | Shared paths |

In a read operation, if NRAM™ 2420 corresponds to NRAM™ 2200 (FIG. 22A), then one set of configuration control bits is C1-C6 is provided to PSM 2410 until the NRAM™ is reprogrammed. However, if NRAM™ 2420 corresponds to NRAM™ 2250 (FIG. 22B) then up to K different programmed configuration control bit sets corresponding to C1-C6 may be read out and PSM 2410 may assume multiple switch configuration by switching between multiple pre-programmed sets of bit states. The ability to rapidly change PSM 2210 signal routing configurations as often as once per clock cycle, enables reconfigurable computing for example. If the logic function or routing matrix to be programmed has the required configuration stored in NRAM™ arrays, then for relatively small NRAM™ arrays, configuration control bits (true and complement) may be changed in cycle times of 150 ps corresponding to clock frequencies of 6.7 GHz for example for a 90 nm technology node as described further above with respect to FIGS. 22A and 22B. If the clock is stopped and power is removed, the NPSM 2400 routing configuration remains unchanged.

NFPGA Enabled Reconfigurable Computing Using NSRAMs

FPGA architectures are dominated by interconnects. FPGAs are therefore much more flexible in terms of the range of designs that can be implemented and logic functions in the hundreds of thousands to millions and tens-of-millions of equivalent logic gates may be realized. In addition, the added flexibility enables inclusion of higher-level embedded functions such adders, multipliers, CPUs, and memory. The added interconnect (routing) flexibility of FPGAs also enables partial reconfiguration such that one portion of an FPGA chip may be reprogrammed while other portions are running FPGAs that can be reprogrammed while running may enable reconfigurable computing (reconfigurable systems) that reconfigure chip architecture to better implement logic tasks. The idea of reconfigurable computing is not new; however, implementation is limited by hardware capability and architecture and software. NRAM™s combined with FET switches and logic circuits to form NFPGAs enable the hardware portion of reconfigurable computing by providing nonvolatile configuration control bits (also referred to as nonvolatile configurable control logic states) that can change logic functions and signal routing in real time during chip operation and maintain such configurations in the absence of power as needed resulting in nonvolatile globally adaptive and reconfigurable capabilities in real time. Reconfigurable computing concepts are described by G. G. Yen, "Autonomous Neural Control in Flexible Space Structures," Chapter 93, pp. 1199-1202 in "The Industrial Electronics Handbook" edited by J. David Irwin, CRC Press LLC, 1997.

Reconfigurable computing involves both spatial and temporal partitions. NRAM™ 2250 as described further above with respect to FIG. 22B is designed to store K programmed combinations of configurable control bits (configurable control logic states) that can be read out at speeds as fast as 150 ps corresponding to 6.7 GHz for a 90 nm technology node for example so NRAM™ 2250 may be used to reconfigure programmable logic blocks and programmable switch matrices in real time providing both spatial and temporal partitions. In this example, NRAM™ 2250 enables the nonvolatile nanotube configurable logic block (NCLB) 2300 to be changed in as little time as one clock cycle (in pipeline mode) to support up to K logic configurations preprogrammed into NRAM™ 2250. Also, NRAM™ 2250 enables the nonvolatile nanotube programmable switch matrix (NPSM) 2400 to be reconfigured in as little time as one clock cycle (in pipeline mode) thereby rerouting signals in real time each cycle if needed. Nanotube bidirectional buffers described further above with respect to FIGS. 17A and 17B may also use NRAM™ configuration control bits (not shown) to redirect signal flow and change signal polarity, for example, in one cycle if needed. Hence, nonvolatile nanotube field programmable gate array (NFPGA) 2100 which is formed using various interconnected NCLBs and NPSMs may be configured spatially and temporally within one clock cycle when in a pipeline mode and over several cycles in non-pipelined operating mode.

Typically in reconfigurable computing, the number of spatial and temporal changes needed is relatively small. Reprogramming NRAM™s may only be needed less than a few thousand times for example. In some cases, small NRAM™ memories are all that is needed so a small number of configuration control bits may be preprogrammed. In the case of NCLB 2300, K=8 (eight word lines) can accommodate the various configurations illustrated in corresponding FIG. 14B. For NPSM 2400 various combinations of independent and shared routing configurations can be programmed as illustrated further above with respect to FIG. 24. If some NFPGA functions are not needed for certain computations for example, then power may be removed from these nonvolatile functions thereby eliminating standby power. Other NFPGA functions, embedded CPUs, memories, etc. May leverage these power savings by running faster at higher levels of power.

Embedded NRAM™ memories may be combined with FPGAs, CPUs and other functions. In applications requiring fast cache operation, read and write times are essentially the same and may require cycle times of 150 ps to support a 6.7 GHz clock rate for example. It may also be desirable to modify logic function and signal routing in one clock cycle without using preprogrammed functions that may not cover all configuration control bit requirements. In present generation NRAM™s write (erase/program) operations are significantly slower than read operations. Hence, nanotube-based SRAM nonvolatile memories (NSRAMs) may be desirable because high speed SRAM operation at read and write cycle times of 150 ps (90 nm technology node) is enabled which supports a clock cycle of 6.7 GHz with the ability to save SRAM states in a nonvolatile mode using nanotube-based nonvolatile switches as needed.

Figure 25:
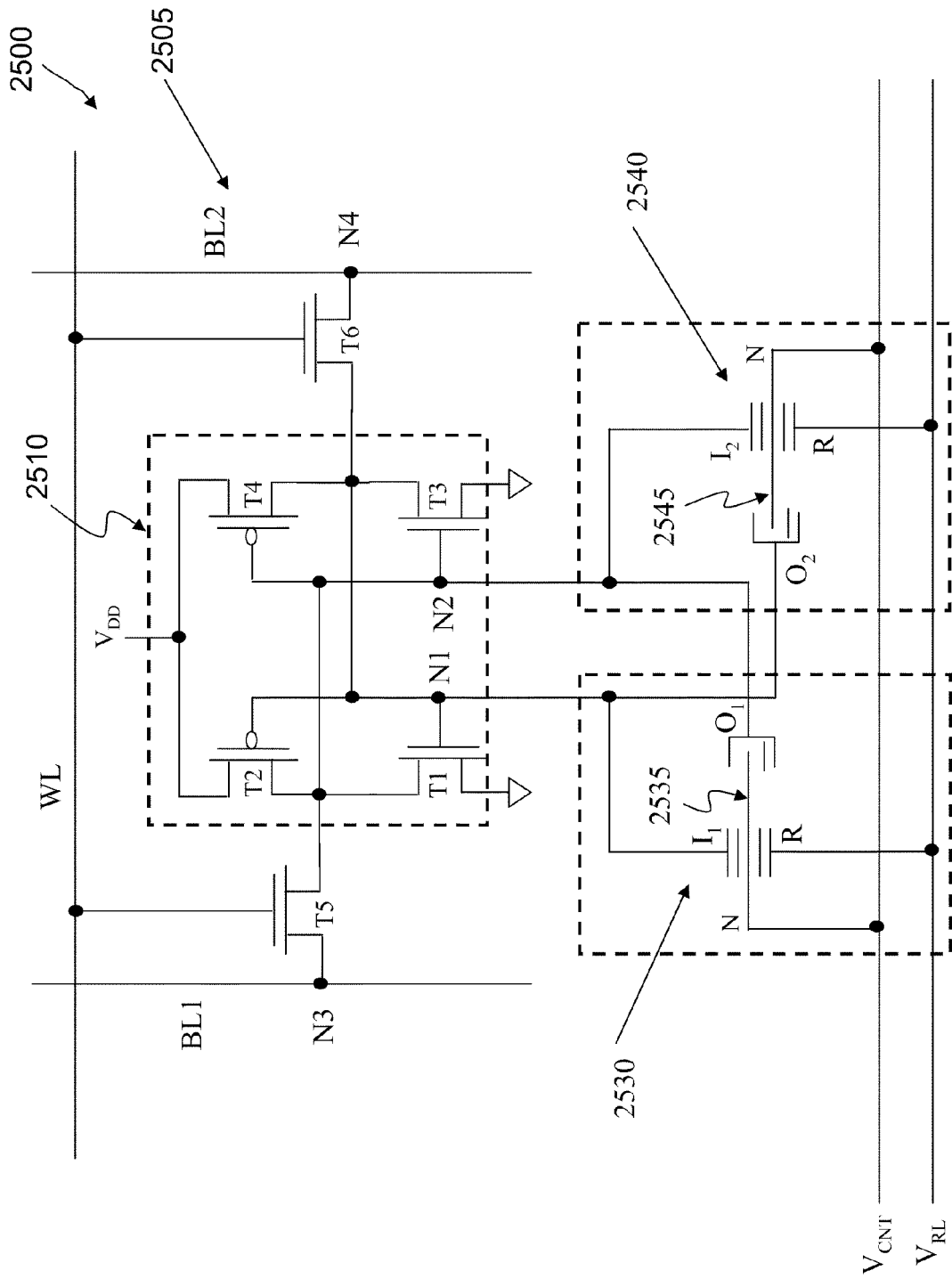
FIG. 25 shows a nonvolatile nanotube static random access memory (NSRAM) cell formed by combining an SRAM cell and a pair of nonvolatile nanotube switching elements.

U.S. Pat. No. 7,245,520 to Bertin et al., incorporated herein by reference, illustrates NSRAM memory cell 2500 that may be used to form high speed (actually any speed range from low to high speed) NSRAM memory by combining SRAM cell 2505 and a pair of nonvolatile nanotube switching elements 2530 and 2540. NSRAM memory cell 2500 includes a conventional SRAM cell formed by flip flop 2510 connected to word line WL and bit lines BL1 and BL2 by select transistors FET T5 and FET T6, respectively, as described in more detail in U.S. Pat. No. 7,245,520 which is hereby incorporated by reference. NSRAM memory cell 2500 also includes nonvolatile nanotube switching elements 2530 and 2540 used as nonvolatile nanotube shadow devices that can store NSRAM memory cell 2500 bit states in a nonvolatile mode prior to turn-off or loss of power and also recall (restore) flip flop 2510 bit states when NSRAM cell 2500 is reactivated (powered-up). Control wires $V_{CNT}$ and $V_{RL}$ are used to control the switching of nonvolatile nanotube switching elements 2530 and 2540 coupled to flip flop 2510 as shown in FIG. 25. A detailed description of NSRAM memory cell 2500 and its operation is described in the incorporated U.S. Pat. No. 7,245,520 reference. The structure and operation of nonvolatile nanotube switching elements 2530 and 2540 is described in detail in U.S. Pat. Nos. 6,990,009, 7,339,401 and U.S. patent application Ser. No. 11/971,476, filed on Jan. 9, 2008, each entitled "Nanotube-Based Switching Elements with Multiple Controls," and U.S. Pat. No. 7,071,023 and U.S. patent application Ser. No. 11/449,969, filed on Jun. 9, 2006, each entitled "Nanotube Device Structure and Methods of Fabrication," which are both hereby incorporated by reference.

Figure 26:
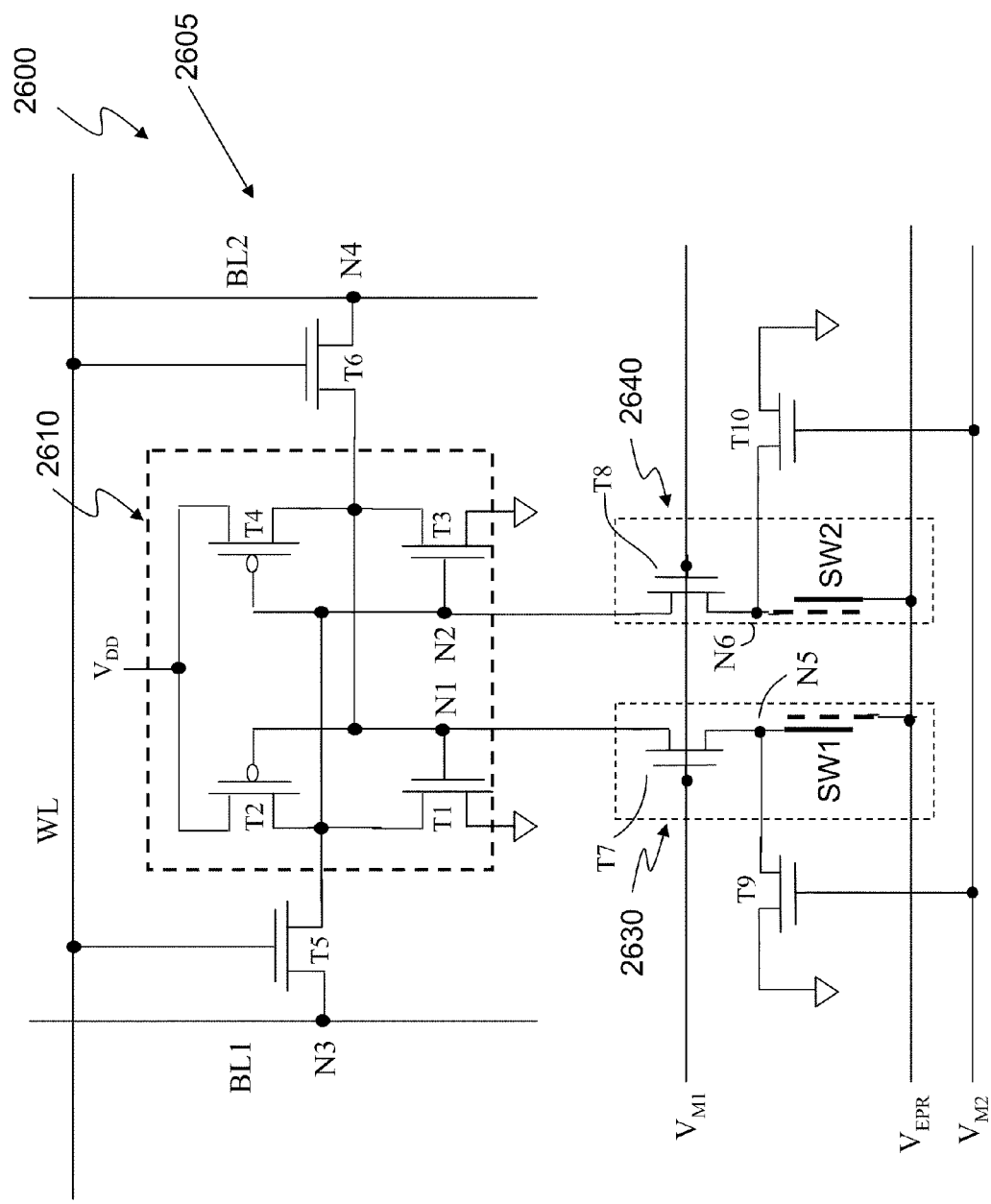
FIG. 26 shows another nonvolatile nanotube static random access memory (NSRAM) cell in which the pair of nonvolatile nanotube switching elements used in FIG. 25 are replaced by a pair of NRAM™ cells with mode control transistors.

An NSRAM memory may also be formed by replacing nonvolatile nanotube switching elements 2530 and 2540 in FIG. 25 with NRAM™ cells. Referring now to FIG. 26, NRAM™ cells 2630 and 2640 (corresponding to nonvolatile nanotube switching elements 2530 and 2540 in FIG. 25) act as shadow nonvolatile storage devices. Mode control transistors are added to support program and erase operations. NRAM™ cells 2630 and 2640 correspond to NRAM™ cell 1100 shown in FIG. 11A. Flip flop 2610 shown in FIG. 26 corresponds to flip flop 2510 shown in FIG. 25.

One embodiment NSRAM cells 2600 may be combined in rows and columns to form NSRAM memories. NSRAM cells 2600 includes a conventional SRAM cell formed by flip flop 2610 connected to word line WL and bit lines BL1 and BL2 by select transistors FET T5 and FET T6, respectively. A first terminal of NRAM™ cell 2630 select FET T7 is connected to a first terminal of NV NT switch (or NV NT block) SW1 at common node N5. A first terminal of mode select FET T9 is connected to common node N5. A second terminal of FET T7 is connected to node N1 of flip flop 2610 shown in FIG. 26 which corresponds to flip flop 2510 in FIG. 25. Mode select line $V_{M1}$ is connected to the gate of FET T7 and controls the ON/OFF state of FET T7. A second terminal of FET T9 is connected to a reference such as ground (zero volts) and mode select line $V_{M2}$ is connected to the gate of FET T9 and controls the ON/OFF state of FET T9. A second terminal of NV NT switch SW1 is connected to erase/program/read select line $V_{EPR}$.

A first terminal of NRAM™ cell 2640 select FET T8 is connected to a first terminal of NV NT switch (or NV NT block) SW2 at common node N6. A first terminal of mode select FET T10 is connected to common node N6. A second terminal of FET T8 is connected to node N2 of flip flop 2610 shown in FIG. 26 which corresponds to flip flop 2510 in FIG. 25. Mode select line $V_{M1}$ is connected to the gate of FET T8 and controls the ON/OFF state of FET T8. A second terminal of FET T10 is connected to a reference such as ground (zero volts) and mode select line $V_{M2}$ is connected to the gate of FET T10 and controls the ON/OFF state of FET T10. A second terminal of NV NT switch SW2 is connected to erase/program/read select line $V_{EPR}$.

An NSRAM memory (not shown) is formed in a conventional manner by a combination of rows and columns of NSRAM cells 2600 interconnected by shared approximately orthogonal word and bit lines. In operation, mode select line $V_{M1}$ is held at a low voltage such as ground and FET T7 and FET T8 are in an OFF state and shadow devices pairs formed by NRAM™ cell 2630 and 2640 are decoupled from flip flop 2610. Typically mode select line $V_{M2}$ is also held at ground turning FETs T9 and T10 OFF and program/erase/read line $V_{EPR}$ is at a low voltage such as ground. SRAM cells such as cell 2605 operate in a volatile mode with memory cycle times as fast as 150 ps for a CMOS technology at a 90 nm node. If SRAM power is to be removed or if power is about to be lost, then a store operation is performed in which FETs T7 and T8 are turned ON and the logic state of flip flop 2610 is transferred and stored in NRAM™ cell 2630 on NV NT switch (NV NT block) SW1 and a complementary state is stored in NRAM™ cell 2640 on NV NT switch (NV NT block) SW2. Power may then be removed. The stored logic state may be recalled (restored) during power up in the following way. $V_{EPR}$ may be held at ground or may be ramped to a voltage such as $V_{DD}$; SRAM cell 2605 voltage source is ramped to $V_{DD}$. Flip flop 2610 assumes a state corresponding to the true and complement logic states stored in NRAM™ cells 2630 and 2640 and the logic state of SRAM cell 2605 prior to power shutdown is restored and SRAM memory operation resumes. Store and recall (restore) operations are described in more detail in U.S. Pat. No. 7,245,520.

The integration of nanotube-based logic and memory functions as described further above results in what may be referred to as instant-OFF and instant-ON operations. The store operation that precedes power shut down may be performed in microseconds or milliseconds, for example, resulting in what may be referred to as an instant-OFF operation in which logic states and operating data are preserved in by nonvolatile nanotube switches or blocks. The recall (restore) operation may be performed as part of a power-ON operation typically requiring microseconds or milliseconds, for example. Since logic states and data are restored within a power-ON time interval and operational with the system initialized to pre-power-OFF logic states and data, such recall (restore) operations may be referred to as instant-ON.

An erase operation may be performed just prior to a store operation or at any time when FETs T7 and T8 are in an OFF state. During an erase operation, mode select line $V_{M2}$ is set at a high voltage such as 2.5 volts for example and FETs T9 and T10 are turned on grounding nodes N5 and N6, respectively. Then, $V_{EPR}$ applies one or more erase pulses with an amplitude in the range of 5 to 7 volts and rise times in the nanosecond range for example to a second terminal of NV NT switches SW1 and SW2 and switches SW1 and SW2 are switched to high resistance states such as 1 G Ohm or higher.

A program operation may be used store the logic content of flip flop 2610 on switches SW1 and SW2 in a nonvolatile mode prior to the removal of power. FETs T9 and T10 are in an OFF state and NRAM™ cell 2630 select FET T7 and NRAM™ cell 2640 select FET T8 are activated to an ON state. In this example, NV NT switches SW1 and SW2 are in a high resistance (OFF) state. Then, $V_{EPR}$ applies one or more program pulses with an amplitude in the range of 3 to 5 volts and rise times in the microsecond range for example to a second terminal of NV NT switches SW1 and SW2. If flip flop 2610 node N1 is at a low voltage and node N2 is at a high voltage, then SW1 is programmed to a low resistance value such as 100 k Ohms for example and SW2 remains in a high resistance state such as 1 G Ohm. However, if flip flop 2610 node N1 is at a high voltage and node N2 is at a low voltage, then SW1 is programmed remains at a resistance state such as 1 G Ohms for example and SW2 switches to a low resistance state such as 1 k Ohm.

In a program operation to store the state of flip flop 2610, flip flops in some (or all) rows may transfer logic states to corresponding nonvolatile NRAM™ cells. However, program pulses may disturb some flip flops during the store operation. In order to minimize the risk of disturbing the state of flip flop 2610, transfer may be carried out one word line at a time for a word line within a subset of word lines corresponding to a subset of latches. In this case, the logic state of flip flop 2610 is read out and bit line BL1 and BL2 are held at true and complement high/low or low/high values by corresponding sense amplifier/latches for each bit line pair such as bit lines BL1 and BL2. Select transistors FETs T5 and T6 are in an ON state, bit line BL2 connected to node N4 holds node N1 at a low (or high) voltage and bit line BL1 connected to node N3 holds node N2 at a high (or low) voltage. In this way, program currents flow to bit lines BL1 or BL2 (whichever is at a low voltage) without disturbing the state of flip flop 2610. For unselected rows, select transistors corresponding to select transistor FETs T5 and T6 are in an OFF state so that corresponding flip flops are not disturbed.

In addition to fast programmable logic reconfiguration, NSRAMs may also be used to form high speed embedded nonvolatile caches used in conjunction with NFPGAs, CPUs, ASICs, analog, and other functions all integrated on the same chip.

Nanotube Configurable Logic Blocks (NCLB) & Nanotube Programmable Switch Matrix (NPSM) Using Nonvolatile NS/R-Controlled Select Circuit to Form Nonvolatile Nanotube Configuration Control Register (NCCR)

Various nonvolatile nanotube configuration control registers (NCCRs) are combined with CLB and PSM functions to form NCLB and NPSM building blocks that may be integrated to form NFPGA logic as described with respect to FIGS. 19-26 illustrated further below. Nonvolatile nanotube configuration control registers (NCCRs) are form using nonvolatile nanotube shift register (N-S/R) stages.

NFPGA Function and Operation Using Nonvolatile Nanotube Configuration Control Registers (NCCRs)

Since FPGA architectures are dominated by interconnects, it may be advantageous to use configuration control registers to provide configuration control bits, typically one control bit per shift register stage (also referred to as a shift register cell). This is because the number of shift register stages and therefore the number of configuration control bits may be increased to any size while keeping the number of inputs the same. In the case of NRAM™s for example, as array size increases to provide more configuration control bits, decoder size increases requiring a larger number of inputs such as inputs illustrated in FIGS. 22A and 22B. Configuration control registers may also be used instead of nonvolatile nanotube select circuits illustrated in FIGS. 11B and 12A for example. Configuration control registers formed using typical shift register (S/R) stages are volatile in operation; that is the logic states of the shift register stages are lost when power is lost or removed. In order to replace nonvolatile NRAM™s and nonvolatile nanotube select circuits described further above in various NFPGA architectures, configuration control registers need to be nonvolatile as well. U.S. Pat. No. 7,394,687 and U.S. patent application Ser. No. 12/165,007, filed on Jun. 30, 2008, entitled "Non-Volatile Shadow Latch Using a Nanotube Switch," herein incorporated by reference teaches the addition of NV NT switches to shift register stages (cells), typically one NV NT switch per stage, to form nonvolatile nanotube shift registers (NS/Rs) that are used to form nonvolatile nanotube configuration control registers (NCCRs) which operate in a high speed volatile mode at clock rates of 6.7 GHz at 2.5 volts for a CMOS 90 nm technology node for example, or at slower speeds but lower power at a lower voltages such as 1 volt for example. Nonvolatile NCCRs can store information in NV NT switches in the absence of power. When power is restored, the high resistance or low resistance states of each NV NT switch is used to restore individual corresponding NS/R stages to the logic states prior to power shut-down or loss. The NS/R registers described in U.S. Pat. No. 7,394,687 and U.S. patent application Ser. No. 12/165,007, filed on Jun. 30, 2008, entitled "Non-Volatile Shadow Latch Using a Nanotube Switch," may provide nonvolatile configuration control bits, one per stage, by connecting a wire directly to the output of each output stage. Alternatively, an FET may be used as a transfer gate to provide configuration control bits when the FET is in an ON state.

Figure 27:
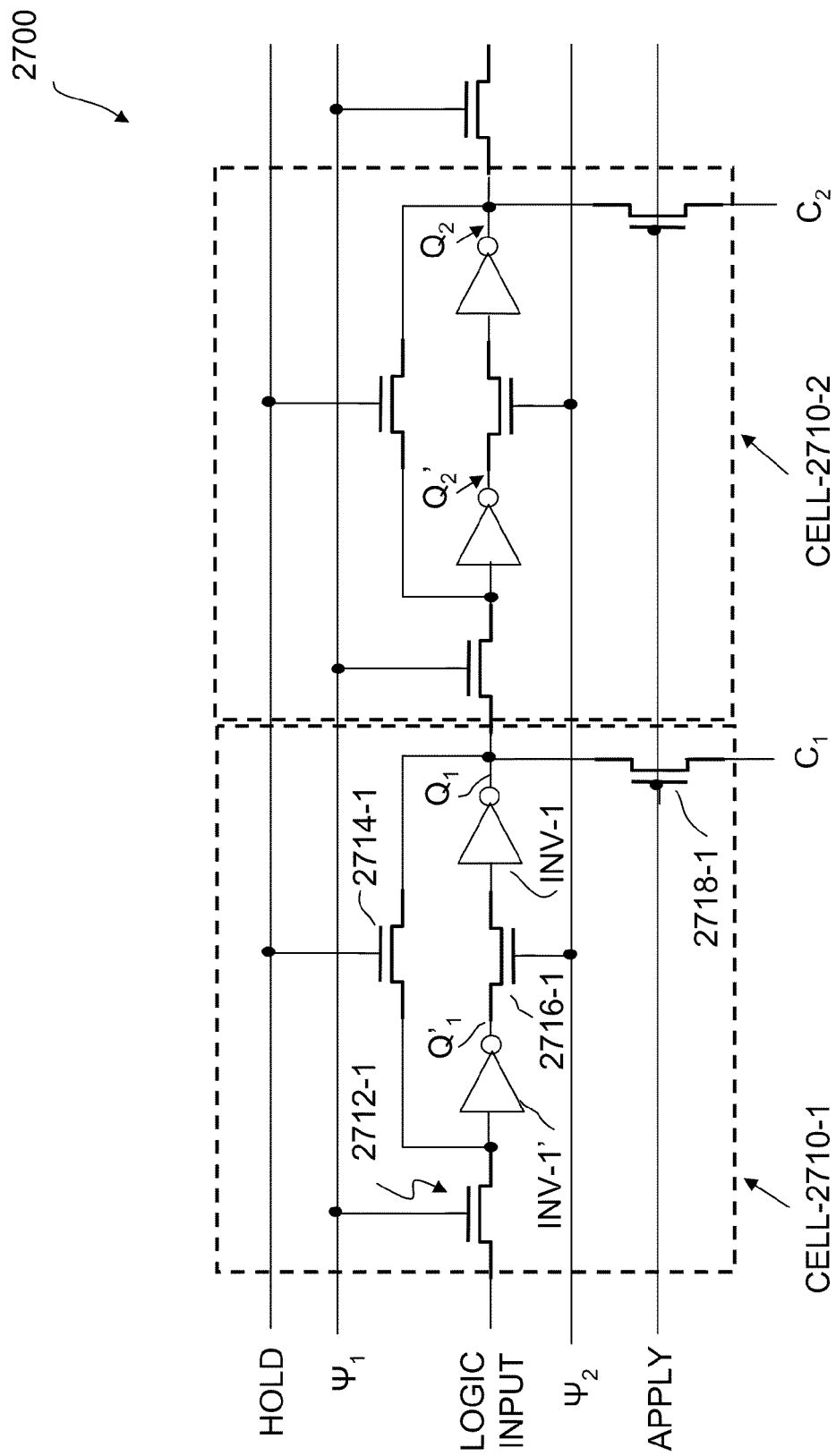
FIG. 27 shows two stages of a configuration control register that provides configuration control bits.

It is desirable for individual NS/R stages to be as small as possible for greater layout density. A configuration control register of greater density involving fewer numbers of FETs and interconnections per stage than those described in U.S. Pat. No. 7,394,687 and U.S. patent application Ser. No. 12/165,007, filed on Jun. 30, 2008, entitled "Non-Volatile Shadow Latch Using a Nanotube Switch," is shown in U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," which is herein incorporated by reference and illustrated in FIG. 27. FIG. 27 corresponds to similar configuration control registers described in US Pat. Re. 34,363.

Figure 23:
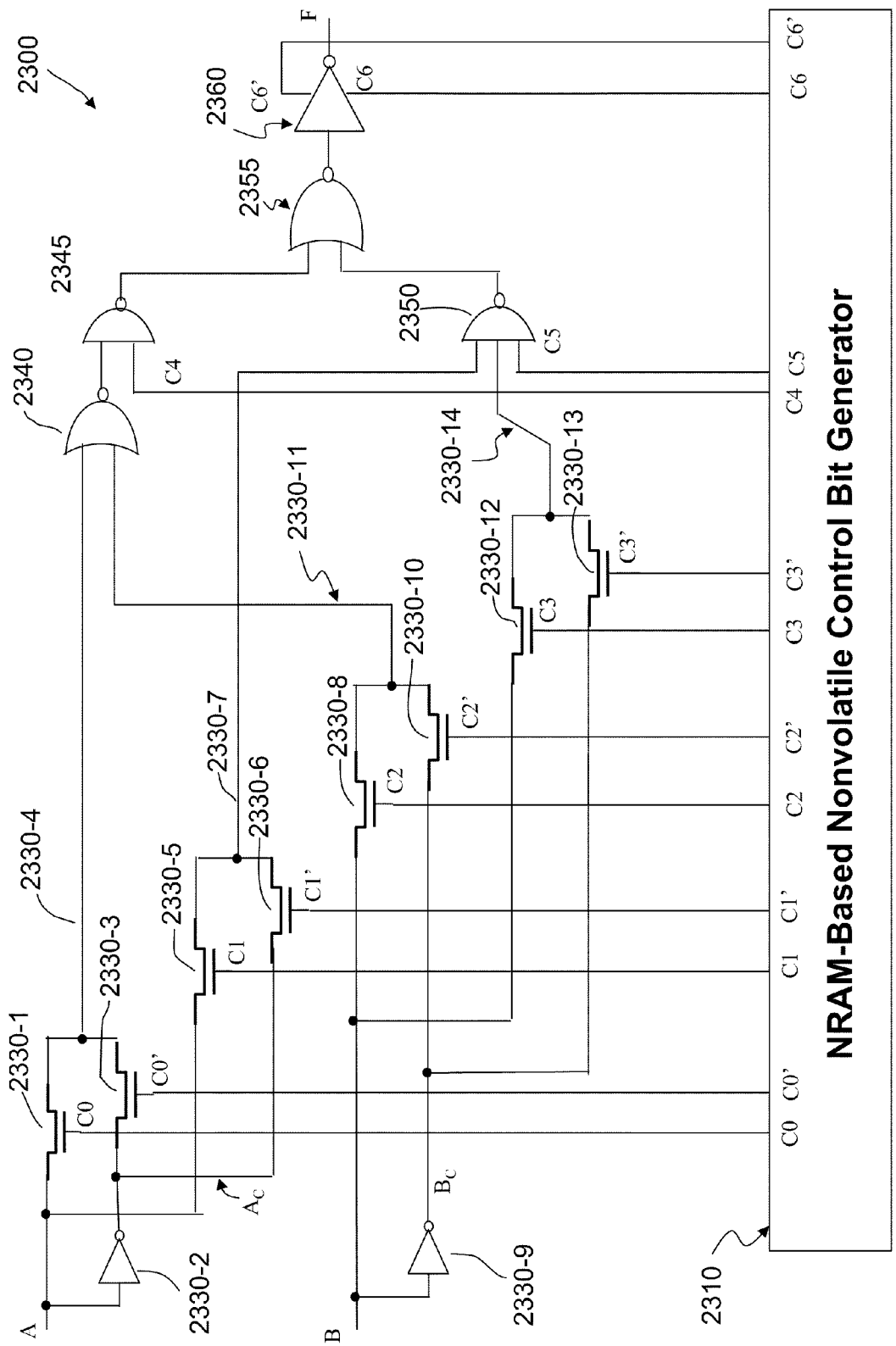
FIG. 23 shows a nonvolatile nanotube configurable logic block (NCLB) formed using transfer gates, NAND, NOR, and tristate circuits whose logic function is determined by nonvolatile true and complement control bits generated by a nonvolatile NRAM™ memory such as described with respect to FIG. 22A or FIG. 22B.

FIG. 27 illustrates a schematic representation of a configuration control register 2700 showing two stages of a multi-stage shift register. Although configuration control register 2700 shows two shift register cells, a configuration control register contains as many cells as required to configure the logic element. For example, if seven configuration control bits (logic states) are required as illustrated in FIG. 23, then a seven stage configuration control register is used; if six configuration control bits (logical states) are required as illustrated in FIG. 24, then a six stage configuration control register is used. A basic shift register cell includes transfer device 2712-1 in series with inverter INV-1', in series with transfer device 2716-1 which is in series with inverter INV-1. The output Q1 of inverter INV-1 is fed back to the input of inverter INV-1' through transfer device 2714-1 enabling shift register CELL-2710-1 (shift register stage 1) to store a logic state as long as a power source is maintained (volatile shift register operation) to configuration control register 2700 and the HOLD voltage is held high. The output Q1 of inverter INV-1 also connects to the input of shift register CELL-2710-2, which is identical to shift register cell 1, and also connects to one terminal of transfer device 2718-1. The output Q1' of inverter INV-1' connects to the input of transfer device 2716-1. Two non-overlapping clocks $\Psi 1$ and $\Psi 2$ connect to control gates of transfer devices 2712-1 and 2716-1, respectively, and to corresponding transfer devices in other shift register cells. Transfer device 2714-1 and corresponding devices in other cells enable or disable the feedback path between INV-1 output and INV-1' input depending on the state of the HOLD input. Desired configuration control bit (logic state) data is transmitted to configuration control register 2700 by a LOGIC INPUT signal until each shift register cell (or stage) such as shift register CELL-2710-1 and CELL-2710-2 store the desired bit (logic state). Then APPLY control input is activated, and outputs Q1 and Q2 supply outputs configuration control bits such as C1 and C2 that may be applied to reconfigurable logic functions such as illustrated in FIG. 23 and programmable switch matrices such as illustrated in FIG. 24. Outputs Q2 and Q2' in shift register CELL-2710-2 corresponds to outputs Q1 and Q1' in shift register CELL-2710-1, respectively, described further above.

In operation, the entire configuration control register 2700 may be set to a high or low voltage by setting $\Psi 1$ and $\Psi 2$ voltage high and HOLD voltage low. Alternatively, with HOLD set at a high voltage, clocks $\Psi 1$ and $\Psi 2$ may be used to transfer a logic pattern of 1's and 0's into the shift register to store desired bit (logic states) in each of the shift register stages. Enough time must be allowed for the input signal LOGIC INPUT to propagate the entire length of configuration control register 2700. At that point in time, APPLY may transition to a positive voltage and outputs Q1 and Q2 supply configuration control bits (logic states) C1 and C2 that may be applied to reconfigurable logic functions such as illustrated in FIG. 23 and programmable switch matrices such as illustrated in FIG. 24.

It is desirable to have nonvolatile configuration control registers for NFPGA applications. One approach is to use the nonvolatile shift registers described in U.S. Pat. No. 7,394,687 and U.S. patent application Ser. No. 12/165,007, filed on Jun. 30, 2008, entitled "Non-Volatile Shadow Latch Using a Nanotube Switch." Such nonvolatile shift registers are compatible with high speed operation and may also be used to hold logic states when power is removed or lost and then logic states recalled (restored) when power is restored as described in U.S. Pat. No. 7,394,687 and U.S. patent application Ser. No. 12/165,007, filed on Jun. 30, 2008, entitled "Non-Volatile Shadow Latch Using a Nanotube Switch." However, since in some NFPGA architectures it is desirable for individual NS/R stages to be as small as possible for greater layout density, adding a coupling circuit and one NV NT switch (or NV NT block) to each stage of a configuration control register that uses a fewer number of FETs and interconnections per stage than those described in U.S. Pat. No. 7,394,687 and U.S.

patent application Ser. No. 12/165,007, filed on Jun. 30, 2008, entitled "Non-Volatile Shadow Latch Using a Nanotube Switch" is desirable. FIG. 28 illustrates nonvolatile nanotube configuration control register (NCCR) 2800 formed using two NS/R stages in which one coupling circuit per stage and one NV NT switch (or NV NT block) per stage is added to configuration control register 2700 illustrated in FIG. 27.

Figure 28A:
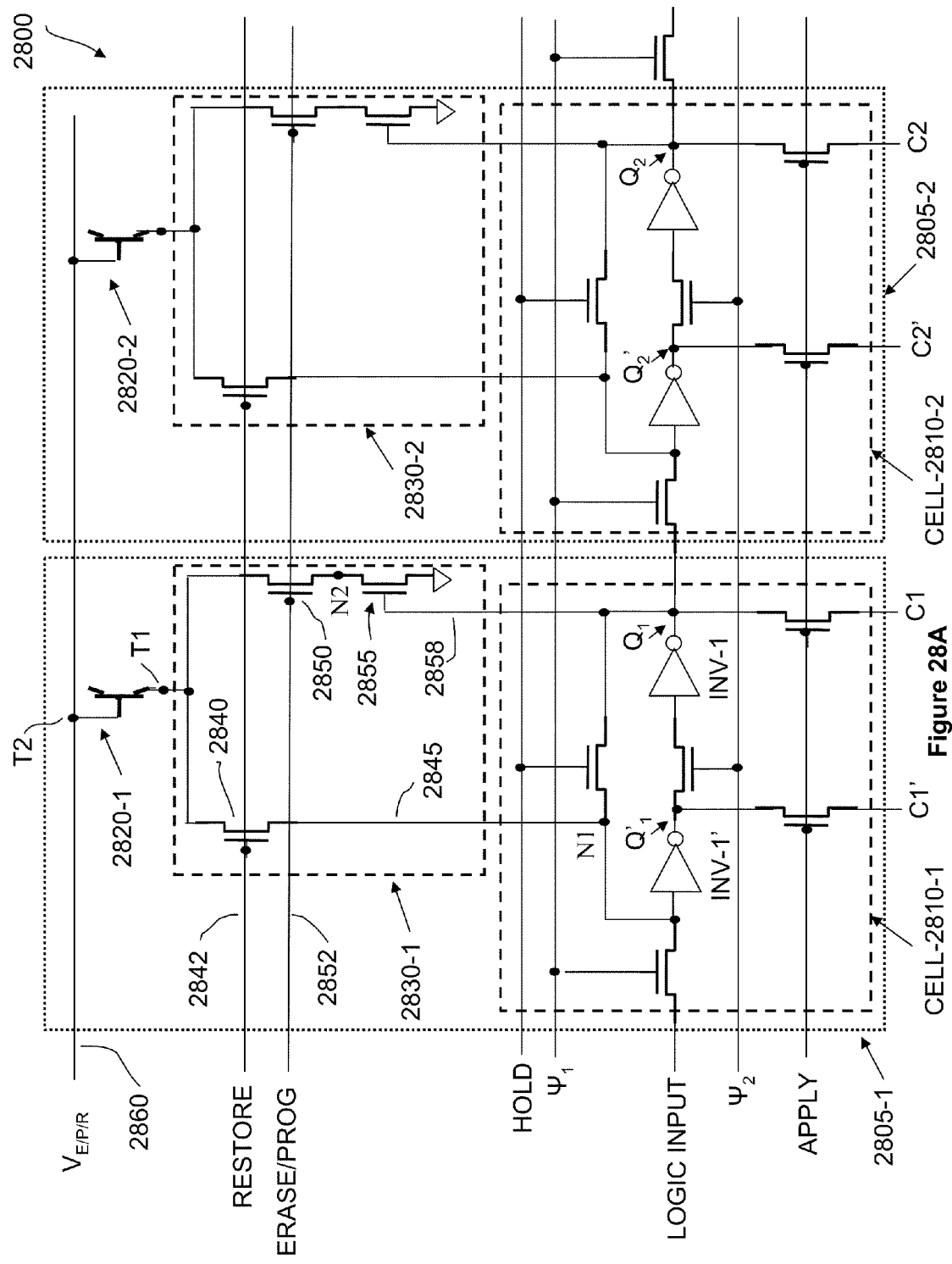
FIG. 28A shows two stages of a nonvolatile nanotube configuration control register that provides nonvolatile configuration control bits. The logic state of the nanotube configuration control register (NCCR) may be stored in, and recalled from, nonvolatile high or low resistance states in nonvolatile nanotube switches. Both nonvolatile nanotube switches (one per register stage) are shown in a low resistance (ON) state.
Figure 28B:
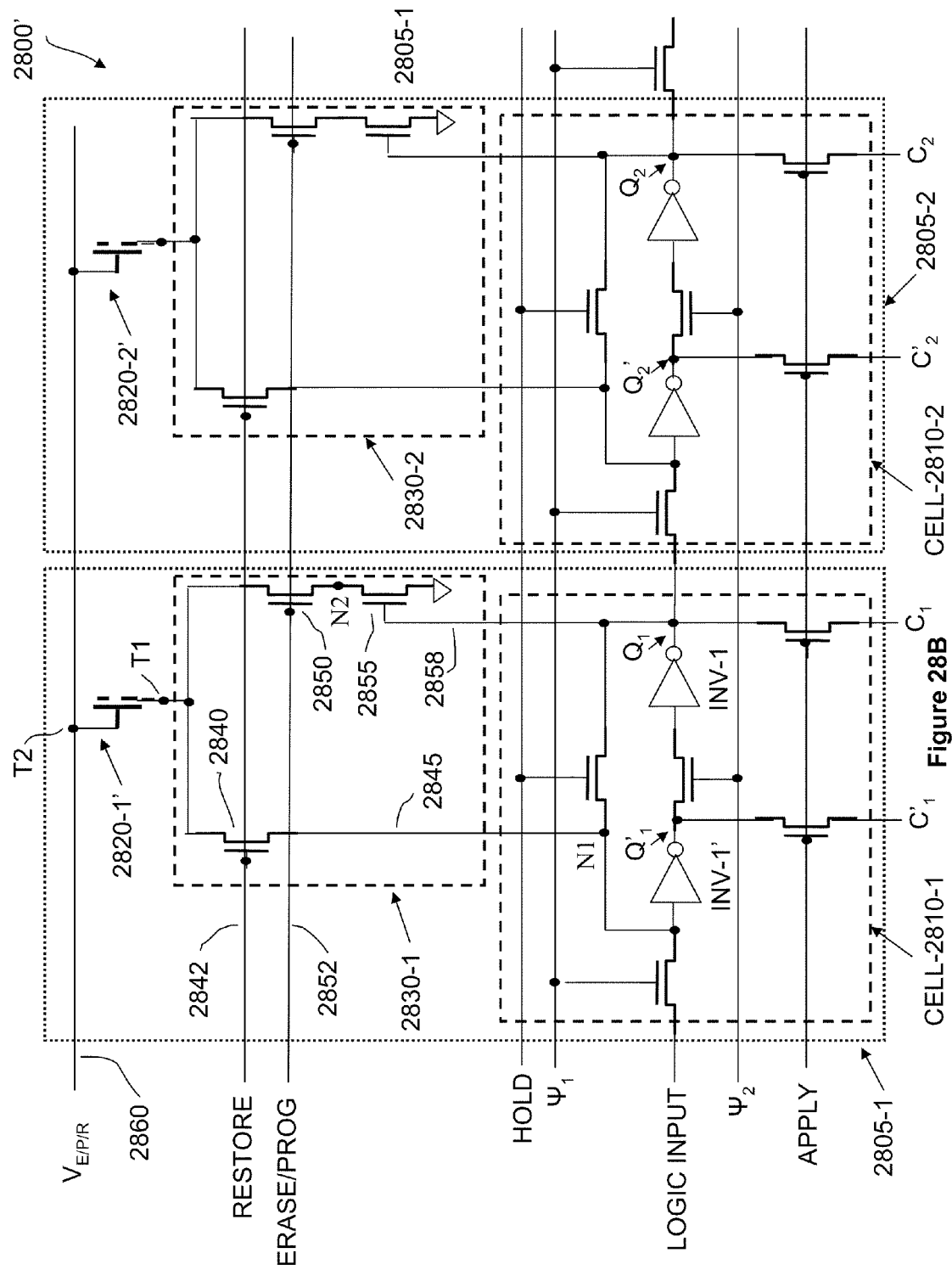
FIG. 28B shows the nonvolatile nanotube configuration control register of FIG. 28A with both nonvolatile nanotube switches set in a high resistance (OFF) state.
Figure 28C:
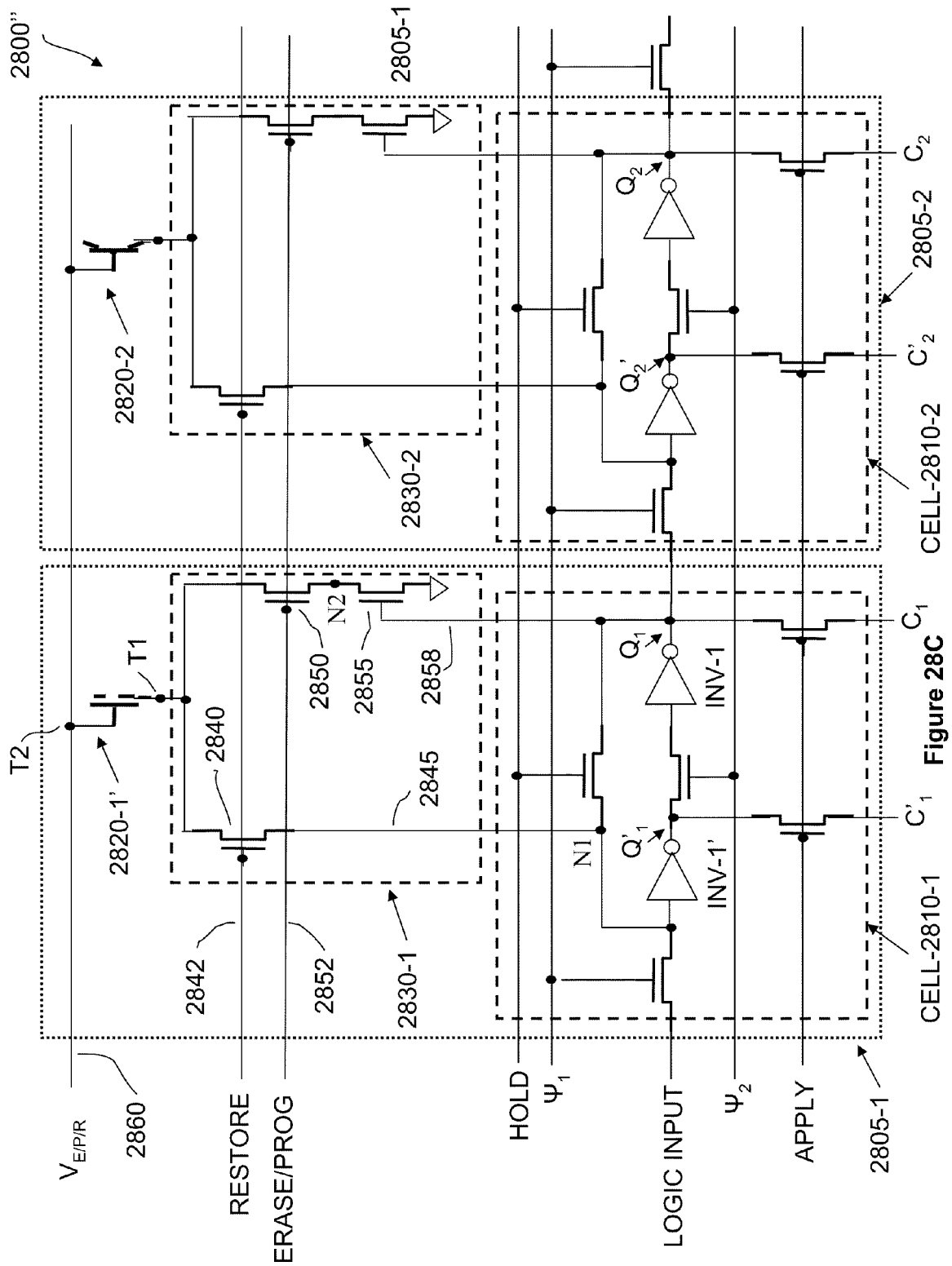
FIG. 28C shows the nonvolatile nanotube configuration control register of FIG. 28A with one nonvolatile nanotube switch is in a high resistance (OFF) state and another nonvolatile nanotube switch is in a low resistance (ON) state.

FIGS. 28A-28C illustrate an embodiment of a two stage nonvolatile nanotube configuration control register (NCCR) 2800 formed using nonvolatile nanotube shift register (NS/R) stages 2805-1 and 2805-2. NS/R stage 2805-1 includes CELL-2810-1 which corresponds to CELL-2710-1 in FIG. 27 with NV NT switch (or NV NT block) 2820-1 coupled to CELL-2810-1 by coupling circuit 2830-1. Optional complementary outputs C1' and C2' are included since the outputs of inverters INV-1 and INV-1' are complementary. However, complementary outputs may instead be generated from a single output such as C1 by adding an inverter to the output C1 as illustrated in FIG. 22A for example. NS/R stage 2805-2, with input driven by the output of NS/R stage 2805-1, includes CELL-2810-2 which corresponds to CELL-2710-2 in FIG. 27 with NV NT switch (or NV NT block) 2820-2 coupled to CELL-2810-2 by coupling circuit 2830-2. NS\R stages 2805-1 and 2805-2 are identical so the NS\R stage 2805-1 description applied to NS\R stage 2805-2 as well or to any additional stages (not shown) that may be added. NV NT switch 2820-1 operation corresponds to the operation of NV NT switch 1110 illustrated in FIG. 11A or NV NT switch NT00 illustrated in FIG. 19.

The CELL-2810-1 schematic and operation correspond to CELL-2710-1 schematic and operation described further above with respect to FIG. 27. Restore FET 2840 ON and OFF states are controlled by a restore voltage (pulse) applied to the gate of restore FET 2840 by wire 2842 which also controls other restore FET devices. A first terminal of restore FET 2840 is connected to node N1 of CELL-2810-1 by wire 2845. Restore FET 2840 is activated (turned ON) during a recall (restore operation) and is used to transfer the stored high or low resistance state corresponding to a bit (logic) state to CELL-2810-1. A second terminal of restore FET 2840 is connected to terminal T1 of NV NT switch 2820-1. Terminal T2 of NV NT switch 2820-1 is connected to common wire 2860 which supplies erase, program, or read pulses VE/P/R to NV NT switch 2820-1 and other NV NT switches. Erase/program FET 2850 ON and OFF states are controlled by an erase/program voltage (pulse) applied to the gate of erase/program FET 2850 by wire 2852 which also controls other erase/program FET devices. Erase/program FET 2850 has a first terminal connected to NV NT switch terminal T1 and a second terminal to common node N2 which is also connected to a first terminal of FET 2855. A second terminal of FET 2855 is connected to a reference voltage such as ground. The gate of FET 2855 is connected to output Q1 of CELL-2810-1 by wire 2858. If Q1 is at a high voltage such as 2.5 volts for example, then FET 2855 is ON and node N2 is at ground. However, if Q1 is a low voltage such as ground (zero volts) then FET 2855 is OFF and there is no continuous path between node N2 and ground. The ON or OFF state of FET 2855 determines whether NV NT switch 2820-1 is programmed to a high or low resistance state which is then stored in a nonvolatile mode.

In operation, NV NT switches such as NV NT switch 2820-1 are in ON or low resistance state as fabricated although some process methods may be used that result in normally OFF states after fabrication as described with respect to U.S. Patent Application No. 61/074,241, filed on Jun. 20, 2008, entitled "NRAM Arrays with Nanotube Blocks, Nanotube Traces, and Nanotube Planes and Methods of Making Same." NV NT switch 2820-1 acts as a shadow nonvolatile storage device which is only activated in a store (save) operation or in a recall (restore) operation. The operation of nonvolatile nanotube configuration control register (NCCR) 2800 is similar to operation of nonvolatile nanotube registers described with respect to U.S. Pat. No. 7,394,687 and U.S. patent application Ser. No. 12/165,007, filed on Jun. 30, 2008, entitled "Non-Volatile Shadow Latch Using a Nanotube Switch," and corresponding NV NT switches described in U.S. patent application Ser. No. 11/280,786, filed on Nov. 15, 2005, entitled "Two-Terminal Nanotube Devices and Systems and Methods of Making," U.S. patent application Ser. No. 11/274,967, filed on Nov. 15, 2005, entitled "Memory Arrays Using Nanotube Articles with Reprogrammable Resistance U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," U.S. patent application Ser. Nos. 11/835,651, 11/835,759, 11/835,845, 11/835, 852, 11/835,856, 11/835,865, each filed on Aug. 8, 2007, entitled "Nonvolatile Nanotube Diodes and Nonvolatile Nanotube Blocks and Systems Using Same and Methods of Making Same," and U.S. patent application Ser. No. 11/835, 613, filed on Aug. 8, 2007, entitled "Memory Elements and Cross Point Switches and Arrays of Same Using Nonvolatile Nanotube Blocks," as well as the operation of switch 1110 in FIG. 11A, switches 1155 and 1160 illustrated in FIG. 11B and switch NT00 illustrated in FIG. 19 for example.

Various operating modes may be used. In this example, NV NT switches such as NV NT switch 2820-1 are assumed to be ON as fabricated. So first, an erase operation is performed on NV NT switches such as NV NT switch 2820-1 resulting in a transition from an ON low resistance state such as 100 k Ohms for example to an OFF high resistance state of 1 G Ohm or higher. In an erase operation, the HOLD voltage is set to a low voltage such as ground and $\Psi1$ and $\Psi2$ voltages are set to a high voltage such as 2.5 volts for example. With LOGIC INPUT held at a high voltage such as 2.5 volts Q1 is held at 2.5 volts and turns erase/program FET 2855 ON. ERASE/PROGRAM voltage is set to a high voltage such as 2.5 volts for example and erase/program FET 2850 is turned ON establishing a conductive path between NV NT switch terminal T1 and ground. RESTORE voltage is held at a low voltage such as ground so that restore FET 2840 is OFF. Then, VE/P/R provides erase pulses to node T2 of NV NT switch 2820-1. One or more pulses with voltages in the 5 to 7 volt range and rise times in the nanosecond range may be used for example. NV NT switch 2820-1 transitions from an ON state to an OFF state (low to high resistance state). Corresponding NV NT switch 2820-2 also transitions to an OFF state as illustrated by nonvolatile nanotube configuration control register (NCCR) 2800' in FIG. 28B.

Alternatively, another FET (not shown) may have a first terminal connected to node N2, a second terminal connected to a voltage source which may be pulsed or may be at ground, and a gate controlled by a second erase/program line. In this way, an erase operation for example, may be performed independently of CELL-2810-1. Various coupling circuit examples are described in U.S. Pat. No. 7,394,687 and U.S. patent application Ser. No. 12/165,007, filed on Jun. 30, 2008, entitled "Non-Volatile Shadow Latch Using a Nanotube Switch."

NCCR 2800' is the same circuit as NCCR 2800 except that NV NT switches 2820-1 and 2820-2 are in OFF or high resistance states. CELL-2810-1 and CELL-2810-2 and other stages (not shown) may operate in a volatile mode whenever coupling circuits 2830-1 and 2830-2 decouple corresponding NV NT switches 2820-1 and 2820-2 from CELL-2810-1 and CELL-2810-2, respectively, regardless of the low or high resistance states of NV NT switches. Coupling circuit 2830-1, which is the same as coupling circuit 2830-2, maintains an OFF state by keeping restore FET 2840 and erase/program FET 2850 each in an OFF state with low RESTORE and ERASE/PROGRAM voltages, respectively. Nonvolatile nanotube configuration control registers are operated in a volatile mode with high voltages such as 2.5 volts supplied to inverters INV-1 and INV-1' for example.

In a store (save) operation, NV NT switches are programmed from a high resistance state to a low resistance state or left in a high resistance state. With restore FET 2840 in an OFF state, erase/program FET 2850 is turned ON. If FET 2855 is an ON state because Q1 is at a high voltage such 2.5 volts, then a continuous path exists between NV NT switch 2820-1 terminal T1 and ground. If one or more programming pulses VE/P/R of 3-5 volts and microsecond rise times are applied to terminal T2 of NV NT switch 2820-1, then NV NT switch 2820-1 transitions from a high resistance state such as 1 G Ohm to a low resistance state such as 100 k Ohms for example. However, if FET 2855 is OFF because Q1 is at a low voltage such as ground, then there is no path between NV NT 2820-1 terminal T1 and ground and NV NT switch 2820-1 remains in a high resistance state. After the state of NV NT switch 2820-1 and other NV NT switches such as NV NT switch 2820-1 have been programmed, then power may be removed and the logic state of CELL-2810-1 and CELL-2810-2 are preserved in a nonvolatile mode as corresponding high or low resistance states. In this example, nonvolatile nanotube configuration control register 2800" shows NV NT switch 2820-1 in a high resistance state and NV NT switch 2820-2 programmed to a low resistance state as illustrated in FIG. 28C. Note that NCCR 2800, NCCR 2800', and NCCR 2800" all correspond to the same circuit with NV NT switches in various combinations of low (ON) and high (OFF) resistance states.

In a recall (restore) operation, erase/program FET 2850 is held in OFF state. A voltage is applied to CELL-2810-1 (typically, a voltage source is ramped to 2.5 volts for example). With HOLD, Ψ1, and Ψ2 at high voltages such as 2.5 volts and a LOGIC INPUT of zero volts, node N1 is held at ground by output Q1 of INV-1. Then Ψ1 voltage transitions to a low voltage state and decouples all individual register stages such as CELL-2810-1 from one another and voltage. With VE/P/R having transitioned to a recall (restore) voltage value applied to wire 2860 and to node T2, restore FET 2840 is turned ON and a conductive path is established between NV NT switch 2820-1 terminal T1 and CELL 2810-1 node N1. If NV NT switch 2820-1 is in a low resistance (ON) state, then node N1 is forced to a high voltage state such as 2.5 volts as does the output Q1 of INV-1. However, if NV NT switch 2820-1 is in a high resistance (OFF) state, then N1 remains at a low voltage. Restore FET 2840 is turned OFF and the recall (restore) operation is finished. U.S. Pat. No. 7,394,687 and U.S. patent application Ser. No. 12/165,007, filed on Jun. 30, 2008, entitled "Non-Volatile Shadow Latch Using a Nanotube Switch" provides various store (save) and recall (restore) examples.

NCLB Function and Operation Using Nonvolatile Nanotube Configuration Control Registers (NCCRs)

Nonvolatile nanotube configuration control registers (NC-CBs) may be used to generate nonvolatile configuration control bits (logic states) for NCLB functions. For example, a NCCB may be used instead of nonvolatile nanotube select circuits illustrated by NCLB 1400 shown in FIG. 14A. Also, a NCCB may used instead of NRAM™-based nonvolatile configuration control bits (logic states) illustrated by NCLB 2300 shown in FIG. 23.

Figure 29:
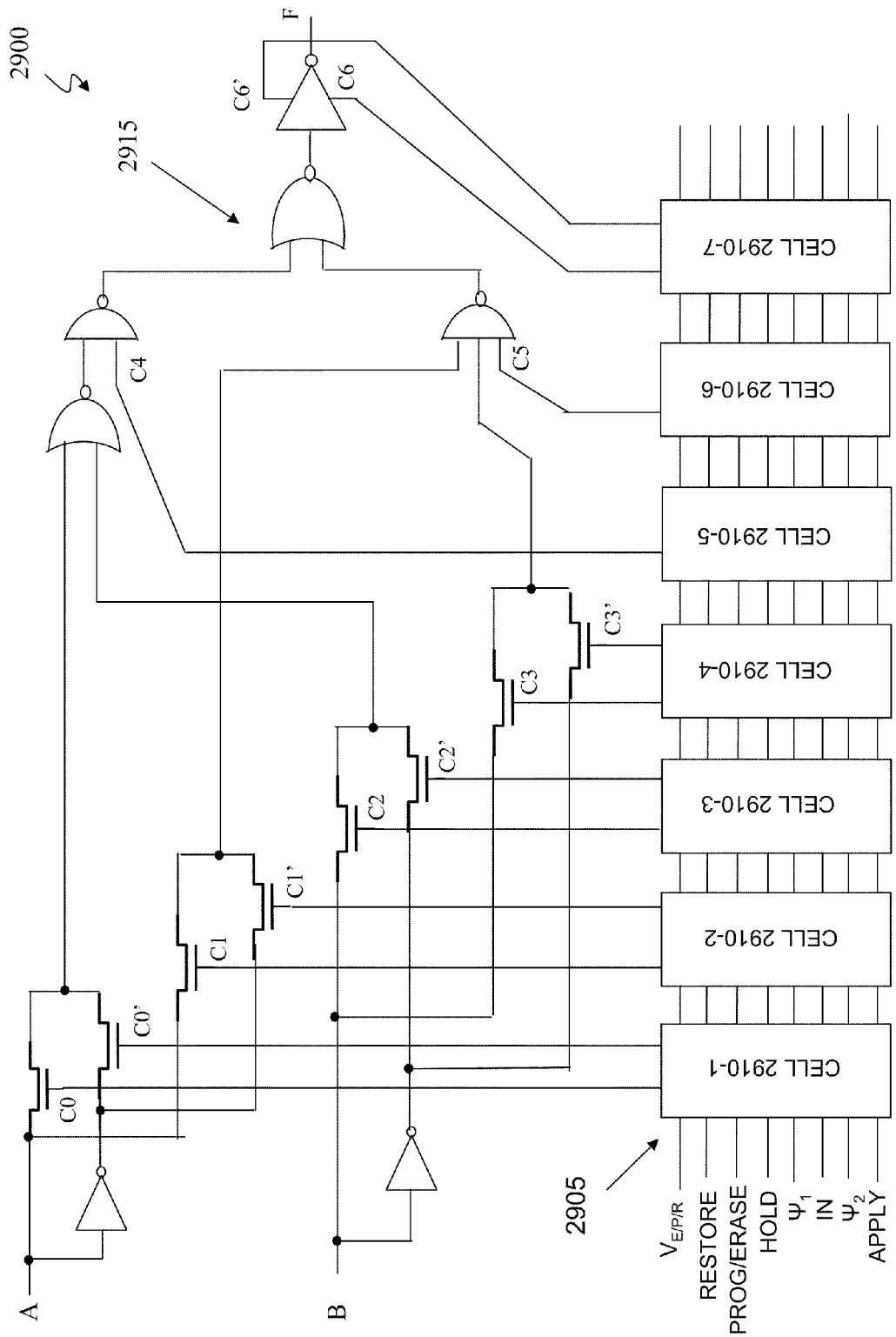
FIG. 29 shows a nonvolatile nanotube configurable logic block (NCLB) formed using transfer gates, NAND, NOR, and tristate circuits whose logic function is determined by nonvolatile true and complement configuration control bits provided by the nonvolatile nanotube configuration control register shown in FIG. 28.

FIG. 29 illustrates an embodiment NCLB 2900 with nonvolatile nanotube configuration control register (NCCB) 2905 generating nonvolatile configuration control bits (logic states) C0, C0', . . . , C6 and C6'). NCLB 2900 uses seven NS/R stages CELL 2910-1, CELL 2910-2, . . . , CELL 2910-7 to provide the required configuration control bits. The operation of NCCR 2900 corresponds to the operation described with respect to NCCR 2800, 2800', and 2800" in FIGS. 28A-28C. Reconfigurable logic 2915 is the same as shown in FIGS. 14 and 23 and described in detail further above with respect to these figures. FIG. 14B shows logic configurations corresponding to various configuration control bit combinations; and FIG. 15 illustrates equivalent circuits as described further above.

NPSM Function and Operation Using Nonvolatile Nanotube Configuration Control Registers (NCCRs)

Nonvolatile nanotube configuration control registers (NC-CBs) may be used to generate nonvolatile configuration control bits (logic states) for NPSM functions. For example, a NCCB may be used instead of nonvolatile nanotube select circuits illustrated by NPSM 1600 shown in FIG. 16. Also, a NCCB may used instead of NRAM™-based nonvolatile configuration control bits (logic states) illustrated by NPSM 2400 shown in FIG. 24.

Figure 30:
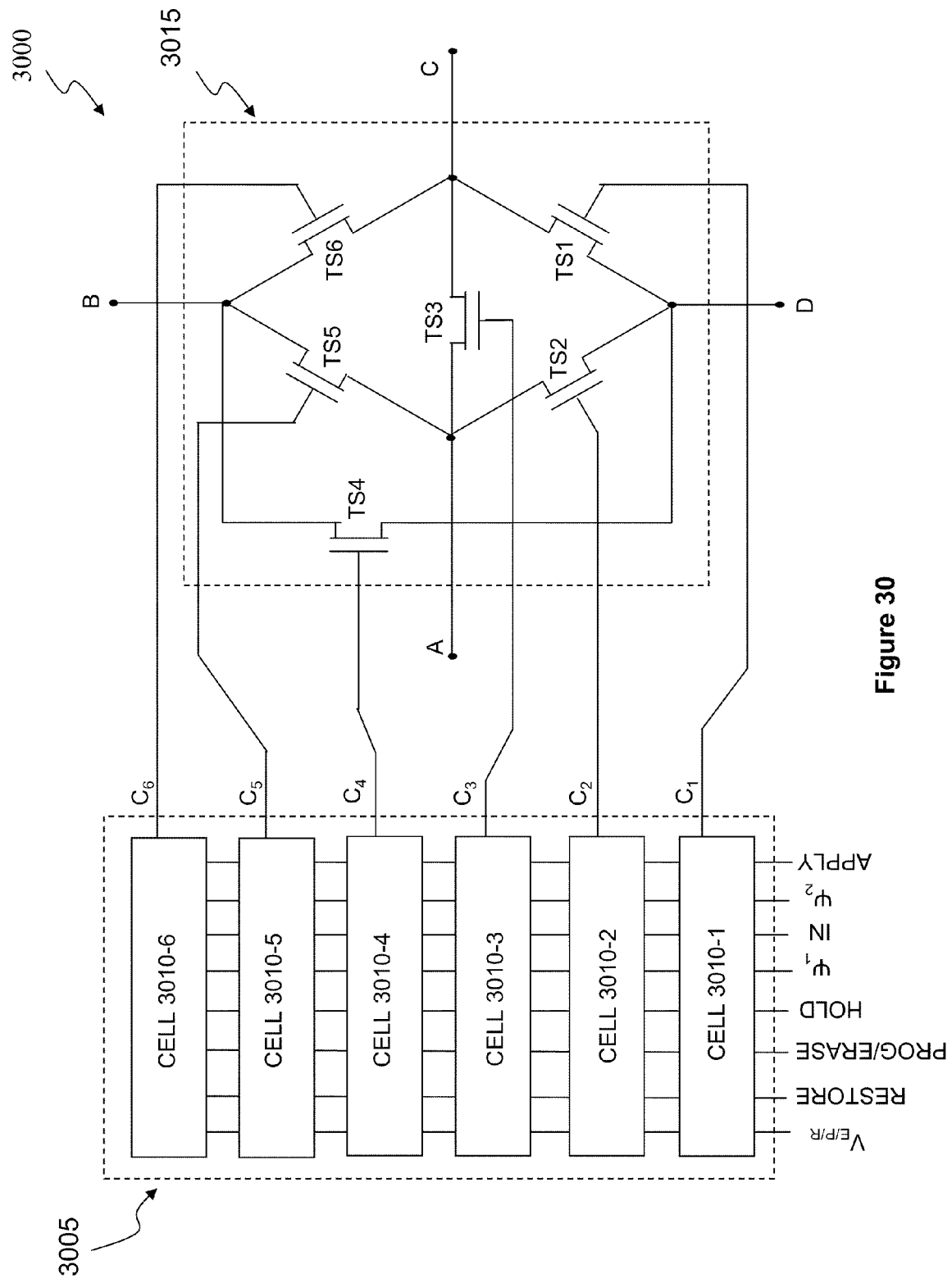
FIG. 30 shows a nonvolatile nanotube programmable switch matrix with various signal routing configurations controlled by nonvolatile true and complement control bits provided by the nonvolatile nanotube configuration control register shown in FIG. 28.

FIG. 30 illustrates an embodiment NPSM 3000 with nonvolatile nanotube configuration control register (NCCB) 3005 generating nonvolatile configuration control bits (logic states) C1, C2, . . . , C6). NPSM 3000 uses six NS/R stages CELL 3010-1, CELL 3010-2, . . . , CELL 3910-6 to provide the required configuration control bits. The operation of NCCR 3000 corresponds to the operation described with respect to NCCR 2800, 2800', and 2800" in FIGS. 28A-28C. Programmable switch matrix 3015 is the same as shown in FIGS. 16 and 24 and described in detail further above with respect to these Figures.

INCORPORATED PATENT REFERENCES

The following commonly-owned patent references, referred to herein as "incorporated patent references," describe various techniques for creating nanotube elements (nanotube fabric articles and switches), e.g., creating and patterning nanotube fabrics, logic circuits formed therefrom, devices and structures using nanotube articles and switches, etc. and are incorporated by reference in their entireties:

U.S. patent application Ser. No. 11/280,786, filed on Nov. 15, 2005, entitled TWO-TERMINAL NANOTUBE DEVICES AND SYSTEMS AND METHODS OF MAKING SAME;

U.S. patent application Ser. No. 11/835,583, filed on Aug. 8, 2007, entitled LATCH CIRCUITS AND OPERATION CIRCUITS HAVING SCALABLE NONVOLATILE NANOTUBE SWITCHES AS ELECTRONIC FUSE REPLACEMENT ELEMENTS;

U.S. patent application Ser. No. 11/835,612, filed on Aug. 8, 2007, entitled NONVOLATILE RESISTIVE MEMORIES HAVING SCALABLE TWO-TERMINAL NANOTUBE SWITCHES;

U.S. patent application Ser. No. 11/835,651, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,759, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,845, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,852, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,856, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,865, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,613, filed on Aug. 8, 2007, entitled MEMORY ELEMENTS AND CROSS POINT SWITCHES AND ARRAYS OF SAME USING NONVOLATILE NANOTUBE BLOCKS;

U.S. Patent Application No. 61/039,204, filed on Mar. 25, 2008, entitled CARBON NANOTUBE-BASED NEURAL NETWORKS AND METHODS OF MAKING AND USING SAME;

U.S. Pat. No. 7,394,687, filed on Nov. 15, 2005, entitled NON-VOLATILE SHADOW LATCH USING A NANOTUBE SWITCH;

U.S. patent application Ser. No. 12/165,007, filed on Jun. 30, 2008, entitled NON-VOLATILE SHADOW LATCH USING A NANOTUBE SWITCH;

U.S. patent application Ser. No. 11/274,967, filed on Nov. 15, 2005, entitled MEMORY ARRAYS USING NANOTUBE ARTICLES WITH REPROGRAMMABLE RESISTANCE;

U.S. Pat. No. 7,115,901, filed on Jun. 9, 2004, entitled NON-VOLATILE ELECTROMECHANICAL FIELD EFFECT DEVICES AND CIRCUITS USING SAME AND METHODS OF FORMING SAME;

U.S. Pat. No. 7,268,044, filed on Oct. 2, 2006, entitled NON-VOLATILE ELECTROMECHANICAL FIELD EFFECT DEVICES AND CIRCUITS USING SAME AND METHODS OF FORMING SAME;

U.S. patent application Ser. No. 11/731,946, filed on Apr. 2, 2007, entitled NON-VOLATILE ELECTROMECHANICAL FIELD EFFECT DEVICES AND CIRCUITS USING SAME AND METHODS OF FORMING SAME;

U.S. Pat. No. 6,982,903, filed on Jun. 9, 2004, entitled FIELD EFFECT DEVICES HAVING A SOURCE CONTROLLED VIA A NANOTUBE SWITCHING ELEMENT;

U.S. Pat. No. 7,280,394, filed on Jun. 9, 2004, entitled FIELD EFFECT DEVICES HAVING A DRAIN CONTROLLED VIA A NANOTUBE SWITCHING ELEMENT;

U.S. Pat. No. 7,211,854, filed on Jun. 9, 2004, entitled FIELD EFFECT DEVICES HAVING A GATE CONTROLLED VIA A NANOTUBE SWITCHING ELEMENT;

U.S. patent application Ser. No. 11/742,290, filed on Apr. 30, 2007, entitled FIELD EFFECT DEVICES HAVING A GATE CONTROLLED VIA A NANOTUBE SWITCHING ELEMENT;

U.S. Pat. No. 7,301,802, filed on Jun. 9, 2004, entitled CIRCUIT ARRAYS HAVING CELLS WITH COMBINATIONS OF TRANSISTORS AND NANOTUBE SWITCHING ELEMENTS;

U.S. Pat. No. 7,112,493, filed on Jun. 9, 2004, entitled METHOD OF MAKING NON-VOLATILE FIELD EFFECT DEVICES AND ARRAYS OF SAME;

U.S. patent application Ser. No. 11/527,127, filed on Sep. 26, 2006, entitled METHOD OF MAKING NON-VOLATILE FIELD EFFECT DEVICES AND ARRAYS OF SAME;

U.S. Pat. No. 7,115,960, filed on Aug. 13, 2004, entitled NANOTUBE-BASED SWITCHING ELEMENTS;

U.S. patent application Ser. No. 11/542,524, filed on Oct. 3, 2006, entitled NANOTUBE-BASED SWITCHING ELEMENTS;

U.S. Pat. No. 6,990,009, filed on Aug. 13, 2004, entitled NANOTUBE-BASED SWITCHING ELEMENTS WITH MULTIPLE CONTROLS;

U.S. Pat. No. 7,339,401, filed on Aug. 4, 2005, entitled NANOTUBE-BASED SWITCHING ELEMENTS WITH MULTIPLE CONTROLS;

U.S. patent application Ser. No. 11/971,476, filed on Jan. 9, 2008, entitled NANOTUBE-BASED SWITCHING ELEMENTS WITH MULTIPLE CONTROLS;

U.S. Pat. No. 7,228,970, filed on Sep. 24, 2001, entitled INTEGRATED NANOTUBE AND FIELD EFFECT SWITCHING DEVICE;

U.S. patent application Ser. No. 11/929,076, filed on Oct. 30, 2007, entitled INTEGRATED NANOTUBE AND FIELD EFFECT SWITCHING DEVICE;

U.S. Pat. No. 7,329,931, filed on Jan. 10, 2005, entitled RECEIVER CIRCUIT USING NANOTUBE-BASED SWITCHES AND TRANSISTORS;

U.S. patent application Ser. No. 12/029,118, filed on Feb. 11, 2008, entitled RECEIVER CIRCUIT USING NANOTUBE-BASED SWITCHES AND TRANSISTORS;

U.S. Pat. No. 7,330,709, filed on Jan. 10, 2005, entitled RECEIVER CIRCUIT USING NANOTUBE-BASED SWITCHES AND LOGIC;

U.S. patent application Ser. No. 12/029,661, filed on Feb. 12, 2008, entitled RECEIVER CIRCUIT USING NANOTUBE-BASED SWITCHES AND LOGIC;

U.S. Pat. No. 7,164,744, filed on Jan. 10, 2005, entitled NANOTUBE-BASED LOGIC DRIVER CIRCUITS;

U.S. Pat. No. 7,265,575, filed on Jan. 16, 2007, entitled NANOTUBE-BASED LOGIC DRIVER CIRCUITS;

U.S. patent application Ser. No. 11/897,812, filed on Aug. 31, 2007, entitled NANOTUBE-BASED LOGIC DRIVER CIRCUITS;

U.S. Pat. No. 7,161,403, filed on Jan. 16, 2007, entitled STORAGE ELEMENTS USING NANOTUBE SWITCHING ELEMENTS;

U.S. Pat. No. 7,405,605, filed on Jan. 9, 2007, entitled STORAGE ELEMENTS USING NANOTUBE SWITCHING ELEMENTS;

U.S. patent application Ser. No. 12/147,315, filed on Jun. 26, 2008, entitled STORAGE ELEMENTS USING NANOTUBE SWITCHING ELEMENTS;

U.S. Pat. No. 7,167,026, filed on Jan. 10, 2005, entitled TRI-STATE CIRCUIT USING NANOTUBE SWITCHING ELEMENTS;

U.S. Pat. No. 7,288,961, filed on Jan. 22, 2007, entitled TRI-STATE CIRCUIT USING NANOTUBE SWITCHING ELEMENTS;

U.S. patent application Ser. No. 11/928,538, filed on Oct. 30, 2007, entitled TRI-STATE CIRCUIT USING NANOTUBE SWITCHING ELEMENTS;

U.S. Pat. No. 6,706,402, filed on Apr. 23, 2002, entitled NANOTUBE FILMS AND ARTICLES;

U.S. Pat. No. 6,942,921, filed on Feb. 11, 2004, entitled NANOTUBE FILMS AND ARTICLES;

U.S. patent application Ser. No. 10/774,682, filed on Feb. 9, 2004, entitled NANOTUBE FILMS AND ARTICLES;

U.S. patent application Ser. No. 11/111,582, filed on Apr. 21, 2005, entitled NANOTUBE FILMS AND ARTICLES;

U.S. Pat. No. 6,835,591, filed on Apr. 23, 2002, entitled METHODS OF NANOTUBE FILMS AND ARTICLES;

U.S. Pat. No. 7,264,990, filed on Dec. 13, 2004, entitled METHODS OF NANOTUBE FILMS AND ARTICLES;

U.S. Pat. No. 7,335,528, filed on Dec. 8, 2004, entitled METHODS OF NANOTUBE FILMS AND ARTICLES;

U.S. patent application Ser. No. 10/341,130, filed on Jan. 13, 2003, entitled CARBON NANOTUBE FILMS, LAYERS, FABRICS, RIBBONS, ELEMENTS AND ARTICLES; and U.S. patent application Ser. No. 12/486,602, filed on Jun. 17, 2009, entitled NRAM ARRAYS WITH NANOTUBE BLOCKS, NANOTUBE TRACES, AND NANOTUBE PLANES AND METHODS OF MAKING SAME.

The invention may be embodied in other specific forms without departing from the spirit or essential characteristics thereof. The present embodiments are therefore to be considered in respects as illustrative and not restrictive.

What is claimed is:

1. A programmable nanotube logic circuit comprising:
a programmable nonvolatile nanotube select circuit comprising:
  a first two-terminal nonvolatile nanotube switch and a second two-terminal nonvolatile nanotube switch, wherein each of the first and second two-terminal nonvolatile nanotube switches comprises a first terminal and a second terminal,
    wherein the first and second terminals of the first nonvolatile nanotube switch are in contact with opposite ends of a first nanotube element and the first and second terminals of the second nonvolatile nanotube switch are in contact with opposite ends of a second nanotube element, and the second terminal of the first nonvolatile nanotube switch and the second terminal of the second nonvolatile nanotube switch share a common node; and
  a field effect transistor (FET) having a drain region, a source region, a channel region positioned between the drain and source regions, and a gate node in proximity to the channel region, wherein the gate node modulates the conductivity of the channel region and wherein the drain region of the FET is electrically coupled to the common node;
a Boolean logic circuit comprising at least one input and an output wherein a first input of the at least one inputs is electrically coupled to the common node of the programmable nonvolatile nanotube select circuit.

2. A programmable nanotube circuit comprising:
a programmable nonvolatile nanotube select circuit comprising:
  a first two-terminal nonvolatile nanotube switch and a second two-terminal nonvolatile nanotube switch, wherein each of the first and second two-terminal nonvolatile nanotube switches comprises a first terminal and a second terminal,
    wherein the first and second terminals of the first nonvolatile nanotube switch are in contact with opposite ends of a first nanotube element and the first and second terminals of the second nonvolatile nanotube switch are in contact with opposite ends of a second nanotube element, and the second terminal of the first nonvolatile nanotube switch and the second terminal of the second nonvolatile nanotube switch share a common node; and
  a field effect transistor (FET) having a drain region, a source region, a channel region positioned between the drain and source regions, and a gate node in proximity to the channel region, wherein the gate node modulates the conductivity of the channel region and wherein the drain region of the FET is electrically coupled to the common node;
a transfer device comprising an input, an output, and a control terminal wherein the control terminal is electrically coupled to the common node of the programmable nonvolatile nanotube select circuit to enable transfer of a signal at the input of the transfer device to the output of the transfer device.

3. A nonvolatile nanotube configurable logic circuit comprising:
a first, second and third plurality of input terminals and at least an output terminal;
a plurality of programmable nonvolatile nanotube select circuits, each nonvolatile nanotube select circuit comprising:
  a first two-terminal nonvolatile nanotube switch and a second two-terminal nonvolatile nanotube switch, wherein each of the first and second two-terminal nonvolatile nanotube switches comprises a first terminal and a second terminal,
    wherein the first and second terminals of the first nonvolatile nanotube switch are in contact with opposite ends of a first nanotube element and the first and second terminals of the second nonvolatile nanotube switch are in contact with opposite ends of a second nanotube element, and the second terminal of the first nonvolatile nanotube switch and the second terminal of the second nonvolatile nanotube switch share a common node; and
  a field effect transistor (FET) having a drain region, a source region, a channel region positioned between the drain and source regions, and a gate node in proximity to the channel region, wherein the gate node modulates the conductivity of the channel region and wherein the drain region of the FET is electrically coupled to the common node;
wherein the first plurality of input terminals is electrically coupled to the first terminals of the nonvolatile nanotube switches and the second plurality of terminals are electrically coupled to the gate regions of the nonvolatile nanotube switches;
a first plurality of transfer devices electrically coupled to the signals on the third plurality of input terminals, the first plurality of transfer devices also electrically coupled to the signals on the common nodes of the nonvolatile nanotube switches;
a second plurality of transfer devices electrically coupled to the complementary signals on the third plurality of input terminals, the second plurality of transfer devices also electrically coupled to the complementary signals on the common nodes of the nonvolatile nanotube switches; and wherein the signals on the first plurality of input terminals are able to configure the first plurality of transfer devices and the second plurality of transfer devices to implement a plurality of Boolean logic functions at the output terminal.

4. A nonvolatile nanotube programmable switch matrix comprising:

a first, second and third plurality of terminals;

a plurality of programmable nonvolatile nanotube select circuits, each nonvolatile nanotube select circuit comprising:

a first two-terminal nonvolatile nanotube switch and a second two-terminal nonvolatile nanotube switch, wherein each of the first and second two-terminal nonvolatile nanotube switches comprises a first terminal and a second terminal, wherein the first and second terminals of the first nonvolatile nanotube switch are in contact with opposite ends of a first nanotube element and the first and second terminals of the second nonvolatile nanotube switch are in contact with opposite ends of a second nanotube element, and the second terminal of the first nonvolatile nanotube switch and the second terminal of the second nonvolatile nanotube switch share a common node; and a field effect transistor (FET) having a drain region, a source region, a channel region positioned between the drain and source regions, and a gate node in proximity to the channel region, wherein the gate node modulates the conductivity of the channel region and wherein the drain region of the FET is electrically coupled to the common node;

wherein the first plurality of terminals are electrically coupled to the first terminals of the nonvolatile nanotube switches and the second plurality of terminals are electrically coupled to the gate regions of the nonvolatile nanotube switches; and a plurality of transfer devices electrically coupled to the common nodes of the programmable nonvolatile nanotube select circuits, the plurality of transfer devices also electrically coupled to the third plurality of terminals so as to provide routing between any two terminals of the third plurality of terminals.

5. A nanotube bi-directional buffer circuit comprising:

a first and second bi-directional terminals;

a first and second buffers, each buffer comprising an input, an output, and a transfer device;

a programmable nonvolatile select circuit comprising:

a first two-terminal nonvolatile nanotube switch and a second two-terminal nonvolatile nanotube switch, wherein each of the first and second two-terminal nonvolatile nanotube switches comprises a first terminal and a second terminal, wherein the first and second terminals of the first nonvolatile nanotube switch are in contact with opposite ends of a first nanotube element and the first and second terminals of the second nonvolatile nanotube switch are in contact with opposite ends of a second nanotube element, and the second terminal of the first nonvolatile nanotube switch and the second terminal of the second nonvolatile nanotube switch share a common node; and a field effect transistor (FET) having a drain region, a source region, a channel region positioned between the drain and source regions, and a gate node in proximity to the channel region, wherein the gate node modulates the conductivity of the channel region and wherein the drain region of the FET is electrically coupled to the common node;

wherein the first bi-directional terminal is electrically coupled to the input of the first buffer and the output of the second buffer;

wherein the second bi-directional terminal is electrically coupled to the input of the second buffer and the output of the first buffer;

wherein the signal on the common node of the programmable nonvolatile nanotube select circuit is electrically coupled to the transfer device of the first buffer to enable signal flow from the second bi-directional terminal to the first bi-directional terminal;

wherein the complementary signal on the common node of the programmable nonvolatile nanotube select circuit is electrically coupled to the transfer device of the second buffer to enable signal flow from the first bi-directional terminal to the second bi-directional terminal.

* * * * *